(12) United States Patent
Rajski et al.

(10) Patent No.: US 7,987,442 B2
(45) Date of Patent: Jul. 26, 2011

(54) FAULT DICTIONARIES FOR INTEGRATED CIRCUIT YIELD AND QUALITY ANALYSIS METHODS AND SYSTEMS

(75) Inventors: Janusz Rajski, West Linn, OR (US); Gang Chen, Wilsonville, OR (US); Martin Keim, Sherwood, OR (US); Nagesh Tamarapalli, Wilsonville, OR (US); Manish Sharma, Wilsonville, OR (US); Huaxing Tang, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 1259 days.

(21) Appl. No.: 11/221,394

(22) Filed: Sep. 6, 2005

(65) Prior Publication Data

US 2006/0066338 A1   Mar. 30, 2006

Related U.S. Application Data

(60) Provisional application No. 60/607,728, filed on Sep. 6, 2004.

(51) Int. Cl.
  *G06F 17/50* (2006.01)
  *G06F 9/455* (2006.01)
  *G06F 11/00* (2006.01)

(52) U.S. Cl. ............... 716/136; 716/106; 714/737

(58) Field of Classification Search ............ 716/4, 106, 716/136; 714/724, 738, 704, 737
See application file for complete search history.

(56) References Cited

U.S. PATENT DOCUMENTS

| | | | |
|---|---|---|---|
| 4,228,537 A | 10/1980 | Henckels et al. | |
| 5,475,695 A | 12/1995 | Caywood et al. | |
| 5,515,384 A | 5/1996 | Horton, III | |
| 5,640,403 A | 6/1997 | Ishiyama et al. | |
| 5,663,967 A | 9/1997 | Lindberg et al. | |
| 5,726,996 A * | 3/1998 | Chakradhar et al. | 714/724 |
| 5,831,996 A * | 11/1998 | Abramovici et al. | 714/738 |

(Continued)

FOREIGN PATENT DOCUMENTS

WO   WO 2006/029284   3/2006

OTHER PUBLICATIONS

Abramovici et al., "Digital Systems Testing and Testable Design," *IEEE Press*, pp. 9-37, 56-60, 84-86, 93-126, 131-302, 421-452, and 541-568 (Sep. 13, 1994).

(Continued)

*Primary Examiner* — Paul Dinh
*Assistant Examiner* — Patrick Sandoval

(57) ABSTRACT

Methods, apparatus, and systems for testing, analyzing, and improving integrated circuit yield and quality are disclosed herein. For example, in one exemplary embodiment, one or more fault dictionaries are generated for identifying one or more defect candidates from corresponding observation point combinations. In this exemplary method, the observation point combinations indicate the observation points of a circuit-under-test that captured faulty test values upon application of a respective test pattern. Further, the one or more fault dictionaries in one embodiment are generated by: (a) for a first defect candidate, storing one or more first indicators indicative of test patterns detecting the first defect candidate, and (b) for a second defect candidate, storing at least a second indicator indicative of the test patterns that detect the second defect candidate, the second indicator comprising a bit mask that indicates which of the test patterns detecting the first defect candidate also detect the second defect candidate.

42 Claims, 35 Drawing Sheets

U.S. PATENT DOCUMENTS

| | | | |
|---|---|---|---|
| 5,896,401 A * | 4/1999 | Abramovici et al. | 714/741 |
| 6,066,179 A | 5/2000 | Allan | |
| 6,070,261 A * | 5/2000 | Tamarapalli et al. | 714/733 |
| 6,202,181 B1 | 3/2001 | Ferguson et al. | |
| 6,393,602 B1 | 5/2002 | Atchison et al. | |
| 6,449,749 B1 | 9/2002 | Stine | |
| 6,536,007 B1 | 3/2003 | Venkataraman | |
| 6,557,132 B2 | 4/2003 | Gangl et al. | |
| 6,567,946 B1 * | 5/2003 | Nozuyama | 714/741 |
| 6,611,729 B1 | 8/2003 | Drum | |
| 6,701,477 B1 | 3/2004 | Segal | |
| 6,952,818 B2 | 10/2005 | Ikeuchi | |
| 6,975,978 B1 | 12/2005 | Ishida et al. | |
| 7,137,083 B2 | 11/2006 | Hildebrant | |
| 7,281,222 B1 | 10/2007 | Babcock | |
| 7,509,551 B2 * | 3/2009 | Koenemann et al. | 714/732 |
| 7,512,508 B2 | 3/2009 | Rajski et al. | |
| 2002/0093356 A1 * | 7/2002 | Williams et al. | 324/765 |
| 2002/0147952 A1 * | 10/2002 | Bartenstein et al. | 714/734 |
| 2003/0046608 A1 * | 3/2003 | Bartenstein et al. | 714/29 |
| 2003/0120459 A1 | 6/2003 | Lee et al. | |
| 2003/0177416 A1 | 9/2003 | Manley et al. | |
| 2004/0064773 A1 | 4/2004 | Kundu et al. | |
| 2004/0177299 A1 * | 9/2004 | Wang et al. | 714/726 |
| 2004/0205436 A1 * | 10/2004 | Kundu et al. | 714/741 |
| 2005/0086619 A1 | 4/2005 | Teh et al. | |
| 2005/0132306 A1 | 6/2005 | Smith et al. | |
| 2005/0257104 A1 * | 11/2005 | Wood, Jr. | 714/704 |
| 2006/0053357 A1 | 3/2006 | Rajski et al. | |
| 2006/0066338 A1 | 3/2006 | Rajski et al. | |
| 2006/0066339 A1 | 3/2006 | Rajski et al. | |
| 2006/0069958 A1 | 3/2006 | Sawicki et al. | |
| 2006/0101355 A1 | 5/2006 | Ciplickas et al. | |
| 2006/0107157 A1 * | 5/2006 | Wen et al. | 714/741 |
| 2006/0265185 A1 | 11/2006 | Lanzerooti et al. | |
| 2007/0143643 A1 | 6/2007 | Pineda De Gyvez et al. | |
| 2007/0283202 A1 * | 12/2007 | Cheng et al. | 714/724 |
| 2008/0301597 A1 * | 12/2008 | Chen et al. | 716/5 |
| 2009/0177936 A1 * | 7/2009 | Koenemann et al. | 714/737 |

OTHER PUBLICATIONS

Aitken et al., "ITC 2003 Roundtable: Design for Manufacturability," *IEEE Design & Test of Computers*, pp. 144-156 (2004).

Allan et al., "An Yield Improvement Technique for IC Layout Using Local Design Rules," *IEEE Trans. on Computer-Aided Design*, vol. 11, No. 11, pp. 1355-1362 (Nov. 1992).

Boppana et al., "Full Fault Dictionary Storage Based on Labeled Tree Encoding," *Proc. VLSI Test Symp.*, pp. 174-197 (1996).

Chess et al., "Creating Small Fault Dictionaries," *IEEE Trans. on Computer-Aided Design*, vol. 18, No. 3, pp. 346-356 (Mar. 1999).

Doong et al., "An Assessment of Physical and Electrical Design Rule Based Statistical Process Monitoring and Modeling (PEDR-SPMM)," *Proc. Int'l Conference on Microelectronic Test Structures*, vol. 15, pp. 55-59 (Apr. 2002).

Estrada, "How diagnostics accelerate nanometer yield ramp," downloaded from http://www.eedesign.com/article/showArticle.jhtml?articleId=49400286, 13 pp. (document marked Oct. 10, 2004).

Goh et al., "Integrated Yield Enhancement Strategy for Advances 130nm BEOL Copper Process," *IEEE Int'Symp. on Semiconductor Manufacturing*, pp. 243-246 (2003).

Horgan, "Design for Manufacturability (DFM)," downloaded from http://www10.edacafe.com/nbc/articles/view_weekly.php?section=Magazine&articleid=209202, 9 pp. (document marked Sep. 6, 2004).

Horgan, "Design for Manufacturability (DFM) Part 2," downloaded from http://www10.edacafe.com/nbc/articles/view_weekly.php?section=Magazine&articleid=209201, 9 pp. (document marked Sep. 13, 2004).

Keim et al., "A Rapid Yield Learning Flow Based on Production Integrated Layout-Aware Diagnosis," *Proc. ITC*, pp. 1-10 (2006).

Kibarian et al., "Design for Manufacturability in Nanometer Era: System Implementation and Silicon Results," *IEEE Int'Solid-State Circuits Conference*, pp. 268-269 (2005).

LaTourette, "A Yield Learning Model for Integrated Circuit Manufacturing," *Semiconductor International*, pp. 163-170 (Jul. 1995).

Maly et al., "Deformations of IC Structure in Test and Yield Learning," *Proc. ITC*, pp. 856-865 (2003).

Mekkoth et al., "Yield Learning with Layout-aware Advanced Scan Diagnosis," *Int'l Symp. for Testing and Failure Analysis*, pp. 412-418 (Nov. 2006).

Mrugalski et al., "Fault Diagnosis in Designs with Convolutional Compactors," *Proc. ITC*, pp. 498-507 (2004).

Razdan et al., "A Statistical Design Rule Developer," *IEEE Trans. on Computer-Aided Design*, vol. CAD-5, No. 4, pp. 508-520 (Oct. 1986).

Riviere-Cazaux et al., "Integration of Design for Manufacturability (DFM) Practices in Design Flows," *Proc. 6th Int'l Symp. on Quality Electronic Design*, pp. 102-106 (2005).

Tang et al., "Analyzing Volume Diagnosis Results with Statistical Learning for Yield Improvement," *European Test Symp.*, 6 pp. (2007).

Tochtrop, "Influence of Defect Capture Rate on Defect-Yield-Correlations and Generally Defect Control Strategies," *Advanced Manufacturing Conference*, pp. 17-28 (2003).

Draper et al., *Applied Regression Analysis*, Third Edition, pp. 15-27 (1998).

International Search Report dated Feb. 23, 2007, from International Patent Application No. PCT/US05/32040 (International Publication No. WO 2006/029284).

International Preliminary Report on Patentability and Written Opinion dated Apr. 11, 2007, from International Patent Application No. PCT/US05/32040 (International Publication No. WO 2006/029284).

\* cited by examiner

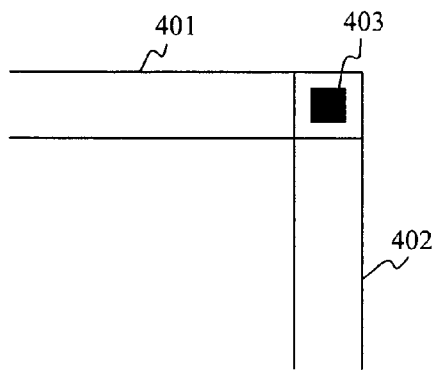
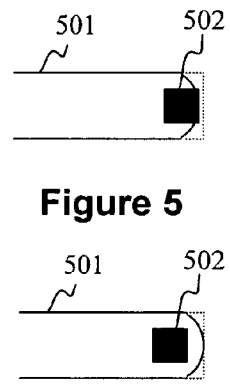
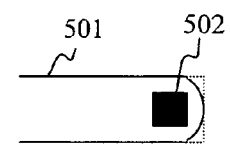
Figure 4
Figure 5
Figure 6
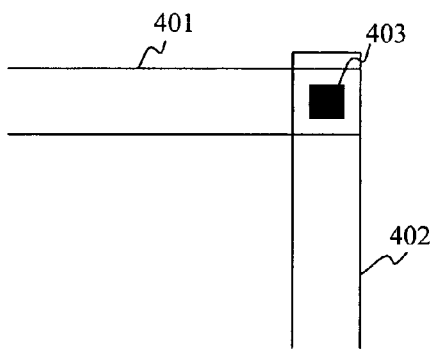
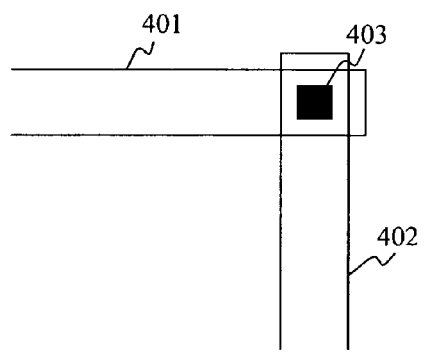
Figure 7
Figure 8

"Raw" Wafer Defect Map

Wafer Defect Map after identifying hot net
and depicting only those die that fail on the hot net

FAULT DICTIONARIES FOR INTEGRATED CIRCUIT YIELD AND QUALITY ANALYSIS METHODS AND SYSTEMS

CROSS-REFERENCE TO RELATED PATENT APPLICATIONS

This application claims the benefit of U.S. Provisional Patent Application No. 60/607,728 filed on Sep. 6, 2004, which is hereby incorporated herein by reference.

TECHNICAL FIELD

The disclosed technology relates generally to the design and testing of integrated circuits.

BACKGROUND

As feature sizes of integrated circuits continue to decrease, the effects of feature-related defects are becoming increasingly important. For example, the lithographic techniques used to realize today's integrated circuit often use light having a wavelength that is larger than the features it creates. One consequence of sub-wavelength lithography is that failures caused by the lithography process (for example, distortion that causes shorts and opens to appear in the resulting design) become more numerous. Indeed, the effect of feature defects on the production yield of integrated circuits is increasing and has become more dominant than the effect of random particles present during fabrication.

To reduce the number of defective chips being produced, foundries (integrated circuit manufacturers) often provide a number of recommended design rules that designers can use to help improve the yield of their particular design. Such rules are generally referred to herein as Design for Manufacturability (DFM) rules and can pertain to a wide variety of parameters related to integrated circuit design. For example, the rule could pertain to a physical characteristic or trait of the design, such as a distance between two wires or between corners of two features. Among the possible design issues addressed by DFM rules are: redundancy, spacing, width, length, area, enclosure, extension, overlap, density, orientation, job/notch, antenna, and matching. Further, each of these categories can have numerous rules that apply. Further, a foundry can provide multiple rules for a given design parameter, each having a different potential effect on yield. For instance, a foundry can provide a minimum or maximum value for a particular parameter as well as a recommended value. In general, the use of DFM rules helps ensure that the integrated circuit is actually manufacturable using the process and technology implied by the DFM rules.

DFM rules have been traditionally determined through the use of test chips. A test chip is a specialized chip comprising numerous groups of identical test structures that systematically vary across some parameter being targeted for a particular DFM rule. Test results obtained from the test chips can then be statistically analyzed and used to determine the values for the targeted DFM rules. Test chips, however, can be expensive to use—both in terms of actual cost and in terms of the lost wafer capacity resulting from the creation, testing, and analyzing of the test chips. Test chips also provide limited information. For example, test chips cannot ordinarily provide information on the impact of features of a circuit not contained in a test structure of the test chip. Further, as new DFM rules are developed to address process changes or new knowledge obtained, new test chips must be designed and manufactured—a process that commonly takes weeks to months.

Accordingly, improved methods of determining, modifying, and using design manufacturing rules to increase yield are desired.

SUMMARY

Disclosed below are representative embodiments of methods, apparatus, and systems that should not be construed as limiting in any way. Instead, the present disclosure is directed toward all novel and nonobvious features and aspects of the various disclosed methods, apparatus, systems, and equivalents thereof, alone and in various combinations and subcombinations with one another.

In one of the exemplary methods disclosed herein, a set of design defect extraction rules is derived at least partially from a set of design manufacturing rules. Potential defects are extracted from a representation of a physical layout of an integrated circuit design, wherein the extracted potential defects are based at least in part upon the defect extraction rules. Circuit test stimuli applied during one or more circuit tests are determined. Test responses resulting from the applied circuit tests are evaluated to identify integrated circuits that fail and to identify the occurrence in the failing integrated circuits of one or more potential types of defects associated with the applied circuit tests. Information is collected concerning the repetitive identification in the failing integrated circuits of the occurrence of potential types of defects. The collected information is analyzed to determine the likelihood of potential types of defects being present in integrated circuits manufactured in accordance with the physical layout. The circuit test stimuli can comprise test patterns generated by targeting one or more of the extracted potential defects and/or previously generated test patterns that are determined to detect one or more of the extracted potential defects. One or more of the extracted defects can additionally have at least one of the following properties associated with it: (a) a defect identifier that distinguishes a respective potential defect from other potential defects; (b) a derived rule identifier that identifies the defect extraction rule used to extract the respective potential defect; (c) a design manufacturing rule identifier that identifies the design manufacturing rule from which the defect extraction rule used to extract the respective potential defect was derived; (d) one or more physical properties of the respective potential defect in the physical layout of the integrated circuit design; (e) a physical location of the respective potential defect in the physical layout of the integrated circuit design; and (f) a ranking of the respective potential defect relative to other potential defects. In certain embodiments, a ranking is assigned to at least some of the extracted potential defects, wherein the ranking is indicative of the likelihood of a potential defect occurring in the integrated circuit. This ranking can be updated based at least in part upon the analysis of the collected information. Further, the application of the circuit tests can be ordered based at least in part upon the extracted potential defects and the ranking of the extracted potential defects. In some embodiments, the act of analyzing the collected information further comprises analyzing collected information for a multiplicity of tested integrated circuits and performing one or more of the following acts: (a) estimating the production yield of the integrated circuits; (b) estimating an escape rate of potential types of defects or integrated circuits manufactured in accordance with the physical layout of the integrated circuit design; (c) estimating a yield sensitivity curve for one or more of the design manufacturing rules; (d) estimating the production yield of other integrated circuits designs using at least a plurality of the design defect extraction rules; (e) estimating the escape rate of potential types of defects in other integrated circuit designs designed in accordance with the design manufacturing rules. In certain embodiments, the act of analyzing the collected information further comprises analyzing collected information for a multiplicity of tested integrated circuits over time and determining trends in changes in the likelihood of potential defects being present in manufactured integrated circuits. Based at least in part on the determined trends, test stimuli can be modified, added, or deleted in order to improve the likelihood of identifying defective integrated circuits. In some embodiments, the acts of collecting information and analyzing the collected information are performed substantially in real time on manufactured integrated circuits being produced in a production line of an integrated circuit fabricator. In exemplary embodiments of the disclosed technology, test responses and the associated test that produced such test responses are compared using a previously generated and stored dictionary of failing test responses expected from a failure of the associated test. In these embodiments, the act of collecting information can further comprise collecting information from the comparison that identifies the potential defects identified by the comparison. In some embodiments, the information stored in the dictionary is compressed during generation of the dictionary. For example, one or more bit masks can be computed to represent the detecting test responses for at least one potential defect in the integrated circuit design, or one or more pseudo faults can be computed to represent the detecting test responses for at least one potential defect in the integrated circuit design. Some embodiments further comprise modifying the dictionary in one or more of the following manners: (a) adding at least one test associated with the potential defect not previously found in the dictionary; or (b) adding at least one expected failing test response expected to be received in the event the potential defect not previously found in the generated dictionary is present in a tested integrated circuit. An entry of the generated dictionary can also be deleted (for example, when a failing test response associated with the entry has not been observed for a threshold number of circuit tests). In some embodiments of the disclosed method, the existence of at least one potential defect not found in the generated dictionary can also be diagnosed (for example, using incremental diagnosis or incremental simulation). Design manufacturing rules in the set of design manufacturing rules or design defect extraction rules can be modified, added, or deleted based at least in part upon the act of analyzing the collected information.

In another one of the exemplary methods disclosed herein, a representation of an integrated circuit layout is received (for example, a GDSII or Oasis file). One or more recommended design parameters for manufacturing an integrated circuit are also received. Extraction rules from one or more of the recommended design parameters are determined, wherein the extraction rules comprise rules for identifying two or more sets of defect candidates from the representation of the integrated circuit layout. The design parameters can comprise, for example, one or more design manufacturing rules. Further, the two or more sets of defect candidates can comprise defect candidates that deviate from an associated recommended design parameter by different respective ranges of values. In some embodiments, the extraction rules are modified based at least in part on test results obtained from testing integrated circuits produced according to the integrated circuit layout. The modification can comprise, for example, an increase in the number of sets of defect candidates identified by the extraction rules. The extraction rules can be applied to the representation of the integrated circuit layout to generate a list of defect candidates in the integrated circuit layout. Test patterns can be generated that target at least some of the defect candidates. Alternatively, or additionally, test patterns can be identified from a set of previously generated test patterns that detect at least some of the defect candidates. In some embodiments, the list of defect candidates is ordered based at least in part on a yield sensitivity associated with one or more of the defect candidates. In certain embodiments of the exemplary method, a fault dictionary indicative of failing test responses and associated defect candidates that potentially caused the failing test response is generated.

In another exemplary method disclosed herein, a modified set of design manufacturing rules for evaluating the presence of potential defects in manufactured integrated circuits is determined. The modified set of design manufacturing rules is derived at least in part from a first set of design manufacturing rules, wherein the first set of design manufacturing rules defines plural classes of types of potential defects, including at least first and second classes of defect types. In this embodiment, the modified set of design manufacturing rules defines at least a first set of a first subclass of plural design manufacturing rules associated with the first class of design manufacturing rules and a second set of a second subclass of plural design manufacturing rules associated with the second class of design manufacturing rules. At least a plurality of the first and second subclasses of design manufacturing rules are ranked by the likelihood of such ranked first and second subclasses of design manufacturing rules identifying defects in the manufactured integrated circuits. Potential defects are extracted from a physical layout description of the integrated circuit that satisfy the first and second subclasses of design manufacturing rules. In certain embodiments of the method, circuit tests to be applied to manufactured circuits are determined. The circuit tests can be configured, for example, to detect extracted potential defects associated with at least a plurality of the design manufacturing rules included in the first and second subclasses of design manufacturing rules. Test responses from the manufactured circuits obtained in response to the circuit tests being applied can be evaluated to determine whether one or more of the modified design manufacturing rules has identified potential defects likely to be present in the tested integrated circuits. Further, the evaluation can be performed using tests responses from a sufficient number of manufactured integrated circuits to provide statistical information indicating the likelihood of the occurrence in a manufactured circuit of defects detected by the applied circuit tests. In certain embodiments, the act of ranking the first and second subclasses of design manufacturing rules comprises ranking plural design manufacturing rules in the first subclass relative to one another and ranking plural design manufacturing rules in the second subclass relative to one another. In some embodiments, the modified set of design manufacturing rules comprises design manufacturing rules defining areas of a physical layout of an integrated circuit for which no defects are to be extracted. The modified set of design manufacturing rules can also comprise yield loss limiting manufacturing rules for determining trends in changes in yield loss impacting characteristics over time. An example of one such yield loss limiting rule relates to the in-line resistance of signal lines.

In another exemplary method disclosed herein, one or more fault dictionaries are generated for identifying one or more defect candidates from corresponding observation point combinations. In this exemplary method, the observation point combinations indicate the observation points of a circuit-under-test that captured faulty test values upon application of a respective test pattern. Further, the one or more fault dictionaries are generated by: (a) for a first defect candidate, storing one or more first indicators indicative of test patterns detecting the first defect candidate, and (b) for a second defect candidate, storing at least a second indicator indicative of the test patterns that detect the second defect candidate, the second indicator comprising a bit mask that indicates which of the test patterns detecting the first defect candidate also detect the second defect candidate. In some embodiments, the circuits-under-test comprise integrated circuits designed for functional use in electronic devices. The one or more first indicators can comprise unique IDs associated with the test patterns detecting the first defect candidate and/or unique IDs associated with the observation point combinations for the test patterns detecting the first defect candidate. In some embodiments, the first defect candidate and the second defect candidate are in a fan-out free region of the circuit-under-test. Further, the first defect candidate can be located at a stem of the fan-out free region. In some embodiments, one or more defect candidates are identified during production testing of the circuits-under-test using the generated one or more fault dictionaries. Further, in certain embodiments, incremental diagnosis and/or incremental simulation is performed on one or more possible defects not identified by the generated one or more fault dictionaries. In some embodiments, the generated one or more fault dictionaries are updated with results from the incremental diagnosis and/or incremental simulation. Similarly, defect extraction rules or design manufacturing rules can be updated with results from the incremental diagnosis and/or incremental simulation. The number of test patterns detecting the first defect candidate can be limited to at least one of the following: (a) a predetermined value; or (b) a user-selected value. In some embodiments, the test patterns detecting the first defect candidate comprise test patterns using static fault models and test patterns using dynamic fault models. Further, in certain implementations of these embodiments, at least a first fault dictionary and a second fault dictionary are generated, and the fault dictionary information concerning the test patterns using static fault model are stored in the first fault dictionary whereas fault dictionary information concerning the test patterns using dynamic fault models is stored in the second fault dictionary. Further, at least some of the test patterns detecting the second defect candidate can use a different type of fault model than used to detect the first defect candidate. In some embodiments of the exemplary method, the observation point combinations correspond to compacted test responses output from a compactor in the circuit-under-test. In some embodiments, one or more of the following properties are associated with or additionally stored for at least the first defect candidate: (a) a defect identifier that distinguishes the defect candidate from other potential defects; (b) a derived rule identifier that identifies the defect extraction rule used to extract the first defect candidate; (c) a design manufacturing rule identifier that identifies the design manufacturing rule from which the defect extraction rule used to extract the first defect candidate was derived; (d) one or more physical properties of the first defect candidate; (e) a physical location of the first defect candidate in the physical layout of the integrated circuit design; or (f) a ranking of the first defect candidate relative to other potential defects of the same type.

In another exemplary method disclosed herein, a list of potential defects in an integrated circuit layout is received. In this exemplary embodiment, the potential defects in the list were identified by using extraction rules derived at least partially from a set of design manufacturing rules, the design manufacturing rules comprising design parameters for manufacturing an integrated circuit. A set of test patterns is produced by: (a) selecting from previously generated test patterns one or more test patterns that detect at least some of the identified potential defects; (b) generating one or more test patterns that explicitly target at least some of the identified potential defects; or both (a) and (b). At least one fault dictionary is generated, wherein the fault dictionary is indicative of one or more failing test responses to an associated test pattern and one or more potential defects respectively associated with the failing test responses. In certain embodiments, the at least one fault dictionary is a compressed fault dictionary and the act of generating the dictionary comprises using one or more bit masks to represent the failing test responses associated with a respective potential defect and/or using detection information of one or more pseudo faults to represent the detection information of a respective potential defect. Test-result data can be received that comprises failing test responses obtained during testing of the integrated circuits using at least a portion of the test patterns in the set of test patterns. The at least one fault dictionary can be applied to the test-result data in order to diagnose potential defects associated with one or more of the failing test responses. An incremental diagnosis or incremental simulation procedure can be used to diagnose potential defects that are not diagnosable using the at least one fault dictionary. Probabilities that potential defects are actually causing the failing test responses can be statistically determined using diagnostic results obtained from the application of the at least one fault dictionary.

In another exemplary embodiment disclosed herein, a set of defect extraction rules at least partially derived from a first set of design manufacturing rules is determined. The defect extraction rules define, for example, plural subcategories of at least one category of potential defects identified by the design manufacturing rules. Potential defects are extracted by applying at least a subset of the defect extraction rules to an electronic description of the physical layout of an integrated circuit. The extracted potential defects of this exemplary embodiment fall into at least one of the subcategories. Plural circuit tests are defined that indicate the presence of potential defects in the manufactured integrated circuits. The circuit tests each comprise, for example, a set of circuit stimuli to be applied to manufactured integrated circuits containing the integrated circuit. For at least a plurality of circuit tests, the potential defect or defects detected by the circuit test and the failing test responses that, if observed, would indicate the presence of the potential defect or defects detected by the circuit test are stored. The method can further comprise applying the circuit tests to the manufactured integrated circuits, capturing test responses, and determining failing integrated circuits that produce one or more test responses that fail the applied circuit tests. In certain embodiments, for one or more of the failing integrated circuits, one or more circuit tests are identified that produced the failing test response or responses, and one or more of the failing test responses associated with an identified circuit test are compared with stored failing test responses associated with the identified circuit test to thereby attempt to deduce one or more defects that potentially caused the failing test response. The amount of data stored when storing the results of such comparison can be compressed or limited by at least, for each potential defect, only storing k detecting failing test responses, wherein k designates the maximum number of failing test responses for the potential defect that are stored. Some embodiments of the exemplary method further comprise collecting and analyzing information concerning the repetitive identification of the occurrence of potential types of defects in the failing integrated circuits, and reporting data representing the probability that certain types of defects are causing the failing test responses. The reporting can be performed, for example, by generating a graphical representation of the data (for example, a pareto chart). In some embodiments, one or more of the following properties associated with a respective potential defect can also be stored: (a) a defect identifier that distinguishes the respective potential defect from other potential defects; (b) a derived rule identifier that identifies the defect extraction rule used to extract the potential defect; (c) a design manufacturing rule identifier that identifies the design manufacturing rule on which the defect extraction rule is based; (d) one or more physical properties of the respective potential defect in the physical layout of the integrated circuit design; (e) the physical location of the respective potential defect in the physical layout of the integrated circuit design; and (f) a ranking of the respective potential defect relative to other potential defects. In certain embodiments, the set of defect extraction rules also comprises at least one potential defect identified by a worst case defect identifier as a worst case defect. In some embodiments, the act of storing comprises the act of generating a defect comparison dictionary describing failing test responses by an identification of the potential defect the fault was derived from, the type of potential fault, the test patterns detecting the potential fault, and the observation points for each detecting test pattern. Further, in some implementations of these embodiments, the exemplary method further comprises modifying the stored information by performing one or more of the following: (a) adding a potential defect not previous found in the dictionary; (b) adding at least one test associated with the potential defect not previously found in the dictionary; (c) adding at least one expected failing test response expected to be received in the event the potential defect not previously found in the dictionary is present in a tested integrated circuit, or (d) deleting an entry in the dictionary associated with a test response that has not detected a failing circuit after a predetermined or user-selected number of circuit tests. Also, in certain implementations that use a defect comparison dictionary, failing test responses associated with one of the circuit tests are compared with failing test responses associated with the circuit test stored in the dictionary to determine the existence of potential defects and the types of such defects; and the results of such comparison are stored. As part of this process, integrated circuits that fail due to miscellaneous potential defects not identified by the comparison can be identified and the exemplary method can be repeated using a modified set of defect extraction rules to target at least one of the miscellaneous potential defects. Further, in certain implementations, the miscellaneous potential defect not identified by the comparison can be diagnosed to identify the miscellaneous potential defect (for example, using an effect-cause-based diagnosis procedure, incremental simulation and/or incremental diagnosis). The dictionary can be modified to include the identified miscellaneous potential defect.

In another one of the exemplary methods disclosed, test-result information is received from tests of multiple integrated circuits. The test-result information comprises failing test responses associated with respective test patterns applied during the tests. A fault dictionary is used to diagnose at least a portion of the test-result information in order to identify potential defects that may have caused one or more of the failing test responses. At least one of an incremental diagnosis or incremental simulation procedure is used to diagnose test-result information that was not diagnosable using the fault dictionary. In some embodiments, probabilities that one or more of the potential defects actually caused the integrated circuit failures are determined from diagnostic results produced using the fault dictionary. These probabilities are then reported. One or more of the following acts can be performed based at least in part on the reported probabilities: (a) adjusting one or more design manufacturing rules; (b) adjusting one or more defect extraction rules; or (c) providing recommended modifications of one or more features in the integrated circuit. In some embodiments, the fault dictionary is a compressed fault dictionary using one or more bit masks to associate one or more failing test responses to respective potential defects.

In another exemplary method disclosed herein, information is received from processing test responses of integrated circuits designed for functional use in electronic devices. In this embodiment, the information is indicative of integrated circuit failures observed during testing of the integrated circuits and of possible yield limiting factors causing the integrated circuit failures. Probabilities that one or more of the possible yield limiting factors in the integrated circuits actually caused the integrated circuit failures are determined by statistically analyzing the received information. The probabilities that one or more possible yield limiting factors actually caused the integrated circuit failures are reported. The information received can comprise, for example, one or more of the following: (a) diagnosis results; (b) one or more lists of yield limiting factors; or (c) information about detection of the yield limiting factors during the testing. In some embodiments, an estimate of the yield of the integrated circuits is determined based at least in part on the determined probabilities. A yield estimation can also be determined for other integrated circuits. In certain embodiments, an estimate of the escape rate of a respective possible yield limiting factor or of the integrated circuits is determined based at least in part on the determined probabilities. An escape rate estimation of possible yield limiting factors in other integrated circuits or of the other integrated circuits can also be determined, wherein the other integrated circuits are designed in accordance with design manufacturing rules substantially similar to design manufacturing rules used to design the tested integrated circuits. In some embodiments, the tested integrated circuits are designed in accordance with one or more design manufacturing rules, and the exemplary method further comprises estimating a yield sensitivity curve for at least one of the design manufacturing rules, wherein the estimation is based at least in part on the determined probabilities. Further, the exemplary method can be performed repetitively over time, and can comprise determining production trends based on changes in the determined probabilities observed over time. Based at least in part on the reported probabilities: (a) one or more design manufacturing rules can be modified, (b) one or more defect extraction rules used to identify potential defects in a design of the integrated circuits can be modified; and/or (c) one or more recommended modifications to features in the integrated circuits can be provided (and, in some instances, integrated circuits having the modified features produced). In some embodiments, a graphical representation of the probabilities is generated (for example, a pareto chart). In certain embodiments, the received information comprises a list of suspect features. The list of suspect features can be generated, for example, using at least one compressed fault dictionary and/or incremental diagnosis. In some embodiments, the probabilities are determined by estimating a probability that a respective possible yield limiting factor caused an associated respective integrated circuit failure, and iteratively solving a system of equations relating the estimated probability to an actual probability that the respective possible yield limiting factor caused the associated failure. Further, in certain embodiments, the possible yield limiting factors comprise at least one of: (a) nets in the integrated circuit layout, (b) features in the integrated circuit layout, or (c) design manufacturing rules associated with the manufacture of the integrated circuit. Moreover, the integrated circuits tested can have a common design, and the act of determining the probabilities can comprise partitioning the design of the integrated circuits into multiple design blocks, wherein each design block comprising a subset of the possible yield limiting factors. This partitioning procedure can comprise simulating faults associated with nets in the design of the integrated circuits, identifying at least a first group of observation points that captures errors from a first set of nets and a second group of observation points that captures errors from a second set of nets, and including the first set of nets in a first design block and the second set of nets in a second design block. The act of determining the probabilities can further comprise constructing probability models relating design block fail probabilities to fail probabilities of yield limiting factors contain in respective design blocks, comparing the design block fail probabilities to the received information; and computing estimated fail probabilities of yield limiting factors using regression techniques. The act of determining the probabilities can also comprise identifying nets that fail at a substantially higher rate than other nets. A determination can be made whether the nets that fail at a substantially higher rate than other nets occur repetitively at or near a same die location of multiple wafers containing multiples instances of dies that each contain an instance of the tested integrated circuit (for example, by generating a wafer defect map). In some embodiments of the exemplary method, the testing of the multiple integrated circuits includes identifying potential defects in the integrated circuits using a fault dictionary in which one or more potential defects are identified by applying a bit mask.

In yet another exemplary embodiment disclosed herein, information from processing test responses of integrated circuits is received. In this embodiment, the information is indicative of integrated circuit failures observed during testing of the integrated circuits and potential defects that may have caused the integrated circuit failures. Probabilities that the potential defects are actually causing the integrated circuit failures are determined by analyzing the received information. In this embodiment, the act of includes iteratively solving a system of equations relating an estimated probability to an actual probability that a respective potential defect caused the associated integrated circuit failure. The determined probabilities can be reported (for example, by generating a graphical representation of the probabilities, such as a pareto chart). The information received can comprise, for example, one or more of the following: (a) diagnosis results; (b) one or more lists of the potential defects; or (c) information about detection of the potential defects during the testing. In some embodiments, an estimate of the yield of the integrated circuits is determined based at least in part on the determined probabilities. A yield estimation can also be determined for other integrated circuits. In certain embodiments, an estimate of the escape rate of a respective potential defect or of the integrated circuits is determined based at least in part on the determined probabilities. An escape rate estimation of potential defects in other integrated circuits or of the other integrated circuits can also be determined. In some embodiments, the tested integrated circuits are designed in accordance with one or more design manufacturing rules, and the exemplary method further comprises estimating a yield sensitivity curve for at least one of the design manufacturing rules, the estimation being based at least in part on the determined probabilities. Further, the exemplary method can be performed repetitively over time, and can comprise determining production trends based on changes in the determined probabilities observed over time. In certain embodiments, one or more of the following acts are performed based at least in part on the reported probabilities: (a) adjusting one or more design manufacturing rules; (b) adjusting one or more defect extraction rules; or (c) providing recommended modification for one or more features in the integrated circuit. In implementations wherein one or more features in the integrated circuit are modified based at least in part on the reported probabilities, the exemplary method can further comprise producing one or more integrated circuits having the modified one or more features. In certain embodiments, the integrated circuits tested have a common design, and the act of determining the probabilities comprises partitioning the design of the integrated circuits into multiple design blocks and analyzing the design blocks as described in the previous paragraph. For example, the partitioning procedure can comprise simulating faults associated with nets in the design of the integrated circuits, identifying at least a first group of observation points that captures errors from a first set of nets and a second group of observation points that captures errors from a second set of nets, and including the first set of nets in a first design block and the second set of nets in a second design block. The act of determining the probabilities can further comprise constructing probability models relating design block fail probabilities to fail probabilities of potential defects in respective design blocks, comparing the design block fail probabilities to the received information; and computing estimated fail probabilities of the potential defects using regression techniques. The act of determining the probabilities can also comprise identifying nets that fail at a substantially higher rate than other nets. A determination can be made whether the nets that fail at a substantially higher rate than other nets occur repetitively at or near a same die location of multiple wafers containing multiples instances of dies that each contain an instance of the tested integrated circuit (for example, by generating a wafer defect map). In certain embodiments, the received information is further indicative of one or more of the following properties associated with a respective potential defect: (a) a defect identifier that distinguishes the respective potential defect from other potential defects; (b) a derived rule identifier that identifies the defect extraction rule used to extract the respective potential defect; (c) a design manufacturing rule identifier that identifies the manufacturing rule that the defect extraction rules was based on; (d) one or more physical properties of the respective potential defect; (e) a physical location of the respective potential defect in the physical layout of the integrated circuit design; and (f) a ranking of the respective potential defect relative to other potential defects in the same class of potential defects.

In another exemplary embodiment disclosed herein, information is received that is indicative of integrated circuit failures observed during testing of multiple integrated circuits and potential defects that may have caused the integrated circuit failures, the potential defects having been extracted and targeted for testing using extraction rules derived from design manufacturing rules. The information received is analyzed to determine one or more failure rates associated with one or more of the potential defects, and the determined failure rates reported. The information received can comprise, for example, one or more of the following: (a) diagnosis results; (b) one or more lists of the potential defects; or (c) information about detection of the potential defects during the testing. In some embodiments, an estimate of the yield of the integrated circuits is determined based at least in part on the determined failure rates. A yield estimation can also be determined for other integrated circuits. In certain embodiments, an estimate of the escape rate of a respective potential defect or of the integrated circuits is determined based at least in part on the determined failure rates. An escape rate estimation of potential defects in other integrated circuits or of the other integrated circuits can also be determined. In some embodiments, the exemplary method further comprises estimating a yield sensitivity curve for at least one of the design manufacturing rules, the estimation being based at least in part on the determined failure rates. Further, the exemplary method can be performed over multiple time periods, and production trends can be determined based on changes in the determined failure rates observed over the multiple time periods. One of more of the following actions can be performed based at least in part on the reported failure rates: (a) adjusting one or more design manufacturing rules; (b) adjusting one or more defect extraction rules; or (c) providing recommended modifications of one or more features in the integrated circuit. In implementations wherein one or more features in the integrated circuit are modified based at least in part on the reported probabilities, the method can further comprise producing one or more integrated circuits having the modified one or more features. In certain embodiments, the diagnostic results are obtained through application of at least one fault dictionary. For example, the at least one fault dictionary can be a compressed fault dictionary that uses one or more bit masks to identify potential defects. In some embodiments, the act of analyzing comprises constructing probability models associated with the feature fail rates, relating the constructed probability models to the diagnostic results received, and computing estimated feature fail rates using regression analysis.

Any of the disclosed methods or procedures can be implemented in tangible computer-readable media comprising computer-executable instructions for causing a computer to perform the method. Further, tangible computer-readable media storing DFM rules created by any of the described methods, a compressed fault dictionary for use with any of the described methods, test patterns generated by any of the described methods, or results produced from, any of the described methods are also disclosed. Any of the disclosed methods can also be performed during production testing of a circuit-under-test. Any of the disclosed methods of procedures can also be performed by one or more computers programmed to perform the disclosed methods or procedures. Circuits having defects identified in part or design modified in part using any of the disclosed methods are also considered to be within the scope of this disclosure.

The foregoing and additional features and advantages of the disclosed embodiments will become more apparent from the following detailed description, which proceeds with reference to the following drawings.

BRIEF DESCRIPTION OF THE DRAWINGS

FIG. 4 is a block diagram showing an example of a connection of two signal lines in different layers using a via.

FIGS. 5 and 6 are block diagrams showing examples of the location of a via connection on the end of a signal line.

FIGS. 7 and 8 are block diagrams showing examples of a connection of two signal lines in different layers using a via.

DETAILED DESCRIPTION

General Considerations

Figure 1:
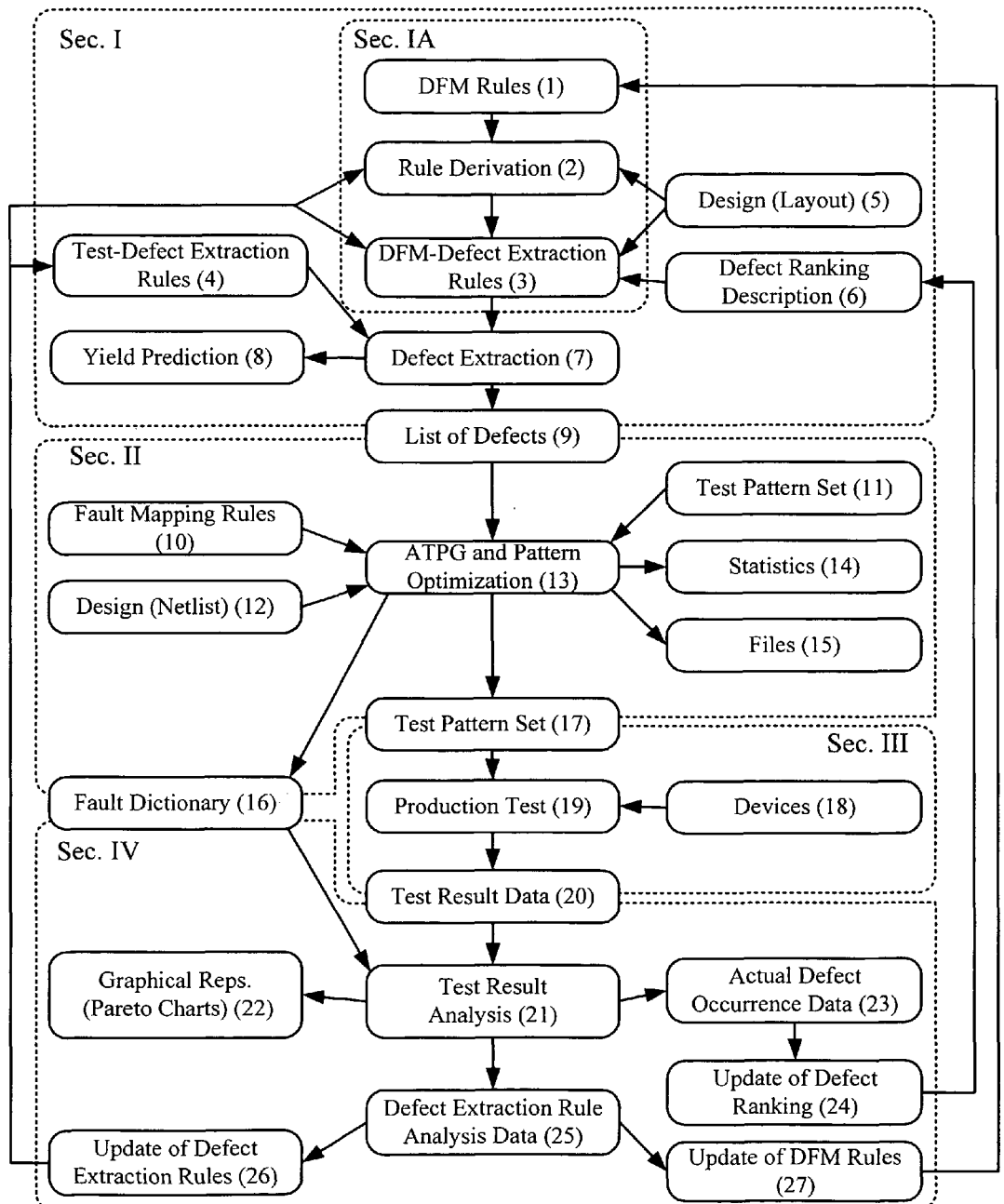
FIG. 1 is a block diagram showing the flow of an exemplary general method for improving design manufacturing rules according to the disclosed technology.

Disclosed below are representative embodiments of methods, apparatus, and systems having particular applicability to testing, analyzing, and improving the yield and quality of integrated circuits that should not be construed as limiting in any way. Instead, the present disclosure is directed toward all novel and nonobvious features and aspects of the various disclosed methods, apparatus, and systems, and their equivalents, alone and in various combinations and subcombinations with one another. The disclosed technology is not limited to any specific aspect or feature, or combination thereof, nor do the disclosed methods, apparatus, and systems require that any one or more specific advantages be present or problems be solved.

Moreover, any of the methods, apparatus, and systems described herein can be used in conjunction with the manufacture and testing of a wide variety of integrated circuits (e.g., application specific integrated circuits (ASICs), programmable logic devices (PLDs) such as a field-programmable gate arrays (FPGAs), or systems-on-a-chip (SoCs)), which utilize a wide variety of components (e.g., digital, analog, or mixed-signal components).

Although the operations of some of the disclosed methods are described in a particular, sequential order for convenient presentation, it should be understood that this manner of description encompasses rearrangement, unless a particular ordering is required by specific language set forth below. For example, operations described sequentially can be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of environments. For example, any of the disclosed techniques can be implemented in whole or in part in software comprising computer-executable instructions stored on tangible computer-readable media (e.g., tangible computer-readable media, such as one or more CDs, volatile memory components (such as DRAM or SRAM), or nonvolatile memory components (such as hard drives)). Such software can comprise, for example, electronic design automation (EDA) software tools (e.g., an automatic test pattern generation (ATPG) tool). The particular software tools described should not be. construed as limiting in any way, however, as the principles disclosed herein are generally applicable to other software tools. Circuit designs that result in defects that are detected using the disclosed techniques can in some circumstances be repaired.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. Any of the disclosed methods can alternatively be implemented (partially or completely) in hardware (e.g., an ASIC, PLD, or SoC).

Further, data produced from any of the disclosed methods can be created, updated, or stored on tangible computer-readable media (e.g., tangible computer-readable media, such as one or more CDs, volatile memory components (such as DRAM or SRAM), or nonvolatile memory components (such as hard drives)) using a variety of different data structures or formats. Such data can be created or updated at a local computer or over a network (e.g., by a server computer).

Overview of an Exemplary Yield Analysis Method

Exemplary desirable embodiments of the disclosed technology relate to the Design-for-Manufacturability (DFM) of integrated circuits. DFM rules (sometimes referred to herein as "design manufacturing rules") can be used to determine potential production aberrations, referred to herein as "defects". Other techniques, such as simulation of layout printability across the process window, can also be used to identify defects. According to certain embodiments of the disclosed technology, the actual distribution of classes of defects and of individual defects desirably can be determined using integrated circuits actually being produced for shipment by integrated circuit foundries (for example, integrated circuit designed for functional use in an electronic device). In other words, features present in an integrated circuit design in production can be analyzed instead of test structures on a specially designed test chips. Consequently, the need or use of specially designed test chips can be eliminated or significantly reduced. Further, by analyzing these distributions, the DFM rules can be modified to increase the yield in the production of the integrated circuit and of other integrated circuits that use the same set of DFM rules.

Figure 47:
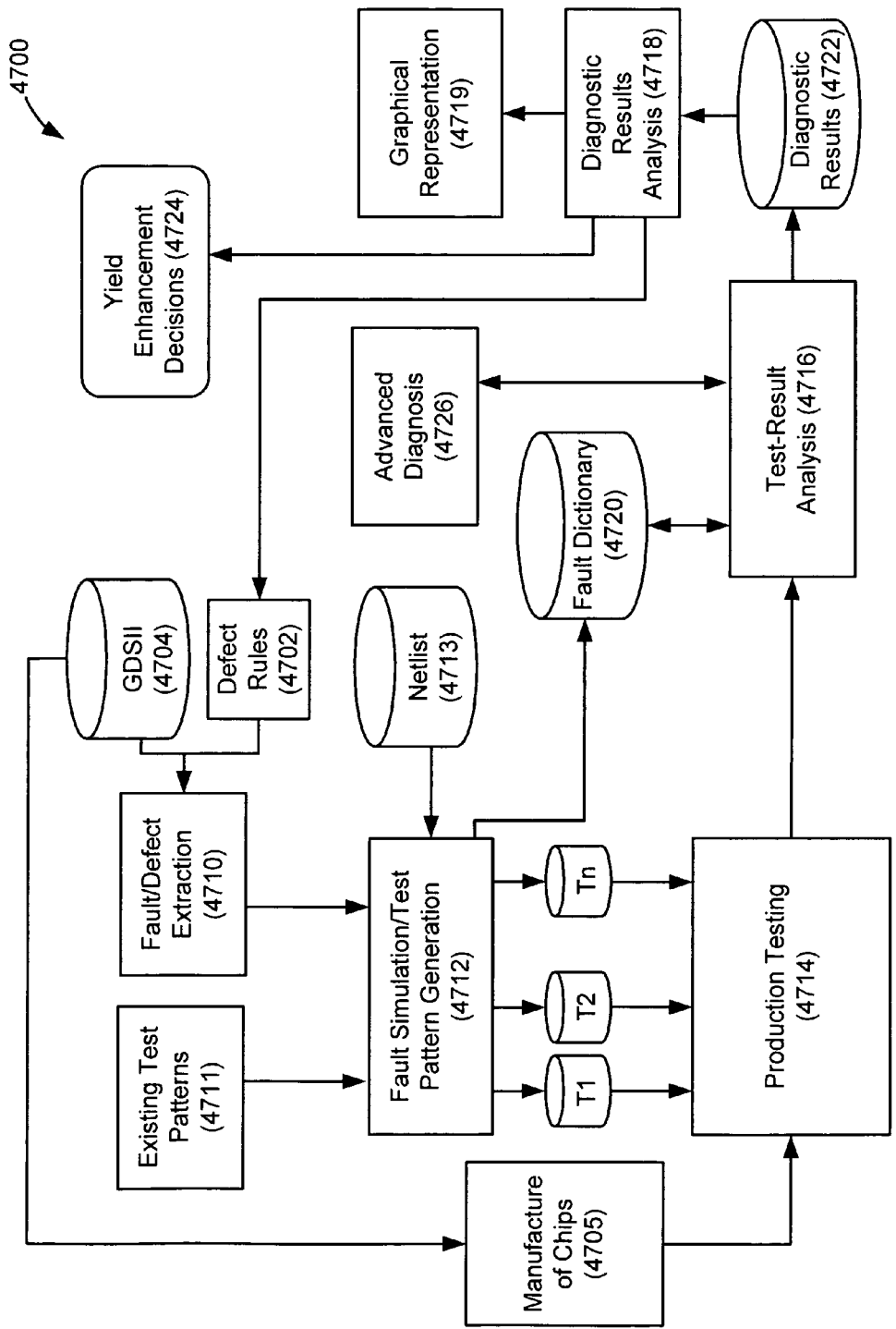
FIG. 47 is a block diagram schematically a yield analysis method according to one exemplary embodiment of the disclosed technology.

FIG. 47 is a block diagram schematically illustrating a yield analysis method (4700) according to one exemplary embodiment of the disclosed technology. In the illustrated embodiment, yield improvement is achieved by performing a test-based analysis of the underlying DFM rules or of an extracted or modified set of DFM rules derived at least in part from an initial set of DFM rules. Based upon these DFM rules, the defects that are most likely to appear can be extracted from the layout of the integrated circuit, and high-quality test pattern sets can be generated to target the detection of these defects. For example, and with reference to FIG. 47, a fault/defect extraction component (4710) (for instance, a physical verification tool or other appropriate EDA software tool) can receive a set of defect rules (4702) (for example, DFM rules provided by a foundry or a rules set created by an earlier iteration of the method (4700)) and a design of an integrated circuit (4704) (for instance, a layout description of the geometry of the integrated circuit design, such as a GDSII or Oasis file).

The fault/defect extraction component (4710) can operate to extract potential defects from the integrated circuit design, wherein the extraction is based at least in part on one or more of the defect rules (4702). For instance, one or more defect extraction rules can be determined from the defect rules and applied to the circuit design. Exemplary techniques for performing defect extraction rule creation and extraction are discussed in greater detail below. In some embodiments, the defects can be categorized into several classes and subclasses, which are parameterized by specific features of the class. A fault simulation/test pattern generating component (4712) (such as an automatic test pattern generation (ATPG) tool) can receive the extracted defects and operate to create one or more test patterns targeting the extracted defects. To generate the test patterns, the test pattern generating component (4712) can use a different representation of the integrated circuit, such as a netlist (4713). In addition, the fault simulation/test pattern generating component (4712) can receive existing test patterns (4711) and simulate or otherwise characterize them for the extracted defects. Furthermore the fault simulation/test pattern generating component (4712) can generate incremental test patterns. Exemplary techniques for performing test pattern generation for the extracted defects are discussed in greater detail below. The fault simulation/test pattern generating component (4712) can also produce a defect database (4720) (sometimes referred to as a fault dictionary, fault thesaurus, or defect dictionary).

The integrated circuit design is manufactured (4705) and tested (4714) (for example, using a tester or ATE). During testing (4714), fail information for one or more integrated circuits can be recorded. The testing can be performed, for example, using the generated test patterns targeting the extracted defects. In certain embodiments, the integrated circuits tested are production circuits, not specialized test chips. A test analysis component (4716) can receive and evaluate the fail information during production. In certain situations, and according to some embodiments of the disclosed technology, incremental simulation and diagnosis procedures can be used in order to increase the defect class resolution. Based at least in part on the test-result analysis, information concerning failing design properties can be collected and stored, for example, as diagnostic results (4722). A diagnostic results analysis component (4718) can be used to analyze the results using one or more statistical methods (described in greater detail below) and to display the results as one or more graphical representations (4719). For example, according to one exemplary embodiment, the results can be displayed in a pareto chart (for example, a graphical representation focusing, for instance, on potential design defects in design features and classes or subclasses of such defects). The diagnostic results (4722) can be used in multiple ways, such as to compute the yield for the integrated circuit production or to estimate the defects-per-million (DPM) (sometimes referred to as the "escape rate"). In some implementations, the presumed yield data is continuously updated in order to improve the accuracy of the predictions. Further, the outcome of the analysis of the diagnosis results can be used to analyze the DFM rules and defect-extraction rules. From this analysis, DFM rules and defect-extraction rules (whether derived from DFM rules or independently) can be related to the cause of the failing devices. Improvements of the DFM rule set and defect-extraction rule sets can then be generated (for example, in some embodiments, the improved rules are automatically generated). The new rule sets, when implemented, can be used to increase the quality or yield of the production of the integrated circuit and can also improve the initial yield of the production of other integrated circuits. The improvements to the rule sets can include, for example, additions, deletions, and modifications of existing rules, but can also involve the creation of new defect classes or the refinement of classes, which can form at least part of a new set of defect rules (4702). Thus, the yield analysis procedure illustrated in the block diagram (4700) can be repeated for a set of rules with one or more rules that have been revised or modified by a previous application of one or more of the components of the illustrated yield analysis process. In addition, analysis with fail data sets gathered over time can be compared to each other in order to identify trends in the occurrence of defects. These decisions are generally performed at yield enhancement decision stage (4724) and are typically made manually. Through the use of such a method, the necessity of so-called test chips can be greatly reduced or eliminated entirely.

Among other possible advantages, embodiments of the disclosed technology can be used to improve the yield and quality of the production of an integrated circuit and of future integrated circuits by improving the DFM rules, the defect-extraction rules, and/or the defect ranking. As explained in more detail below, embodiments of the disclosed technology can comprise one, some, or all of the following method acts:

Deriving defect-extraction rules from defect rules such as DFM rules;

Extracting defects from a description of the integrated circuit using the derived defect-extraction rules and additional defect-extraction rules;

Assigning a ranking to each extracted defect based on the description of the integrated circuit. (In some implementations, the ranking is continuously updated (e.g., using data collected from testing devices testing the described integrated circuit or other integrated circuits));

Filtering the extracted defects based at least in part on, for example, a ranking or location of the defect in the layout of the integrated circuit;

Predicting the yield and quality of the integrated circuit;

Mapping the extracted defects into fault models;

Generating, qualifying, and/or ordering input stimuli (for example, test patterns) based at least in part on the extracted defects and their ranking;

Generating a dictionary with respect to the generated input stimuli;

Applying test stimuli to manufactured chips and collecting test-result data;

Processing test-result data (for example, diagnosing the test results) using the dictionary;

Analyzing the results of diagnosis for the purpose of providing data that can be used in the following method acts:

Modifying, adding, and/or deleting DFM rules based at least in part on the analysis of the diagnosis results;

Modifying, adding, and/or deleting defect-extraction rules based at least in part on the analysis of the diagnosis results;

Modifying the defect ranking based at least in part on the analysis of the diagnosis results;

Diagnosing defects not originally included in the dictionary. This diagnosis can lead to the modification of the dictionary and/or addition of new or the modification of old DFM rules or defect-extraction rules, or both kind of rules; and Comparing a number of analysis result sets in order to compute and display trends with respect to the distribution of defects and defect classes.

In some implementations of the general method, such as the general method shown in FIG. 47, the method is applied to an integrated circuit having a scan-chain-based design, which can further include on-chip compression logic. Further, the general method is applicable in environments where the exchange of information is restricted.

As noted, certain embodiments of the exemplary general method involve the extraction of defects based on DFM Rules (for example, using defect extraction component (4710)). In some implementations, for example, one or more defect-extraction rules can be derived from one or more DFM rules. Further, the derived defect-extraction rules can comprise rules that are "tightened" and "loosened" in multiple ways with respect to the respective underlying DFM rules, with respect to the description of the integrated circuit, and/or with respect to external stimuli. These variations of the defect-extraction rules can help increase the resolution in determining and analyzing the failing of the respective underlying DFM rule. One or more defect candidates can be extracted from a description of the integrated circuit using the tightened and loosened defect-extraction rules. Further, one or more defect candidates can be extracted out of a description of the integrated circuit using an additional set of defect-extraction rules not present or implied by the original defect rules. According to one implementation, for instance, the defect-extraction procedure adds at least a nominal set of defects representing the worst case scenarios of each defect class to the set of extracted defect candidates. The extraction method can mark these defects as special worst-case defects. In some implementations, one or more parts of the integrated circuit description can be designated such that no defects are extracted therefrom when using the above-mentioned sets of defect-extraction rules.

The occurrence of a defect within each comparable class of defects can be ranked using the description of the integrated circuit, the tightened and loosened defect-extraction rules, and/or the respective underlying DFM rules. The occurrence of a class of defects can also or alternatively be ranked using the description of the integrated circuit, the tightened and loosened defect-extraction rules, and/or the respective underlying DFM rules. In certain implementations, historical data can be taken into account when computing either or both of these rankings. The defects can further be ranked by overlaying the ranking of the individual defect within each class of defects with the ranking of the respective class. Further, the achievable yield can be predicted based on the description of the integrated circuit, the tightened and loosened defect-extraction rules, the respective underlying DFM rules, and/or the ranking of the defects and classes of defects. Also, ranking within and across classes can be accomplished by re-ranking based on results of the diagnostic result analysis (4718) of either the current design or of results achieved from a comparable earlier design. Filters can also be applied to select the extracted defects based on such parameters as the ranking of the defects or certain property of the defects, such as location within the layout of the integrated circuits.

Some embodiments of the exemplary general method involve a process termed generally "DFM rule learning," which involves improving one or more DFM rules. For example, in some implementations, the DFM rules are improved based on the outcome of the testing of one or more integrated circuits. This improvement can comprise the modification of DFM rules, the addition of DFM rules, and/or the dropping of DFM rules. One or more of the tightened and loosened defect-extraction rules can also or alternatively be improved. This improvement can likewise comprise the modification of defect-extraction rules, the addition of defect-extraction rules, and/or the dropping of defect-extraction rules. The assumed ranking of the defect classes and/or the individual defects can also be improved based on the outcome of the testing of one or more integrated circuits.

Embodiments of the exemplary general method also involve the generation of test patterns targeting one or more of the extracted defects (for example, by test pattern generation component (4712)). For example, one or more defects from one or more classes of defects can be mapped to one or more corresponding faults associated with one or more fault models. Since multiple mappings are possible for some defects, the defect-to-fault mapping can be directed (e.g., via external stimuli). A netlist description (for example, netlist (4713)) of a design can be modified to enable design-for-test procedures like test pattern generation, simulation, and fault simulation to support defect-based testing by adding or deleting gates, or by adding or deleting signal lines, or both. In some implementations, the patterns can be reordered in order to enhance the defect resolution and/or the defect coverage. The pattern reordering can be performed while considering other, stored information. In certain implementations, a set of target defects, as well as the tasks defining what to do with the defects in the set, can be selected (e.g., manually or automatically). The set can contain one or more defects and have one or more tasks selected for it. Using this set of defects and tasks, test pattern generation can be performed. For example, test pattern generation can be performed to generate one or more tests for one or more of the named defects in the set of target defects, or to generate one or more tests that distinguish between subsets of the target defects in the set. Each of these subsets can contain one or more defects. The faults related to a set of target defects and tasks can be selected so as to increase the chance of successful test pattern generation (e.g., by analyzing the interaction of the faults and potentials to fulfill the tasks on the faults). Further, in certain implementations, the addition of a candidate test pattern for the set of target defects and tasks can be delayed according to an analysis of the effects this candidate test pattern will have on the overall quality of the test pattern set and defect set (especially with respect to defect resolution). This analysis, for example, can determine that the candidate test pattern for the set of target faults and tasks should not be used. The analysis can determine that the test pattern generation for the set of target faults and tasks should be abandoned, or that the generation of a different candidate test pattern for the same or a modified set of target defects and tasks should be performed. In some implementations, the fault simulation and/or test pattern generation that is performed supports multiple fault models simultaneously. In some implementations, faults mapped from one or more sets of defects and test patterns detecting these faults can be identified so that the defects, faults, and test patterns can be removed from further consideration without having to simulate the entire test pattern set. Certain implementations are further configured to modify integrated output response compaction schemes in order to increase the defect resolution and/or to increase the defect resolution by adding a selector stage to the mentioned output response compactor.

Embodiments of the general method can also involve a process known as "yield loss mechanism learning." For example, in certain implementations, the pareto chart of yield loss mechanisms is computed (for example, by test analysis component (4716) and/or diagnostic results analysis component (4718)) by analyzing fail data of production integrated circuits and using precomputed information stored, for example, in a defect dictionary (it should be noted that the term "dictionary" and "thesaurus" are used interchangeably in this disclosure). Miscellaneous defects that cannot otherwise be identified as belonging to any classes can be analyzed (for example, by advanced diagnosis component (4726)) so that new information can be learned and incorporated into the defect rule set, the defect extraction rule set, and defect dictionary. The defect dictionary can also be updated based on the new defect-extraction-rule set. The production testing fail data associated with each defective integrated circuit can be analyzed, and the class of the defects that caused the failure identified. The statistical data can be analyzed and calibrated to minimize the average prediction error due to the equivalent defects that cannot be distinguished, so that the computed pareto chart for example of yield loss mechanisms can achieve higher precision.

FIG. 1 is a block diagram illustrating more particularly the exemplary method for performing yield analysis illustrated in FIG. 47. The exemplary method shown in FIG. 1 is subdivided into four sections, identified as Section I, II, III, and IV in FIG. 1. For ease of presentation, the various sections and procedures therein are sometimes referred to as being actors of certain actions, though it should be understood that the procedures described are typically implemented as computer-implemented methods. Section I concerns the generation of defect-extraction rules (3), a list of defects (9), and a ranking (6) (for example, by fault-defect extraction component 4710). The defects (9) are extracted from the layout description (5) of the integrated circuit (for example, a GDSII file). In certain embodiments, this list of defects (9) is not explicitly represented and communicated between Section I and Section II, but is instead represented implicitly. Some of the defect-extraction rules (3) can be automatically derived (2) from a given set of DFM rules (1), according to which the integrated circuit was designed, as shown in Subsection IA. Section II concerns defect-based test pattern generation, simulation, and pattern optimization (13) (for example, by test pattern generation component 4712). This section can produce a high-quality test pattern set (17) with respect to defect coverage and especially to defect resolution of classes and subclasses of defects. A class can be defined by non-derived defect-extraction rules (4) and by DFM rules (1), and subclasses can comprise the derived respective defect-extraction rules (3). Section III concerns the application (19) of the test pattern set (17) to devices (18) in an ATE. Section IV concerns the processing (21) of test-result data (20) from the devices tested in Section III (for example, by test analysis component 4716 and/or diagnostic results analysis component 4718). The test-result data is evaluated, for example, with a dictionary (16), generated by Section II. A number of analyses can be performed on the data. One type of analysis leads to the display of the results of the tested devices using so-called "pareto charts" (22). Another type of analysis (23) provides data that can be used to update the ranking of the defects and defect classes (24). This information is fed back into Section I for an improved defect ranking and yield prediction. Yet another type of analysis (25) focuses on the set of current defect-extraction rules. This analysis investigates if some of the DFM rules (1) from which the defect-extraction rules (3) were derived should be modified. This information can be used to improve the DFM rules, and thus the yield, for the current integrated circuit (e.g. by means of a redesign or a mask modification (27)). In addition, the improved DFM rules can lead to higher initial yield of the next design, which is based on the now-improved DFM rules. A further aspect of this analysis is to feedback the modified (26) defect-extraction rules (3) (4), for example, to increase the defect resolution or to include defects that were not considered before.

In the following sections, the various procedures performed in the general method shown in FIG. 1 are described in greater detail. The particular procedures described should not be construed as limiting in any way, however, as they describe particular representative implementations of the procedures shown in FIG. 1. Any of the described procedures can be used separately or independently as part of other systems.

The discussion of the exemplary procedures assumes the production of an integrated circuit using DFM rules for which there is not yet much experience and knowledge. Traditionally, large quantities of test chips would have been produced to learn more about the DFM rules and the production challenges. Here, it is shown how embodiments of the disclosed method can help to reduce the requirements for test chips and, at the same time, increase the quality of knowledge gained.

Throughout the discussion, two DFM rules are considered by way of example. It should be understood, however, that the described rules are for illustrative purposes only and that the embodiments described are normally applied to a much larger number or set of DFM rules. The first example rule concerns the minimum distance between two signal lines. The second example rule concerns the layout geometry of the ends of signal lines if there is a via connection. The discussion below focuses at first on the method as shown in FIG. 1 and explains how defect-extraction rules are derived from DFM rules and how defects are extracted and ranked. Initially, the example skips details about the actual test pattern generation and test-result-data evaluation for purposes of readability. The example continues with the analysis of failing defect-extraction rules and relates this information back to the underlying DFM rules. Finally, details about exemplary methods of test pattern generation are described, followed by details of exemplary methods for evaluating the test-result data. The last section describes the application of the general method to circuit designs having output response compactors.

DFM Rule Based Defect-Extraction-Rule Derivation

Referring to subsection 1 a of FIG. 1, the exemplary flow starts with a set of DFM rules (1) and the layout data of an integrated circuit (5). From these DFM rules, defect-extraction rules (3) are to be derived (2). As noted above, DFM rules typically comprise recommendations or suggestions that reflect different levels of emphasis of the rules in the DFM set, and different requirements to follow them more or less strictly. However, for illustrative purposes only, the various types of rules are not distinguished in the discussion below. In implementations of the described methods, however, the differences among the rules are accounted for.

Figure 2:
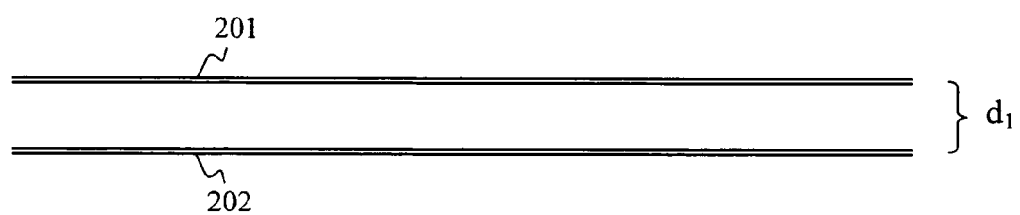
FIG. 2 is a block diagram illustrating a first DFM rule example—specifically, a rule stating that two signal lines must always keep a minimum distance of $d_1$.
Figure 3:
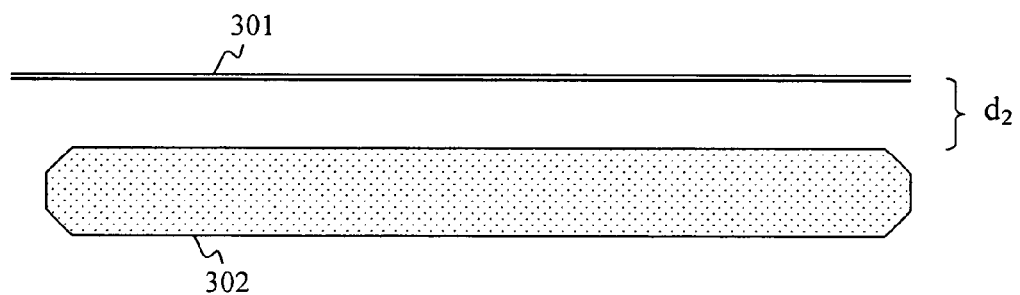
FIG. 3 is a block diagram illustrating a second DFM rule example—specifically, a rule stating that a signal line must always keep a minimum distance of $d_2$ from other layout features.

FIGS. 2 and 3 show examples of DFM rules. FIG. 2 depicts a rule that suggests that two parallel signal lines (for example, lines (201), (202)) should be separated from each other by a distance of $d_1$. FIG. 3 shows a similar rule that suggests that signal lines (for example, line (301)) should be separated by a distance of $d_2$ from any other layout feature (for example, feature (302)). Other DFM rules can describe, for example, how two signal lines in different layers are to be connected using a via. FIGS. 4, 7, and 8 show examples of such rules.

In general, DFM rules are used to ensure that the integrated circuit is actually manufacturable using the process and technology that is implied by the DFM rules. With reference to FIG. 1, the set of DFM rules (1) is translated (2) into a set of defect-extraction rules (3). As an example, refer again to FIG. 2. Let the DFM rule read as follows: M1: For all parallel signal lines in the same layer, the minimum distance is $d_1$.

According to one exemplary embodiment, the rule derivation procedure (2) transforms M1 into a set of defect-extraction rules (3) as follows. The layout (5) of the integrated circuit is analyzed. This analysis identifies possible defect candidates and their respective properties and distribution. It also takes external stimuli into account. For the sake of this example, assume that the user specified that there are currently production problems with the device that result in an increased likelihood of certain kind of defects (e.g., bridging defects). The analysis within the rule derivation method can address this problem. For the case where bridging defects are specified, for example, the analysis can define more bridge-defect-extraction rules than it would normally do. The resolution on the defect classes can be accordingly increased, thereby providing valuable information to the production engineer.

Figure 36:
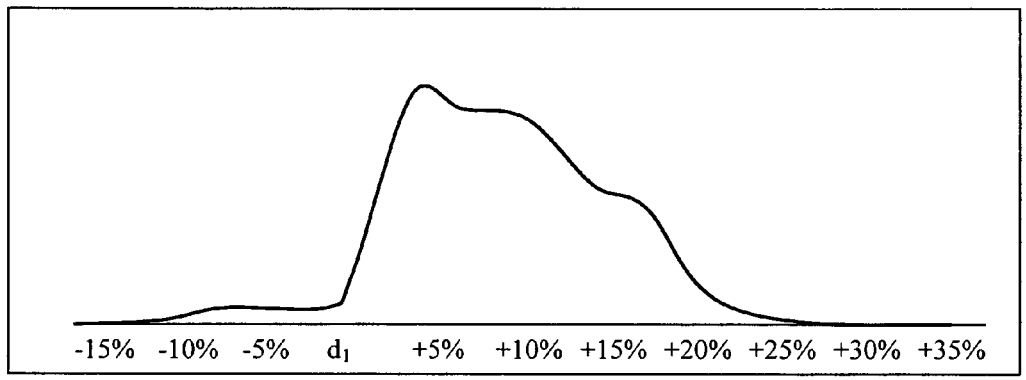
FIG. 36 is a graph showing the distribution of the distance between neighboring signals lines relative to a minimum distance $d_1$ for an exemplary integrated circuit.

In addition, the analysis could determine that design rule M1 has been violated in the layout (5). Thus, appropriate defect-extraction rules can be added to the set. For example, the distribution of the minimum distance between pairs of neighboring signal lines (limited by an upper factor of here $d_1+35\%*d_1$) could be as shown in the graph of FIG. 36. Note that y-axis is omitted from FIG. 36, as it used to schematically represent different parameters throughout the graphs shown in FIGS. 36-39. With respect to the distribution curve shown in FIG. 36, for instance, the y-axis schematically represents the number of neighboring signal lines having the corresponding distance shown on the x-axis.

Based on this distribution of candidates, the rule derivation procedure (2) distributes the defect candidates into classes with similar minimum distance. This classification can help increase the resolution of production faults with respect to design rule M1. This analysis can also be used to estimate the number of defect candidates before actually extracting them. The user can influence the defect extraction method at this point, if, for example, the number of potential defect candidates becomes too large. For the above distribution, the following exemplary defect-extraction rules (3) can be generated for the DFM rule M1 by the rule derivation procedure (2):

E1(M1): Extract all pairs of signal lines in the same layer whose minimum distance $d_{E1}$ is defined by: $d_1-3\%*d_1 \leq d_{E1} < d_1$ E2(M1): Extract all pairs of signal lines in the same layer whose minimum distance $d_{E2}$ is defined by: $d_1-8\%*d_1 \leq d_{E2} < d_1-3\%*d_1$ E3(M1): Extract all pairs of signal lines in the same layer whose minimum distance $d_{E3}$ is defined by: $d_{E3} < d_1 - 8\%*d_1$ E4(M1): Extract all pairs of signal lines in the same layer whose minimum distance $d_{E4}$ is defined by: $d_{E4}=d_1$ E5(M1): Extract all pairs of signal lines in the same layer whose minimum distance $d_{E5}$ is defined by: $d_1 < d_{E5} \leq d_1+4\%*d_1$ E6(M1): Extract all pairs of signal lines in the same layer whose minimum distance $d_{E6}$ is defined by: $d_1+4\%*d_1 < d_{E6} \leq d_1+8\%*d_1$ E7(M1): Extract all pairs of signal lines in the same layer whose minimum distance $d_{E7}$ is defined by: $d_1+8\%*d_1 < d_{E7} \leq d_1+13\%*d_1$ E8(M1): Extract all pairs of signal lines in the same layer whose minimum distance $d_{E8}$ is defined by: $d_1+13\%*d_1 < d_{E8} \leq d_1+20\%*d_1$ It is possible that a pair of signal lines runs parallel to each other at different distances for different sections of the signal lines, causing that pair to be selected by multiple extraction rules. The defect probability computation later in the flow should desirably take this into account.

A second exemplary DFM rule M2 to consider is a geometric one. Specifically, M2 defines the geometry at the end of signal lines in the case when there is a via connecting the signal line to another in an adjacent layer. FIGS. 4, 7 and 8 show different possibilities of the geometry at the end of the signal lines. All of the geometries connect signal (401) to signal (402) through via (403) but they differ in their reliability. FIG. 5 illustrates the problem. The ends of signal line (501) are not actual squares, but assume a round shape due to a number of production issues. This can cause via (502) to be partially off the signal contact, which in turn limits its capability of establishing a correct connection between the connected signals. FIG. 6 shows one possible solution to the problem: The via (502) is relocated a bit away from the signal end. FIGS. 7 and 8 show other such examples. The realizations shown in the FIGS. 4, 7, and 8 fail with a different probability (i.e. they have a different impact on the yield), with FIG. 8 showing the most reliable connection geometry of the group. Therefore, the DFM rule M2 can read as follows:

M2: If a signal line is connected to another signal line with a via at the end of the signal line, the geometry should be analogous to FIG. 8.

It can be extremely difficult or impossible to extract all signal lines which have vias at their end. The defect-extraction rules should therefore select the defect candidates carefully. For example:

E1(M2): Extract $n_1$ signal lines, for which all respective connections follow FIG. 4.

E2(M2): Extract $n_2$ signal lines, for which all respective connections follow FIG. 7.

E3(M2): Extract $n_3$ signal lines, for which all respective connections follow FIG. 8

E4(M2): Extract $n_4$ signal lines, which were not selected by E1(M2) through E3(M2).

Rules E1(M2) through E3(M2) are desirable for a good defect resolution. But the respective sets of extracted defects could be empty. Rule E4(M2) adds a reliability test to the test pattern sets. Because one cannot target all problematic vias, only the most likely signal lines to fail are selected as targets. If there is a general problem with the vias, many tests will fail, not only the ones for the DFM rule M2. But these extraction rules add a certain resolution capability to the test pattern set.

Similar defect-extraction-rule derivations can be computed for other DFM rules (1). The defect-extraction rules derived collectively form the set denoted by (3) in FIG. 1. The derivation process (2) should ensure that for each defect-extraction rule, it remains possible to determine from which DFM rule it was generated. For example, there can be a unique ID assigned to each DFM rule. Each defect-extraction rule translated from the same DFM rule can share this ID as part of its data structure.

Besides the DFM-based defect-extraction rules (3), there is another set of defect-extraction rules (4) that can be created and used. This set focuses on traditional defect-limited yield loss aspects, which are not covered by the DFM-based defect-extraction rules. One example of this kind of rule targets inline resistance of signal lines, which in turn alters the speed with which a transition of voltage levels travels through the signal line. An additional subset of rules in set (4) defines areas for which no defect shall be extracted. Such areas are, for example, memories, which have their own self-test.

Defect Extraction

Based on the defect-extraction rules (3) (4), the actual defect candidates are extracted using the layout description (5) of the integrated circuit. Once the extraction rules are in place, the extraction itself (7) is well understood, and can be achieved using one of many available tools (e.g., Calibre® from Mentor Graphics Corporation). Extraction (7) generates a list of potential defects (9).

An extracted defect can be defined by the data describing the actual defect, like location and physical properties. Additional data can be associated with each defect. For example, in one exemplary implementation, the defects in the list (9) have one, some, or all of the following additional properties:

1. A unique identifier;
2. An identifier disclosing the rule from DFM-defect extraction rules (3) and/or test-defect extraction rules (4) corresponding to the defect extraction rule that caused the inclusion of the respective defect in the list of defects;
3. An identifier disclosing the defect extraction rule that caused the inclusion of the respective defect in the list of defects;
4. The location of the defect in the layout of the integrated circuit;
5. One or more physical parameters of the defect, such as length, width, resistance, and/or capacitance;
6. An indicator of whether the defect belongs to a special class of defects (for example, a worst-case defect of each class of defects); and
7. A ranking. According to one implementation, the ranking corresponds to the defects probability;

Item 1 is typically used to relate faults (which will be derived from defects using the methods of ATPG, fault simulation, and pattern optimization) to the original defect. There could be more than one fault derived from a single defect.

Items 2 and 3 are used, for example, in the analysis of the effectiveness of the rules, which in turn feeds back to the addition, deletion, or modification of the defect-extraction rules and/or the design manufacturing rules.

Item 4 can be used for identifying frequently failing locations and for guiding physical failure analysis.

Item 5 can be used for estimating the sensitivity of the defects to variation in physical parameters.

Item 6 is used to flag the occurrence of defects that were not necessarily the target of the normal defect-extraction rules. With the help of these specially marked defects, it is possible to cover all or nearly all of the possible defect classes. These specially marked defects can be used to give the user an early warning of, for example, drifting production parameters, before they become statistically significant. For example, one set of inline resistive defects can contain the five longest signal lines in a specific metal layer. Initially, the test patterns that would detect these defects fail very rarely; however a few weeks later, these test patterns fail more often. Although the total number of fails may be statistically insignificant with respect to the overall test result of the device, a statistically significant increased failing rate with respect to these special defects can give the production engineer an early warning of a problem building up before it actually impacts the yield.

Item 7 helps the described method to correctly rank the defects of all different kinds.

Ranking

There are at least two ranking schemes that can be used alone or together to rank the extracted defects. A first exemplary ranking involves ranking the defects within each class. This means that the ranking does not represent an absolute number among all possible defect candidates, but rather is specific to a particular class. For example, the ranking for all bridge types of defects can be comparable, and the ranking of all open or resistive vias can be comparable. This ranking can be computed automatically. A second exemplary ranking is between defect classes and is typically not determined automatically without some externally provided data. Information can be supplied, for example, that relates the classes of defects in a quantified manner.

A description is provided below of how historical data can be used to predict failing rates and to rank the defects. This historical data can be gathered, for example, from earlier testing of the same integrated circuit, or from testing of other integrated circuits that use the same or similar DFM rules. A description is also provided of how defects of the same class can be ranked if no historical data is available. An exemplary overall ranking procedure is also described.

Figure 37:
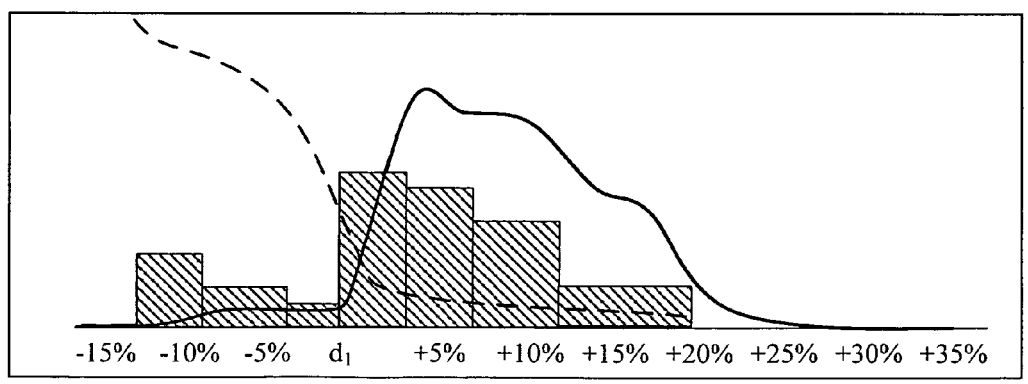
FIG. 37 is the graph of FIG. 36 overlaid with predicted defect data and a predicted yield sensitivity curve for the exemplary integrated circuit.

FIG. 37 shows a graph of the distribution curve of FIG. 36 together with a dashed line showing the expected yield sensitivity curve. In this example, the yield sensitivity curve was derived from assumptions and experience. With respect to the yield sensitivity curve, the y-axis schematically indicates the percentage of yield loss resulting from signal lines separated by the corresponding distances on the x-axis. In general, yield sensitivity indicates the expected yield loss for each of the subclasses (for example, the percentage of expected fails) and can be used for ranking (for example, from highest yield sensitivity to lowest). Yield sensitivity data along with the actual number of defect candidates in each subclass E1(M1) to E8(M1) can be used to compute the estimate of the number of expected fails due to the defects for each extraction rule (shown as the step functions in FIG. 37). This data can also be used to rank the defects (for example, from the highest number of expected fails to the lowest). Remember that this example assumes that there is not much knowledge about the DFM rules used and the production of devices using these rules. Therefore, the yield sensitivity curve shown represents an educated first guess of the responsible engineer. As explained in more detail below, the expected yield loss can be compared to the actual test response data and conclusions drawn from the comparison.

An exemplary ranking of defects extracted with respect to DFM rule M2 is presented in this paragraph. As discussed above, the probability of failing is different for the three possible geometries associated with rules E1(M2), E2(M2), and E3(M2). According to one exemplary implementation, the ranking of defects extracted due to rule E1(M2) is higher than the defects extracted due to rule E2(M2), which is higher than the defects extracted due to rule E3(M2). The ranking of defects extracted due to rule E4(M2) depends on the actual number of occurrences of the different geometries and will vary.

Note that it is not necessary that there exists a failing probability assigned to the defects to compute a ranking of defects within a class. However, if one wants to rank the classes of defects relative to one another, some additional data is typically used. In certain implementations, default values are assumed, but actual data is usually preferred. Assume, for instance, that is known that the relationship of fails between bridges and vias is 80:20. From this, a ranking between classes can be computed in a straightforward fashion—specifically, in a way that for every eight bridge defects selected according to their own ranking procedure, the next two highest ranking via defects are selected. Since actual defect data is assumed not to be available at this point, this ranking comprises a first approximation. But since the flow does not typically require truncating the pattern set, coverage is usually not an issue. Potentially, a certain defect can be selected sooner or later than it should have been selected. If the available data allows it, the method (7) can give a yield estimate (8).

Test Pattern Generation and Production Testing

After the list of defects (9) has been generated, the general method shown in FIG. 1 enters Sections II and III: test pattern generation and optimization, and test application. For purposes of maintaining the clarity of this description, the discussion of how the test patterns are generated is provided later. The following points concerning the test patterns, however, should be kept in mind.

In certain embodiments of the disclosed technology, one or more of the test patterns (17) can distinguish classes and, in certain embodiments, subclasses of defects. In addition, the test patterns can distinguish the majority of defects, but only as a subordinated objective with respect to the capability to distinguish classes and subclasses of defects. (In this discussion, it is assumed that each DFM rule defines a class and each defect-extraction rule defines a corresponding subclass.)

For purposes of this discussion, to increase the defect coverage, N-detection patterns are assumed with a user-selectable N. That is, N different patterns are used to detect a given defect.

For purposes of this discussion, it is assumed that a fault dictionary (16) is generated together with the pattern set. The fault dictionary can comprise, for example, a table organized into rows, with each row containing data for a test pattern. The rows, and therefore the test patterns, can be in the same sequence the test patterns are listed in the accompanying pattern set (17). A fault in the fault dictionary can be described by carrying the ID of the defect it was derived from, a fault type, the overall number of times the fault has been detected, and the number of observation points the fault can be propagated to under the current test pattern. Further, the fault dictionary can store only a limited amount of detection data. For example, for each fault, only the first k detecting test responses can be stored; and for any later detection, the test response is not stored but the detection still counted. For each test pattern, the observation points at which faults detectable by the test pattern can be observed in the netlist representation of the integrated circuit can be listed in or discernible from the fault dictionary. The detectable faults can be organized, for example, as lists associated with each of the observation points listed for the current pattern. Exemplary implementations of a fault dictionary as can be used in connection with any of the described embodiments are described, for example, in B. Chess and Tracy Larabee, "Creating Small Fault Dictionaries," IEEE Transactions on Computer-Aided Design, Vol. 18, no. 3, pp. 346-356 (March 1999), and V. Boppana, I. Hartanto, and W. K. Fuchs, "Full Fault Dictionary Storage Based on Labeled Tree Encoding," in Proceedings of the VLSI Test Symposium, pp. 174-197 (1996). Other exemplary methods for creating a fault dictionary as can be used in any of the disclosed embodiments are also described below in a separate section.

It is assumed for purposes of this discussion that devices realizing the integrated circuit (5) have been tested using the test pattern set (17) as illustrated in Section III of FIG. 1. Test result data (20) can be available either in real time (while production testing is still in progress) or from a database storing earlier test results.

Test-Result Analysis

Figure 31:
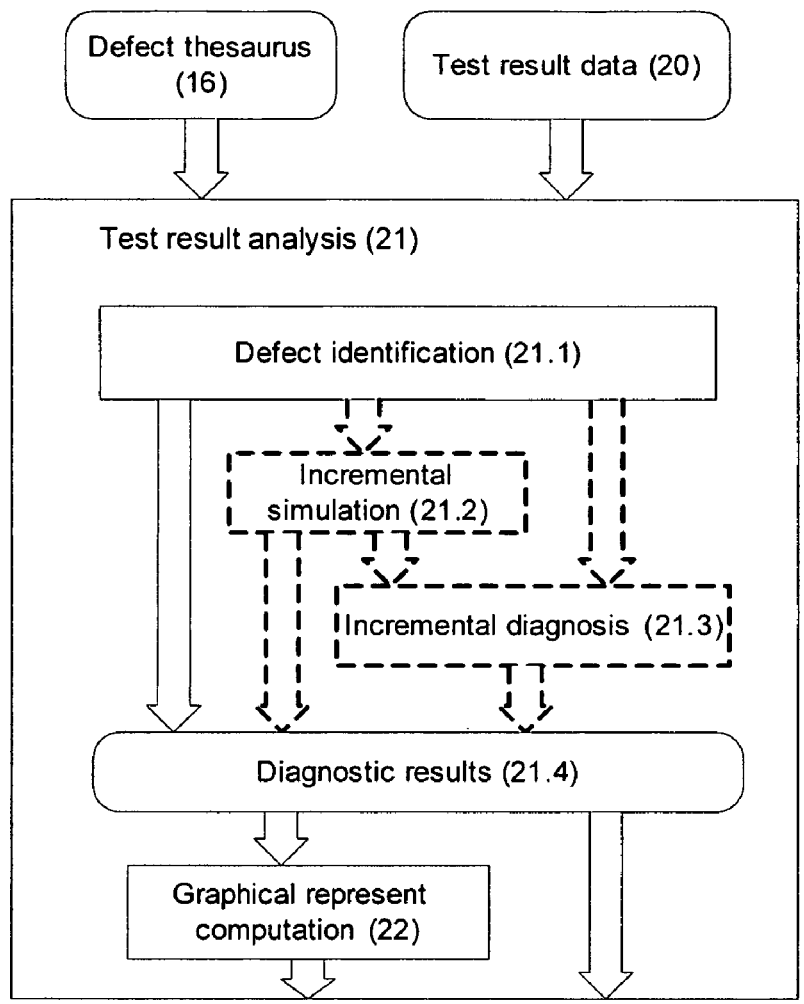
FIG. 31 is a block diagram illustrating an exemplary manner in which the test results can be post processed.
Figure 38:
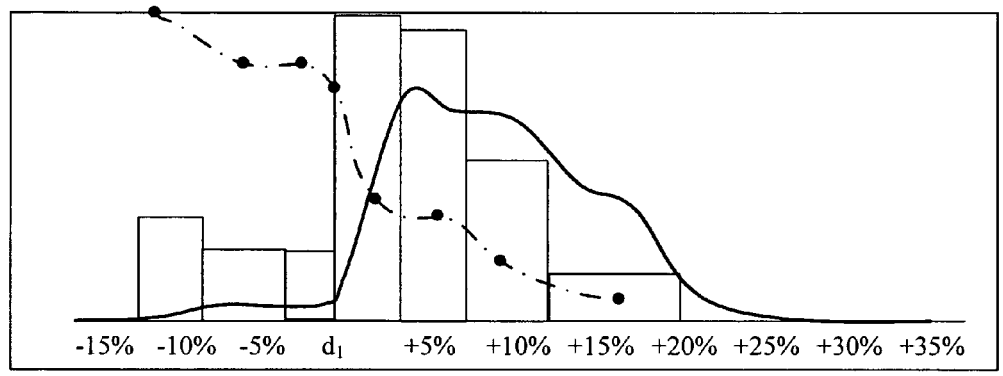
FIG. 38 is the graph of FIG. 36 overlaid with actual defect data and an actual yield sensitivity curve for the exemplary integrated circuit.

Section IV of FIG. 1 involves the processing and analysis of test-result data (21). A more detailed description of the analysis is provided in a separate section below. In general, however, the test-result analysis is performed to determine from the test result data (20) and the dictionary (16) which classes of defects have failed, and if possible, which individual defects. FIG. 31 is a block diagram showing an exemplary manner in which the processing (21) can be performed. Process (21.1) is performed to try to identify the defect, respectively the class or subclass of the defect, which can best explain the failing behavior of the integrated circuit. If necessary, incremental diagnosis (21.3) and incremental simulation (21.2) procedures are activated. For most failing test patterns of the tested devices, the class or subclass of the defect most likely responsible for the failing behavior can be determined and stored as diagnostic results (21.4). Unclassified failing devices can include among other possibilities, multiple defects, marginal failures such as noise related or signal integrity issues. The exemplary general method of FIG. 1 continues with defect extraction rule analysis (25), wherein a data set containing the relation of the defect-extraction rule to the number of identified defects for the rule can be produced. For each defect, the identifier of the extraction rule that was responsible for its inclusion in the list of target defects (9) is typically available. The graph of FIG. 38 displays this relation as a step function for the example discussed above with respect to FIG. 36. That is, the step function shown in FIG. 38 schematically shows the number of actual fails observed for each extraction rule. From the number of actual fails for each of the extraction rules, and from the number of candidates covered by each rule, the actual yield loss per class of defect (yield sensitivity) is computed. The actual yield sensitivity curve is displayed in FIG. 38 as a dotted line.

Figure 39:
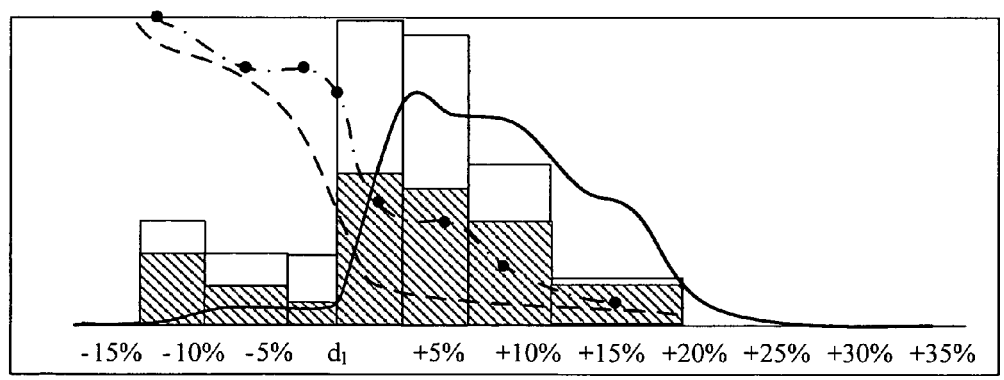
FIG. 39 is the graph of FIG. 37 overlaid with the graph of FIG. 38 and showing a comparison between the predicted and actual results.

The graph of FIG. 39 compares the initial expected yield loss (dashed line) with the actual yield loss (dotted line) for the example discussed above with respect to FIG. 36. FIG. 39 also shows a comparison of the two associated step functions indicating the number of expected and observed defects, respectively, for each subclass of defect. As can be seen, the actual yield loss is much higher than the expected yield loss. More specifically, the following observations can be made: (1) the yield loss is higher than expected for all subclasses; (2) the yield loss is about two times higher for the defect-extraction rules E4(M1) to E7(M1); and (3) the yield loss for extraction rule E8(M1) is higher, but close to the expected yield loss.

From the observations, the following two conclusions can be drawn: (1) DFM rule M1 is valid, but there is a problem in the production of the integrated circuit; or (2) the production runs within optimal parameters, thus rule M1 should be modified. Further analysis can be performed to help decide between conclusion 1 and 2, or a combination thereof. For example, pareto charts (22) and other test result data analysis (21) can help an engineer find a conclusion.

The conclusions can lead, for example, to the following short term and long term actions:
  Short term: Refine the yield prediction and DPM estimate numbers of parts shipped.
  Long term: Determine if conclusion 1 or 2 holds by analyzing, for example, other test result data and perform subsequent failure analysis on selected devices.

The time difference between the actions mentioned above can be significant. The turn-around time of the long-term action can take many months. The required close analysis of failing devices takes days or a few weeks. But the implementation of the corrective action, let it be changes in the production line, mask production, or redesign using a modified DFM rule M1, will typically take a few months.

By contrast, the turn-around time of the short-term actions as outlined in the following is only a matter of hours to a few days. Therefore, the short-term actions can be important. In this example, one or more of the following short-term actions can be initiated:
 1. Modify the ranking of the defects to focus closer on defects extracted from DFM rule M1;
 2. Refine the extraction rules of the DFM rule M1, and reanalyze present test result data;
 3. Accordingly modify the defect-extraction rules to focus closer on the problem;
 4. Generate additional test patterns to better cover the identified problem with higher resolution;
 5. Generate additional test patterns to cover defects that may not have been covered before;
 6. Iterate 1. through 5. if necessary when additional test result data is available; and
 7. Conclude from 1. and 2. an improved DFM rule M1 for a possible long-term solution.

Item 1 is relatively straightforward. The defect ranking can be updated (24) using the corresponding actual defect occurrence data (23) by replacing the expected yield loss data (shown in the graph of FIG. 37) with the actual yield loss data (shown in the graph of FIG. 38). In addition, the respective data in the defect ranking description (24) used during defect extraction (7) can be changed so that defect classes derived from DFM rule M1 have a higher priority.

As explained in the following, items 2 through 5 can improve defect coverage and increase the defect resolution for the test of the devices realizing the integrated circuit until the problem of low yield and quality is resolved. For example, the test and shipping of already produced devices of the integrated circuit can continue. However, due to the increased likelihood of defects related to DFM rule M1, testing is desirably improved to filter out more defects of this class in order to retain DPM requirements. Further, it is often desirable to generate sufficient high quality data to guide the automatic refinement of DFM rule M1, if this turns out to be necessary.

One possible method for increasing the resolution of the relevant defect extraction rules is to split the area covered by each defect-extraction rule E1(M1) through E8(M1) in half, thus doubling the number of subclasses. Another possible method, however, evaluates the defect extraction rule analysis data (25) to determine the number of candidates in each new potential subclass, and can additionally account for the expected and actual yield data. For example, because rules E4(M1) through E7(M1) showed substantially higher yield loss than the other rules, they can be divided into two or more smaller subclasses. The resolution requirements for the ATPG for the sections that were supposed to have higher yield than observed can thereby be increased.

In addition, for the case where M1 should be relaxed, what is now E7(M1) and E8(M1) can be located around the new minimum distance $d_{1new}$. To support the updated procedure (27) with high quality data, E7(M1) and E8(M1) can be divided into smaller subclasses as well too, and a new subclass beyond E8(M1) can be generated.

Additionally, yield sensitivity predictions based on the test response data can be displayed for the new extraction rules similar to the graph of FIG. 38. Note that, in this case, some ambiguity is possible because the test pattern set (17) was not generated for distinguishing the new subclasses. However, as mentioned above, the test pattern set generated is likely to distinguish the subclasses sufficiently enough to give a good estimate. The new defect-extraction rules can comprise, for example:
  E1(M1): Extract all pairs of signal lines in the same layer, which minimum distance $d_{E1}$ is defined by: $d_1 - 1\% * d_1 \leq d_{E1} < d_1$
  E2(M1): Extract all pairs of signal lines in the same layer, which minimum distance $d_{E2}$ is defined by: $d_1 - 3\% * d_1 \leq d_{E2} < d_1 - 1\% * d_1$
  E3(M1): Extract all pairs of signal lines in the same layer, which minimum distance $d_{E3}$ is defined by: $d_1 - 8\% * d_1 \leq d_{E3} < d_1 - 3\% * d_1$
  E4(M1): Extract all pairs of signal lines in the same layer, which minimum distance $d_{E4}$ is defined by: $d_{E4} < d_1 - 8\% * d_1$
  E5(M1): Extract all pairs of signal lines in the same layer, which minimum distance $d_{E5}$ is defined by: $d_{E5} = d_1$
  E6(M1): Extract all pairs of signal lines in the same layer, which minimum distance $d_{E6}$ is defined by: $d_1 < d_{E6} \leq d_1 + 1\% * d_1$
  E7(M1): Extract all pairs of signal lines in the same layer, which minimum distance $d_{E7}$ is defined by: $d_2 + 1\% * d_1 < d_{E7} \leq d_1 + 3\% * d_1$
  E8(M1): Extract all pairs of signal lines in the same layer, which minimum distance $d_{E8}$ is defined by: $d_1 + 3\% * d_1 < d_{E8} \leq d_1 + 6\% * d_1$
  E9(M1): Extract all pairs of signal lines in the same layer, which minimum distance $d_{E9}$ is defined by: $d_1 + 6\% * d_1 < d_{E9} \leq d_1 + 10\% * d_1$
  E10(M1): Extract all pairs of signal lines in the same layer, which minimum distance $d_{E10}$ is defined by: $d_1 + 10\% * d_1 < d_{E10} \leq d_1 + 13\% * d_1$ E11(M1): Extract all pairs of signal lines in the same layer, which minimum distance $d_{E11}$ is defined by:
$d_1+13\%*d_1 < d_{E11} \leq d_1+16\%*d_1$ E12(M1): Extract all pairs of signal lines in the same layer, which minimum distance $d_{E12}$ is defined by:
$d_1+16\%*d_1 < d_{E12} \leq d_1+20\%*d_1$ E13(M1): Extract all pairs of signal lines in the same layer, which minimum distance $d_{E13}$ is defined by:
$d_1+20\%*d_1 < d_{E13} \leq d_1+24\%*d_1$ These new defect-extraction rules for DFM rule M1 can be used to replace the old defect-extraction rules for M1 in the set of defect-extraction rules (3). In some embodiments of the disclosed technology, the defect-extraction rule responsible for extraction of a particular defect is known. Accordingly, for the revised set of defect-extraction rules, the defect extraction procedure (7) can update the respective extraction rule identifications for the defects listed in the list of defects (9) to account for the finer subclasses and extract defects for the newly covered areas (for example, defined by E13(M1)).

For the revised rules, and according to one exemplary embodiment, the ATPG procedure (13) does not change. More specifically, the ATPG procedure still attempts to produce test patterns that distinguish the classes of defects. It is likely, however, that the old test pattern set (17) already distinguishes many of the new classes, at least in part. Therefore, test pattern set (17) can be used as the original test pattern set (11), and ATPG can be performed with the new list of defects. For example, the original test pattern set (11) can be simulated in order to determine an initial classification of the defects. ATPG can then compute top-up patterns and reorder the patterns as usual in order to distinguish the new subclasses as required. Overall, the additional effort spent in ATPG is considerably less that generating a new test pattern set from scratch. The newly generated test pattern set can then be used to test more devices realizing the integrated circuit, or, if requested, retest the previous devices.

For purposes of this discussion, assume that at some later time, the long-term problem analysis concludes that there is nothing wrong with the production line. Therefore, the decision has been made to modify DFM rule M1 and accordingly increase the required minimum distance $d_1$. The DFM rules updating component (27) can determine a new minimum distance out of the available data. In addition, the DFM rules updating component (24) can provide data used to produce an accurate yield prediction (8) based on actual test result data.

In the following section, a more detailed description of test-pattern generation is provided.

Generation of DFM Test Patterns

Referring again to FIG. 1, in one exemplary implementation of the general method, the ATPG component (13) computes a defect-based test pattern set (17), which can be applied to devices on an ATE. A fault dictionary (16) can also be generated, in which pattern and defect information is stored for easy retrieval and display. Various files (15) (e.g., lists of faults and defects) can also be stored.

Figure 9:
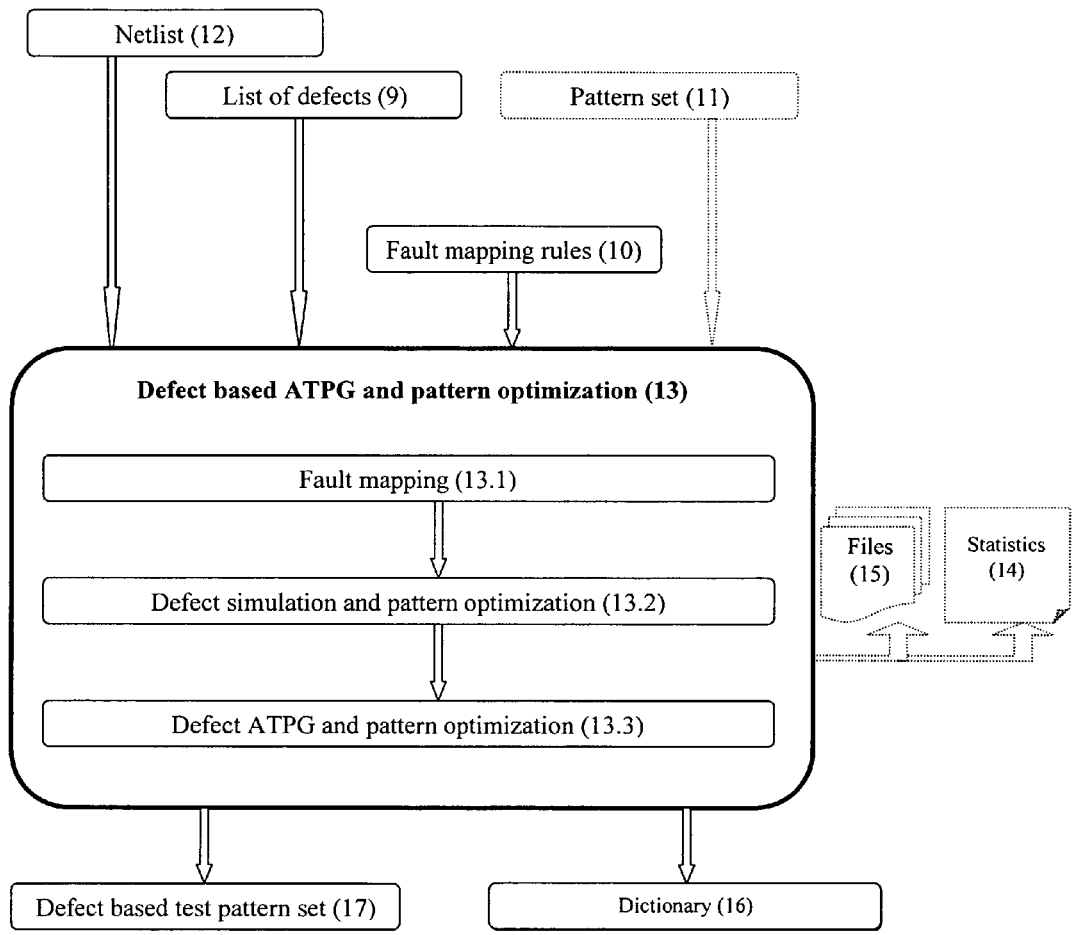
FIG. 9 is a block diagram showing in greater detail an exemplary manner in which component 13 of FIG. 1 can be performed.

The following section describes exemplary methods of defect-based simulation and test-pattern generation as can be used in embodiments of the disclosed technology. FIG. 9 is a block diagram showing one exemplary method for performing the defect-based ATPG and pattern optimization (13) of FIG. 1. The defect-based ATPG and pattern optimization component (13) shown in FIG. 9 uses a netlist (12), which is a different representation of the integrated circuit than described by the layout (5), and a list of defects (9). A set of rules (10) defining the way these defects are going to be mapped into faults, and an optional set of patterns (11) are additional inputs to the defect-based ATPG and pattern optimization component (13). The defect-based ATPG and pattern optimization procedure (13) can be configured to automatically substitute the fault mapping rules (10) with default rules in instances where the set is not defined. The defect-based ATPG and pattern optimization component (13) outputs a defect-based test pattern set (17) produced according to a desired defect resolution and a corresponding dictionary (16). In addition, various files (15) and statistics (14) can be requested. Statistics can include metrics such as fault coverage, test coverage, defect coverage, and estimate of quality (DPM).

The optional pattern set (11) can be from any source. For example, the pattern set (11) can be a classical-fault-model-based test pattern set. Classical-fault-model-based means here that the patterns were generated for, for example, stuck-at faults, transition faults, path delay faults and other such 'classical' fault models.

The defect-based ATPG and pattern optimization component (13) also uses a set of rules (10) describing the way the user wants the component to map the extracted defects to faults. An example is bridging defects. There are multiple ways to define faults associated with a bridge defect. Simple ones are wired-and or wired-or. Enhanced ones can characterize the bridge as a zero-resistance connection between the two nets, and the interpreted logic value of the voltage on the shortened nets can depend on the interpretation of the sink gates. However, the user may want to define a bridge having a resistance of c Ohms per µm of net distance, and leave the actual computation to the tool. The defect-based ATPG and pattern optimization component (13) provides default rules.

Fault Mapping (13.1)

Figure 10:
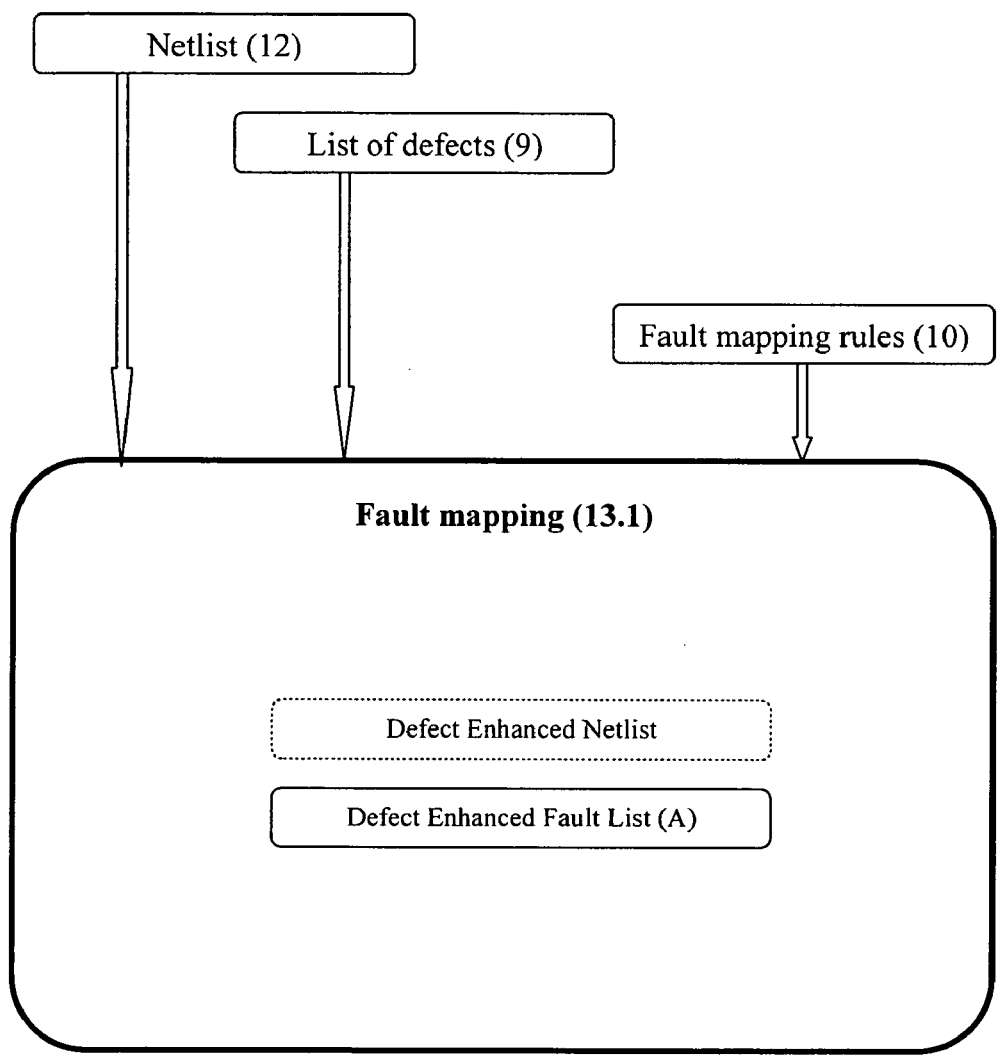
FIG. 10 is a block diagram showing in greater detail an exemplary manner in which component 13.1 of FIG. 9 can be performed.

Referring now to FIG. 10, fault mapping (13.1) is a two-step process according to one exemplary embodiment. At first, the mapping method evaluates the list of defects (9) and rules (10). In certain implementations, the fault mapping procedure (13.1) can determine whether the netlist (12) can support a proper defect to fault mapping. If the netlist (12) cannot, the netlist (12) can be modified in order to enable the fault-based ATPG and simulation to correctly compute and evaluate defect effects.

The fault mapping procedure (13.1) can map the defects into faults based on, for example, user-selectable rules (10). As a result, a defect-enhanced fault list (A) can be generated. Note that, in some implementations, there is only one fault list (A) used throughout the fault mapping procedure (13), and each step can alter data in the fault list (A). For convenient presentation, different lists (A) will not be distinguished in subsequent figures.

Note that the fault models used are typically more sophisticated than the traditional stuck-at or transition fault models in order to model the behavior of the defect. Further, the mapping will sufficiently abstract the defect in order to have a working fault model. In general, a wide variety of fault models can be used. In addition, faults or different fault models are desirably supported in the ATPG and fault simulation methods.

Defect Simulation and Pattern Optimization (13.2)

Figure 11:
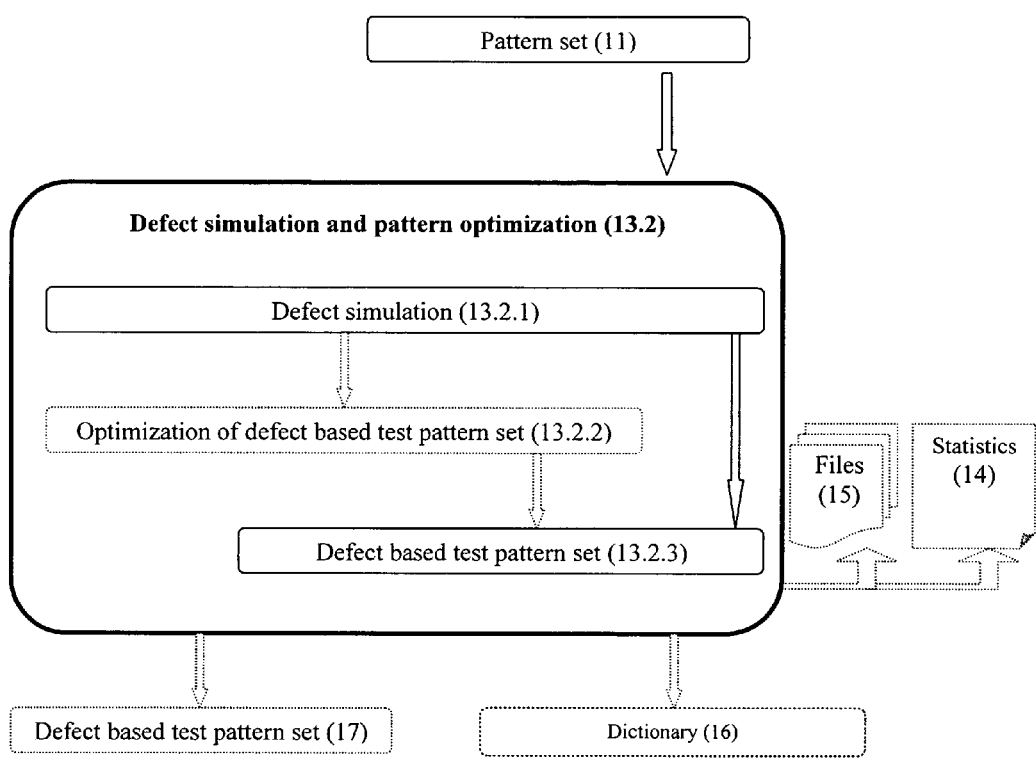
FIG. 11 is a block diagram showing in greater detail an exemplary manner in which component 13.2 of FIG. 9 can be performed.

Referring now to FIG. 11, after the netlist has been modified in (13.1), and the defects mapped into faults, an optional defect simulation procedure (13.2) can be performed if there is a pattern set (11) defined. This defect simulation procedure (13.2.1) determines which of the test patterns of the pattern set (11) (which can be generated using traditional fault models) are actually effective defect test patterns and which defects are detected by these test patterns. Optionally, the initial defect-based test pattern set can be optimized with respect to a different goal the user wants to achieve (13.2.2).

At (13.2.3), a first defect-based test pattern set is generated. Again, different files and statistics can be requested (15), (14), and the initial pattern set (13.2.3) can be saved (17) together with the corresponding dictionary (16).

Figure 12:
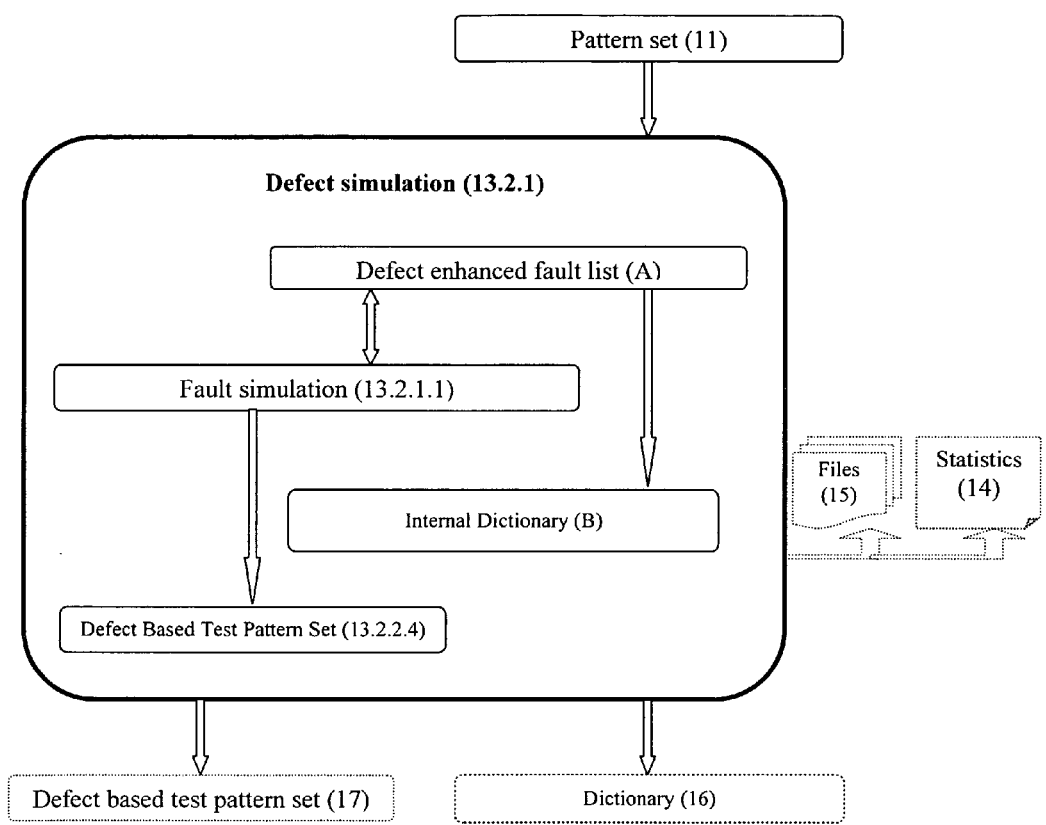
FIG. 12 is a block diagram showing in greater detail an exemplary manner in which component 13.2.1 of FIG. 11 can be performed.

FIG. 12 is a block diagram showing in greater detail an embodiment of the defect simulation procedure ((13.2.1) of(13.2)). For the most part, (13.2.1) looks like a traditional fault simulation: the patterns in (11) are fault simulated using the faults in the defect-enhanced fault list (A). The defect simulation procedure can also add data into an internal version (B) of the external fault dictionary. Similar to the defect enhanced fault list (A), there is usually just one copy of internal dictionary (B) used in the defect-based ATPG and pattern optimization component (13). In contrast to the enhanced fault list (A), whose primary purpose is to record the achievements of the test patterns so far in the form of detected and undetected faults, internal dictionary (B) is mainly used to guide later optimization and pattern-generation procedures to effectively achieve their respective goals. The internal dictionary (B) typically contains more information than is actually stored in the fault dictionary (16) since the various optimization and test-pattern generation procedures that can be applied usually require increased flexibility. For example, if the fault dictionary (16) is a k-detection dictionary (that is, detection information up to k times is recorded for each fault) and the resulting data is stored in (16), the internal dictionary (B) should at least also be a k-detection dictionary. However, the quality of the final result can be increased if internal dictionary (B) is a k'-detection dictionary, with k'>>k, since optimization methods, like the one explained below, then have more options from which to choose a pattern. In addition, with the variation of k and k', the memory demand of the defect-based ATPG and pattern optimization component (13) can be influenced significantly.

Figure 13:
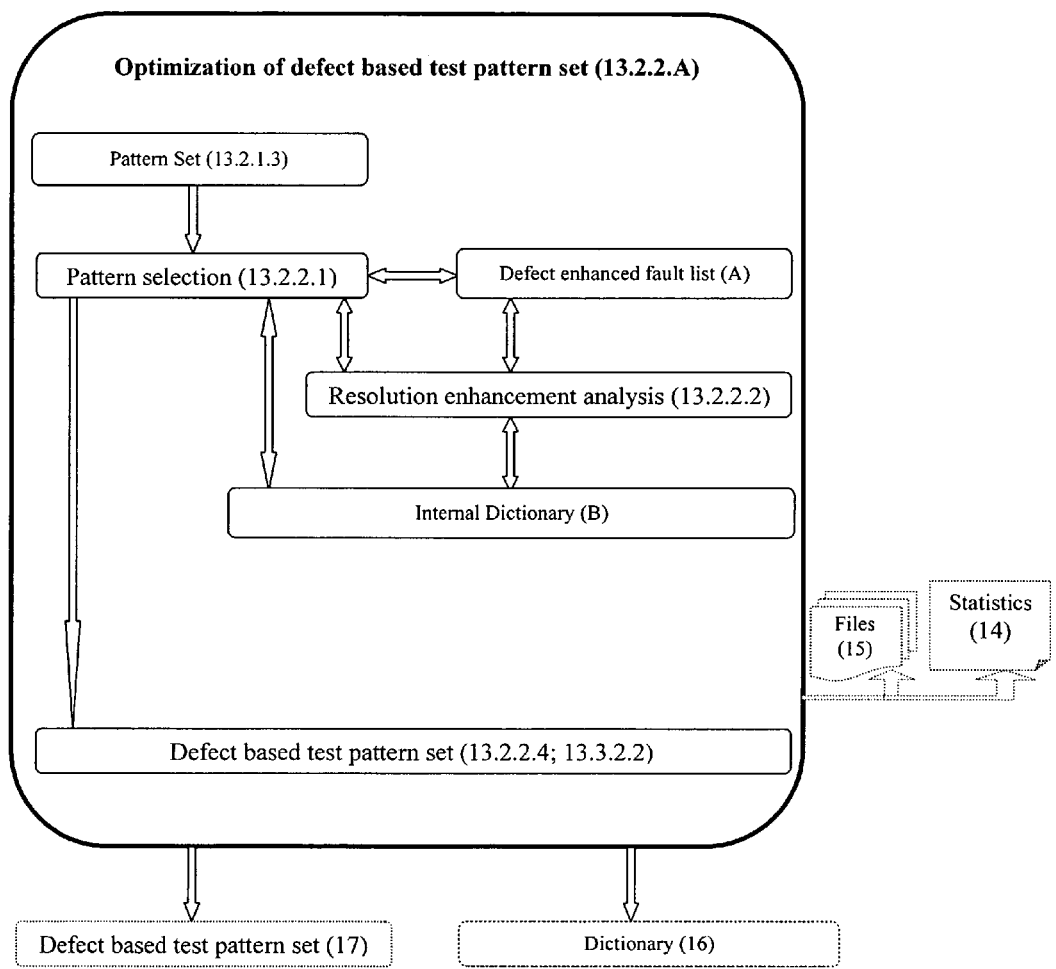
FIG. 13 is a block diagram showing in greater detail a first exemplary manner (13.2.2.A) in which component 13.2.2 of FIG. 11 can be performed.
Figure 14:
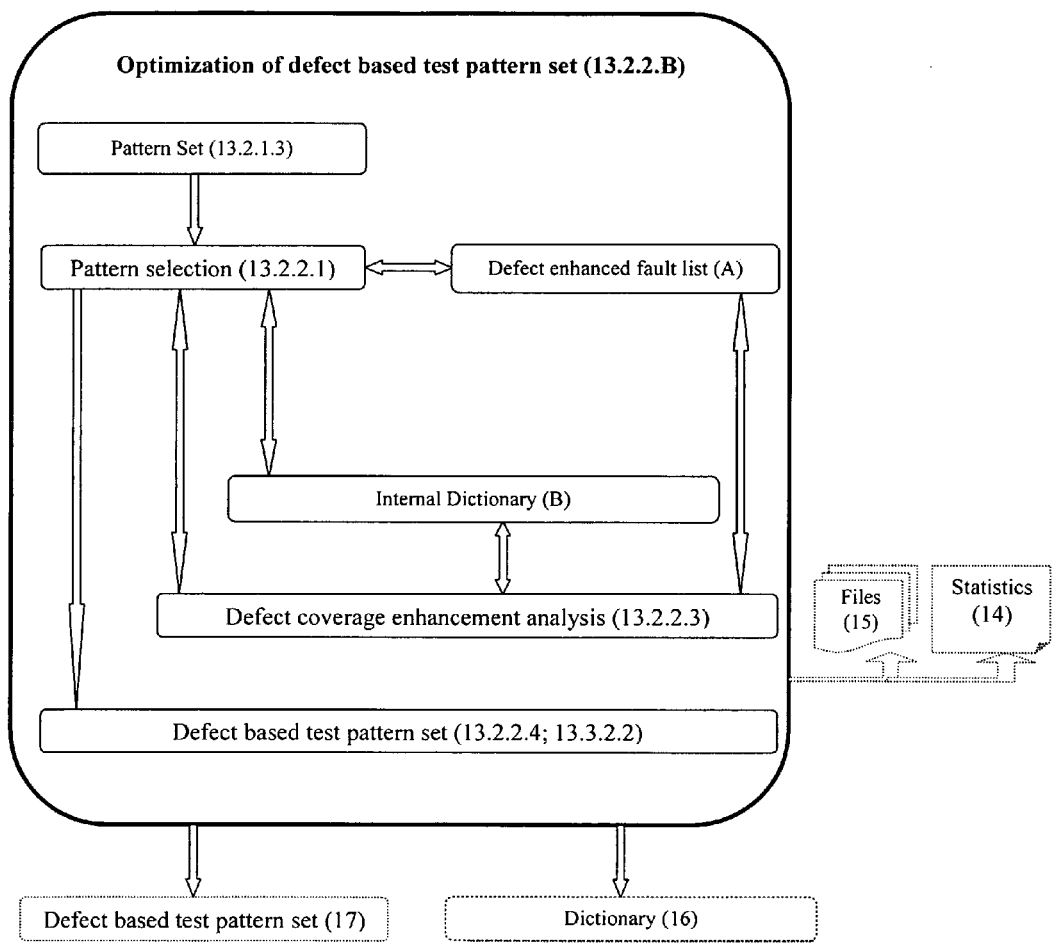
FIG. 14 is a block diagram showing in greater detail a second exemplary manner (13.2.2.B) in which component 13.2.2 of FIG. 11 can be performed.
Figure 15:
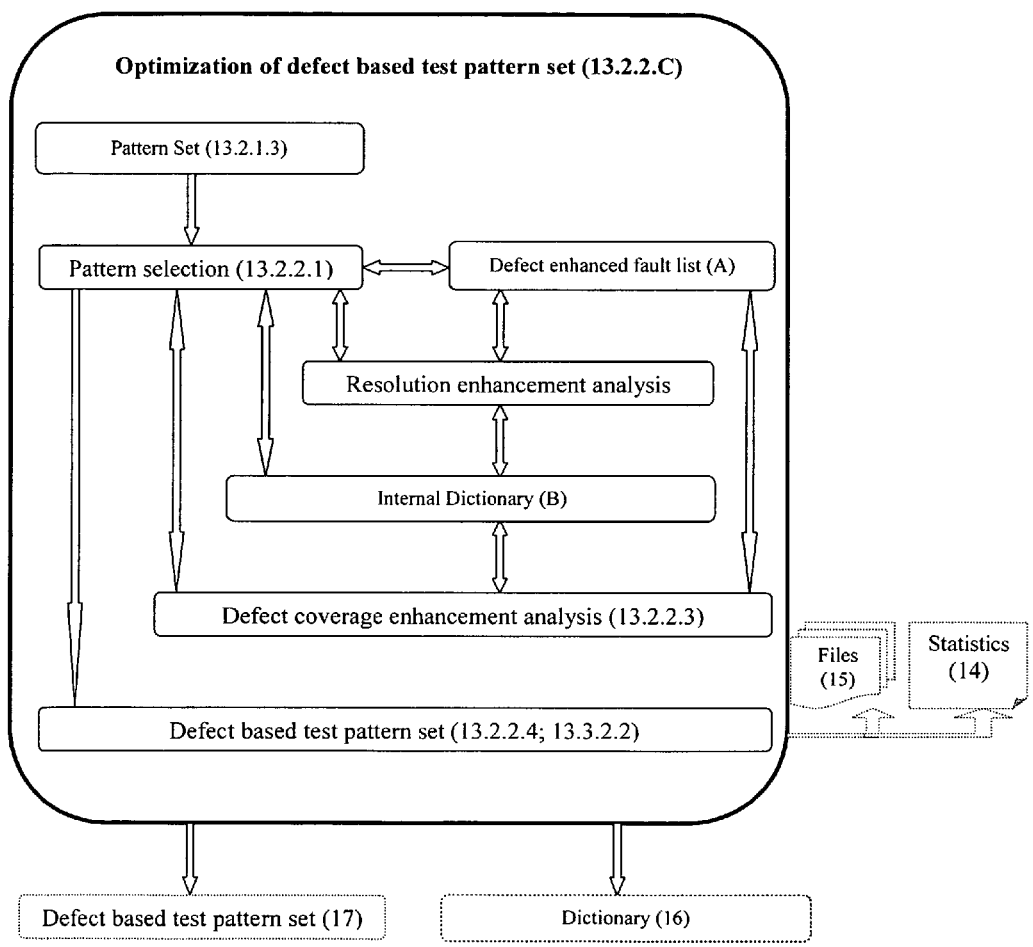
FIG. 15 is a block diagram showing in greater detail a third exemplary manner (13.2.2.C) in which component 13.2.2 of FIG. 11 can be performed.

Among other acts, the defect simulation procedure (13.2.1) generates a defect-based test pattern set (13.2.1.3), which can be used in an optional pattern optimization procedure (13.2.2). FIGS. 13-15 show in greater detail three exemplary manners in which the pattern optimization procedure can be implemented (13.2.2.A, 13.2.2.B, and 13.2.2.C). The three procedures operate similarly, but their respective optimization goal is different. FIG. 13 (13.2.2.A) focuses on enhancing the defect resolution using resolution enhancement analysis (13.2.2.2). FIG. 14 (13.2.2.B) tries to raise the defect coverage as fast as possible using defect coverage enhancement analysis (13.2.2.3). Finally, FIG. 15 (13.2.2.C) is configured to find a compromise between defect resolution and fast coverage increase. Note that in this exemplary embodiment, the pattern optimization procedure (13.2.2) is performed by employing pattern reordering. For example, the pattern reordering is performed in part by pattern selection procedure (13.2.2.1), which interacts with the analysis methods for either or both resolution and coverage enhancement, and with the defect-enhanced fault list (A) and the internal dictionary (B). With the help of the previously computed ranking, the pattern selection procedure (13.2.2.1) can decide which pattern to select next to achieve the different mentioned goals such as resolution enhancement, coverage enhancement, and the combination of these two, and subsequently update the defect-enhanced fault list (A) and the internal dictionary (B), and the resulting pattern set (13.2.2.4). An example of goal-directed pattern selection is given below.

In principle, the selection of the patterns can be considered a coverage problem, with the additional property that the data of the unselected patterns can change after each selection because the selected pattern could represent the k-th detection for a defect d, and thus all subsequent detections of d would not be stored in the dictionary. Therefore, finding an optimal solution is difficult or impossible for any, but the smallest integrated circuits. Usually, a so-called "greedy" approach produces acceptable results for such coverage problems. Therefore, one possible implementation of (13.2.2.1) is the greedy selection of a pattern, which splits the highest-ranking group of undistinguished defect classes.

Consider the following example: for each test pattern p, and each defect d detected by p, a signature sig(p,d) is computed, with the property of sig(p,d1)=sig(p,d2) if and only if the observation points for d1 are also observation points for d2 and vice versa for test pattern p. This means, if d1 and d2 have the same signature, they are not distinguishable by p. Let sig(d) be a signature representing a combination of all sig(p, d) for all test patterns p up to this point. Again, if sig(d1)=sig(d2), then the defects d1 and d2 are not distinguishable, but this time by all test patterns so far. (An exemplary implementation of this signature attached to each defect is a list of elements of the type (pattern number, list of observation point numbers). This implementation should not be construed as limiting, however, because it is mentioned here only to show that such a signature exists.)

According to one exemplary implementation, the two highest-ranking classes of defects C1 and C2 with respect to undetected defects in C1 and C2 are found using the following:

$$\max\left(\sum_{p \in C1} rank(p) + \sum_{q \in C2} rank(q)\right), p \text{ undetected}, \quad q \text{ undetected} \quad (1)$$

for all undetected defects p of C1 and q of C2. The highest ranking undetected defects d1 in C1 and d2 in C2 with sig (d1)=sig(d2) are then found. Note that a defect is called detected in a k-detection scheme only if it has been detected k times or more. If coverage is not a factor in the optimization, the above-mentioned function rank(d) can return the ranking of the defect determined earlier. If coverage is to be taken into account (for example, during test pattern optimization procedure (13.2.2.B) or (13.2.2.C)), then rank(d) can be a weighted sum of the ranking of the defect and expected coverage, (for example, measured in the size of the observation and controlling cones of the defect).

It is also possible to take the current number of detections k'<k as a diminishing factor into account for the ranking of the defects. For example, the smaller k-k' is, the larger the penalty, thereby allowing lower ranking defects that are not detected many times to be considered earlier.

According to this exemplary implementation, the two defects d1 and d2 represent the most profitable target. One can now find the nearest test pattern p in the old sequence of test patterns with sig(p,d1)≠sig(p,d2) and select it as the next test pattern for the reordered sequence of test patterns. Note that for all patterns between the new and the old position of p, the combined signature sig(d) of the detected defects d can change. However, this signature should be updated only for defects that are detected by p. Thus, if the next pattern reordering steps consider only defects that were not detected by p for these patterns, recomputation of the respective signature is usually not necessary. Further, the signature typically does not need to be updated for all patterns after the old position of p, though there can be at least one issue. Namely, due to the limited number of detections k stored in the internal dictionary (B), it is possible that the repositioned pattern p now is the k-th detection, thereby invalidating the test pattern property for d of a later pattern q. However, since it is known when a defect reaches the k-th detection, this special case can be easily taken care of. In general, the described pattern reordering procedure can proceed through the old sequence of patterns, and can resimulate and update the signatures after the end of the old sequence is reached. The pattern selection procedure (13.2.2.1) can be iteratively repeated in order to further improve the defect resolution. Although only two classes are distinguished in the above exemplary procedure, the procedure can be modified to more generally apply to additional classes.

Figure 16:
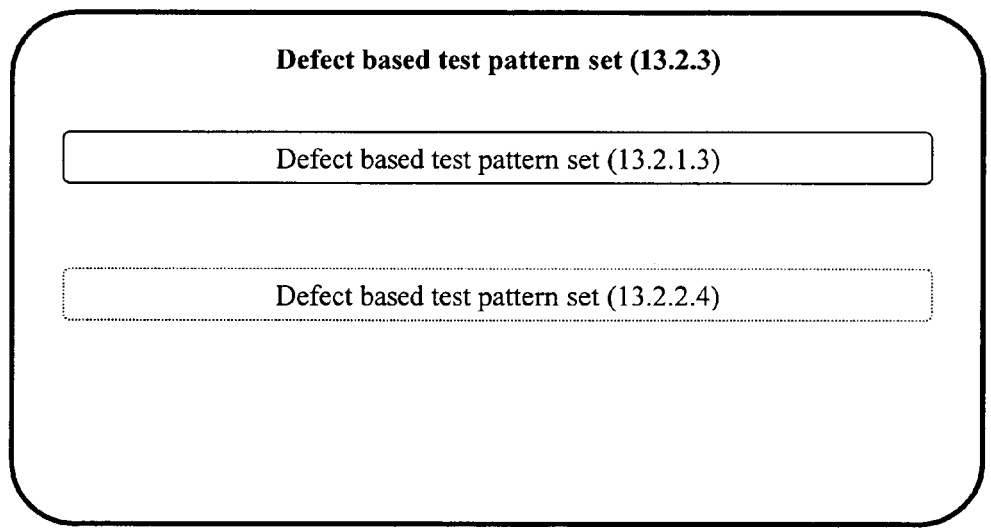
FIG. 16 is a block diagram showing in greater detail an exemplary manner in which component 13.2.3 of FIG. 11 can be performed.

With reference to FIG. 16, the resulting pattern set (13.2.3) from the defect simulation and pattern optimization procedure (13.2) is either the defect-simulated (13.2.1.3) pattern set (11), which has no changed pattern order but no longer has ineffective defect test patterns, or the reordered version (13.2.2.4).

Defect ATPG and Pattern Optimization (13.3)

Figure 17:
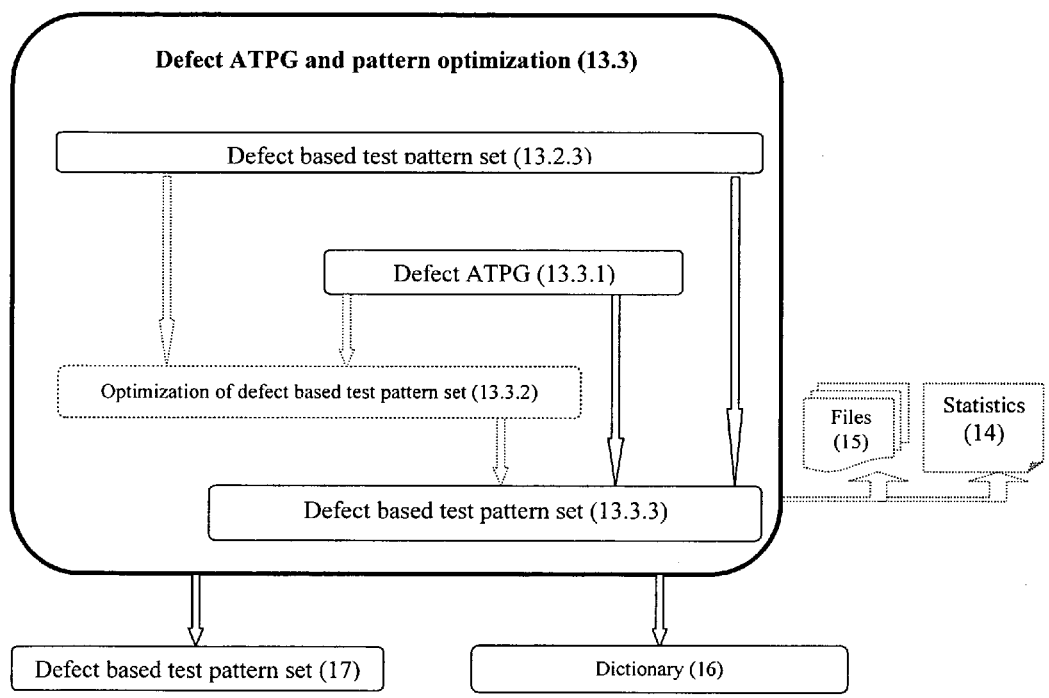
FIG. 17 is a block diagram showing in greater detail an exemplary manner in which component 13.3 of FIG. 9 can be performed.

FIG. 17 is a block diagram showing an exemplary manner of performing the defect-based test pattern generation and optimization procedure (13.3). Within FIG. 17 is the ATPG method (13.3.1), which generates (additional) defect-based test patterns. These patterns, together with the optional patterns of (13.2.3), are then optionally improved using an optimization procedure (13.3.2). The final defect-based test pattern set (13.3.3) can then be computed and stored as the defect based test pattern set (17) together with its corresponding fault dictionary (16). Again, various files (15) and statistics (14) can also be requested.

Figure 18:
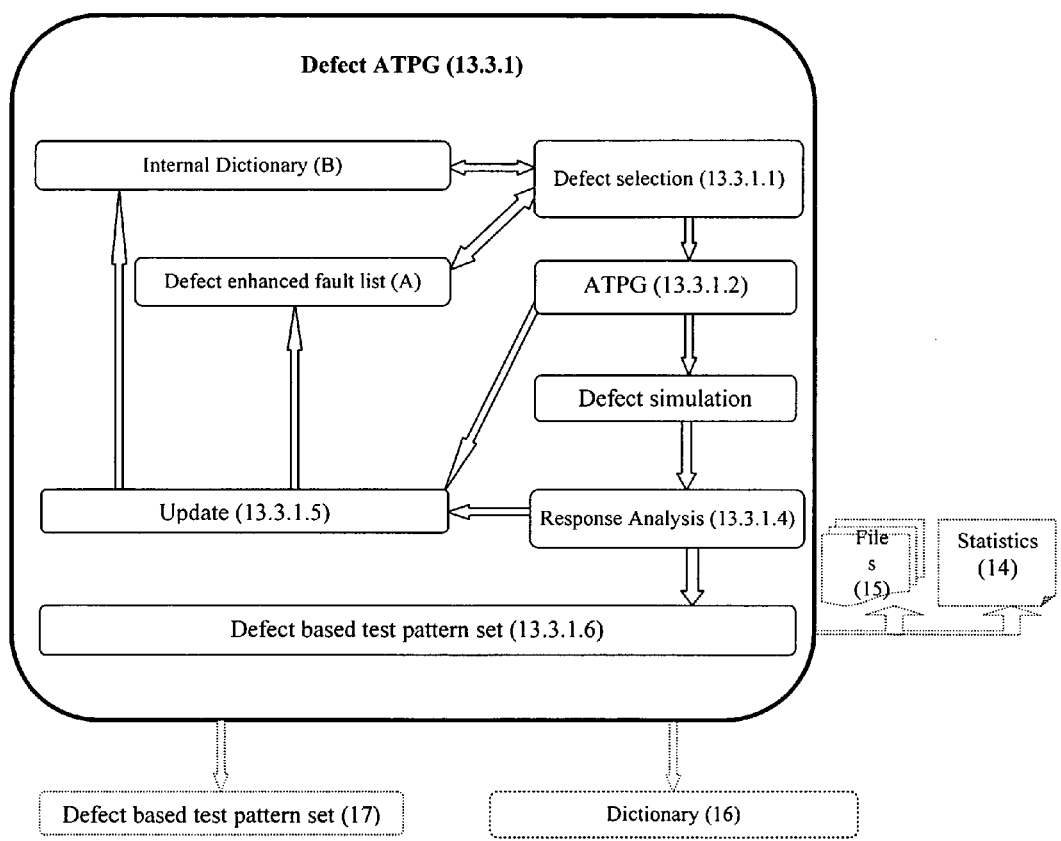
FIG. 18 is a block diagram showing in greater detail an exemplary manner in which component 13.3.1 of FIG. 17 can be performed.

FIG. 18 is a block diagram showing an exemplary manner of performing the defect ATPG (13.3.1) from FIG. 17. The defect selection procedure (13.3.1.1) selects one or more defects for ATPG (13.3.1.2). In addition, the defect selection procedure can select tasks that define for the ATPG what to do with the selected defects and their respective faults. More detail will be presented in the next paragraph, when the method of defect selection is explained. In case the ATPG (13.3.1.2) determines faults to be untestable, it can update the fault list (A) and the dictionary (B), using an updating procedure (13.3.1.5). Otherwise, the ATPG (13.3.1.2) can make the generated test-pattern candidate available for defect simulation (13.3.1.3). The outcome of the simulation can then be analyzed at (13.3.1.4) and, if accepted, the candidate test pattern will be added to the defect-based test pattern set (13.3.1.6). In either case, both (A) and (B) are updated by an update procedure (13.3.1.5).

Figure 19:
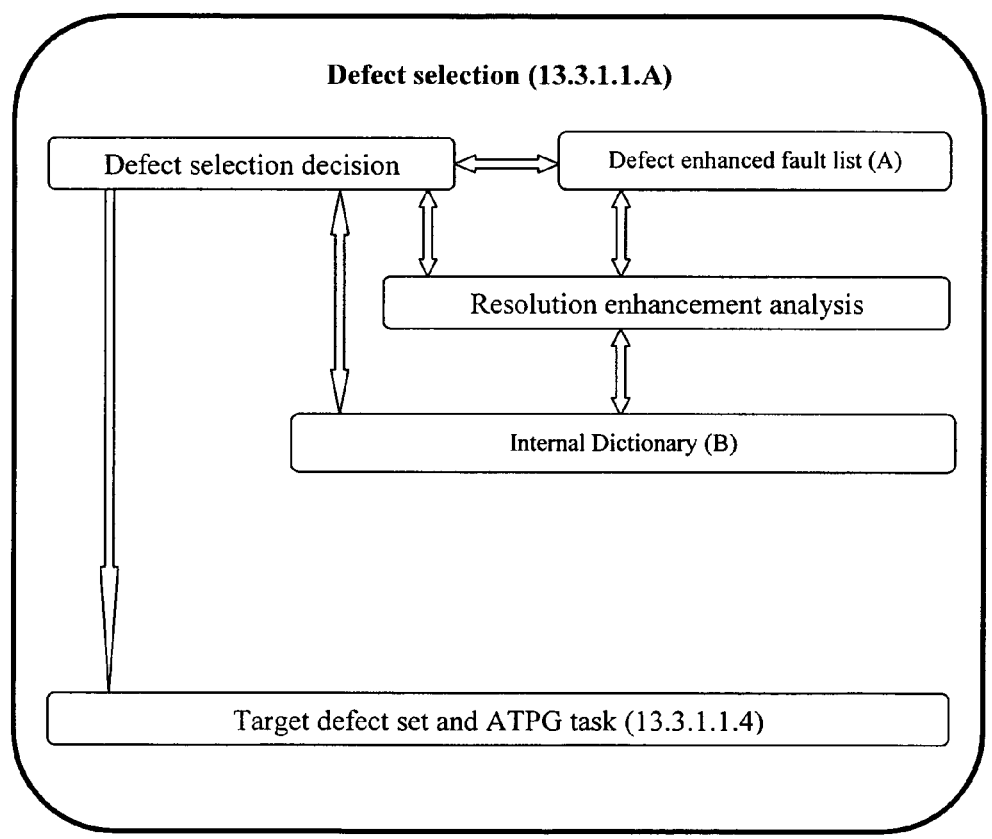
FIG. 19 is a block diagram showing in greater detail a first exemplary manner in which component 13.3.1.1 of FIG. 18 can be performed.
Figure 20:
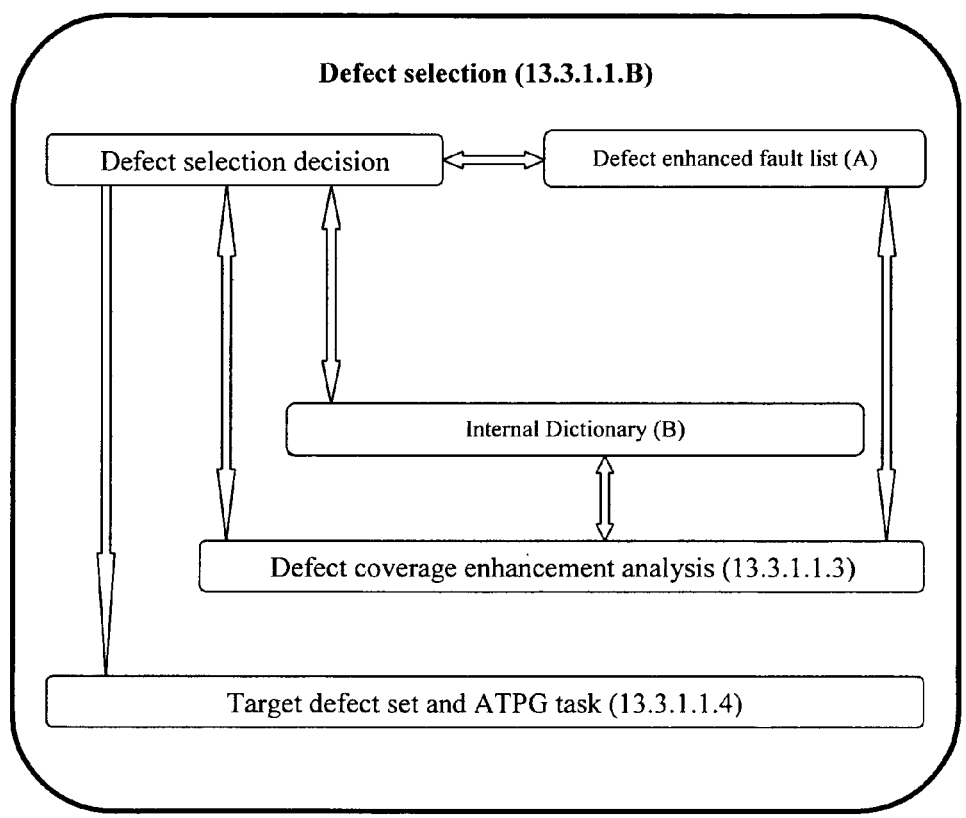
FIG. 20 is a block diagram showing in greater detail a second exemplary manner in which component 13.3.1.1 of FIG. 18 can be performed.
Figure 21:
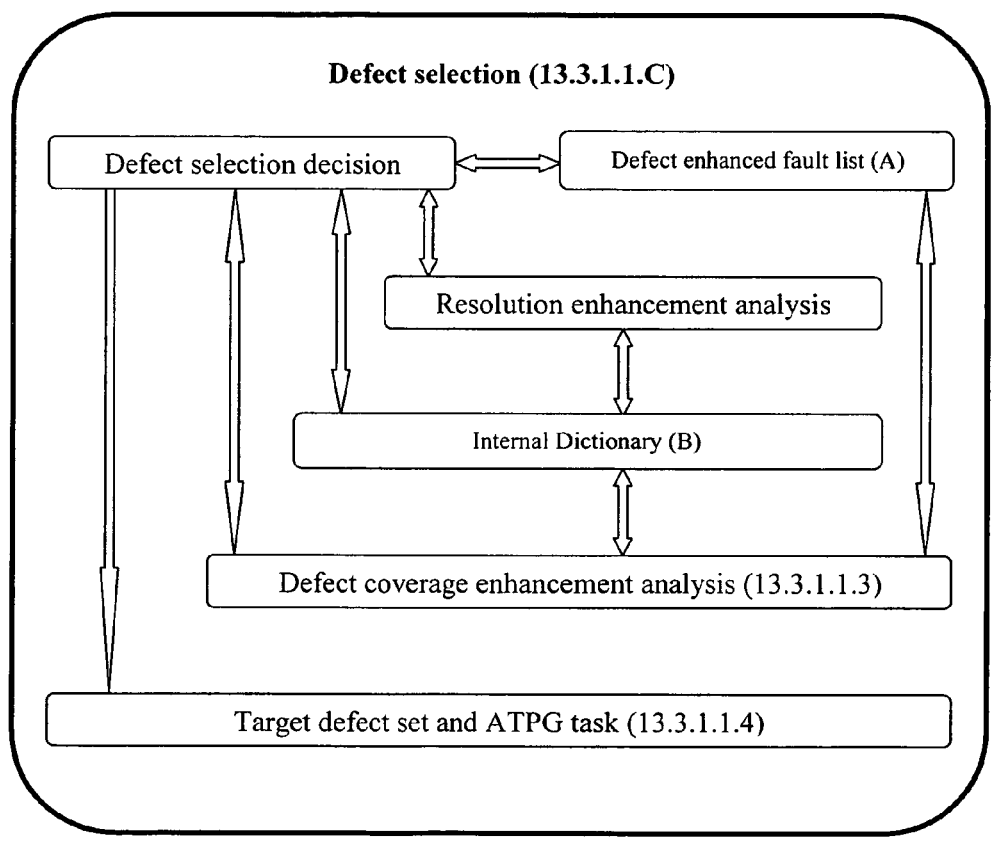
FIG. 21 is a block diagram showing in greater detail a third exemplary manner in which component 13.3.1.1 of FIG. 18 can be performed.

FIGS. 19 through 21 show three exemplary variations (13.3.1.1.A, 13.3.3.1.B, and 13.3.1.1.C) of the defect selection procedure (13.3.1.1). The outline is similar to pattern optimization. For example, in the illustrated embodiments, a set of target defects (13.3.1.1.4) for the ATPG, together with a specific task for the ATPG to accomplish on this set of defects, is selected. This set can contain a set of defects for the ATPG to distinguish in order to enhance defect resolution (FIG. 19, 13.3.1.1.A), to enhance coverage (FIG. 20, 13.3.1.1.B), or a combination thereof (FIG. 21, 13.3.1.1.C). By means of this target defect set (13.3.1.1.4), the defect selection procedure (13.3.1.1) can be used to steer the defect-based ATPG process (13.3) to achieve its goals. The efficiency of the defect-based ATPG and the effectiveness of the test patterns typically depends on this procedure, which is explained next.

One possible implementation for the defect selection method is as follows (which is similar to the pattern selection method explained earlier). Among the undetected faults, two classes C1, C2 are found with the property defined by Equation 1 above. From each of these classes, the highest-ranking defect(s) are selected as the next target defects. This method is extendable to include three or even more classes to distinguish. For distinguishing defects, the ATPG typically has three basic choices: not to control, not to observe, or to observe the effects on different observation points.

Figure 22:
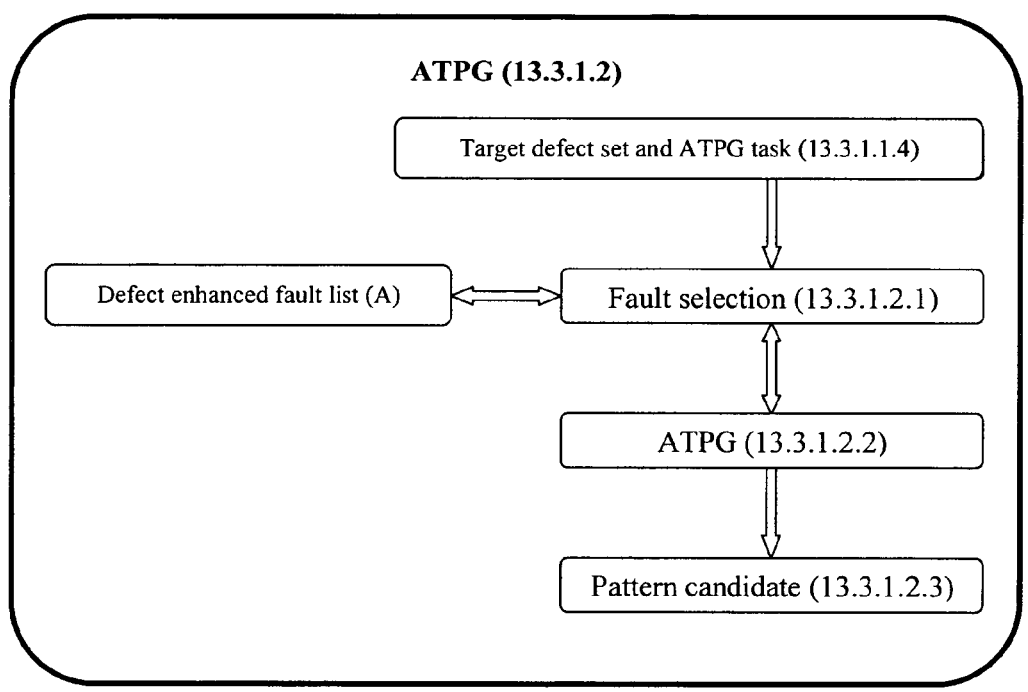
FIG. 22 is a block diagram showing in greater detail an exemplary manner in which component 13.3.1.2 of FIG. 18 can be performed.

As shown in FIG. 22, ATPG (13.3.1.2) uses the target defect set and the ATPG task (13.3.1.1.4). At first, faults can be selected from the defect enhanced fault list (A) that correspond to the selected defects of the target defect set (13.3.1.1.4). If there are multiple choices, the ATPG can influence the success of the pattern generation at this stage by choosing a particular set of faults. For example, assume the task is to distinguish between two bridge defects B1 and B2, connecting signal lines X and Y, and X and Z, respectively. Further, assume the common aggressor-victim mapping of a bridge defect into four stuck-at kinds of faults. Selecting as aggressor of B1 signal line Y being high and for bridge B2 signal line Z being high, both defects would propagate an identical fault effect over signal line X, and are therefore likely indistinguishable. (Signal lines Y and Z can still vary.) A better choice would be for the bridges to choose signal line X as the aggressor. Then, Y and Z do propagate the faulty effect. This means the effect is propagated via a different path.

Figure 23:
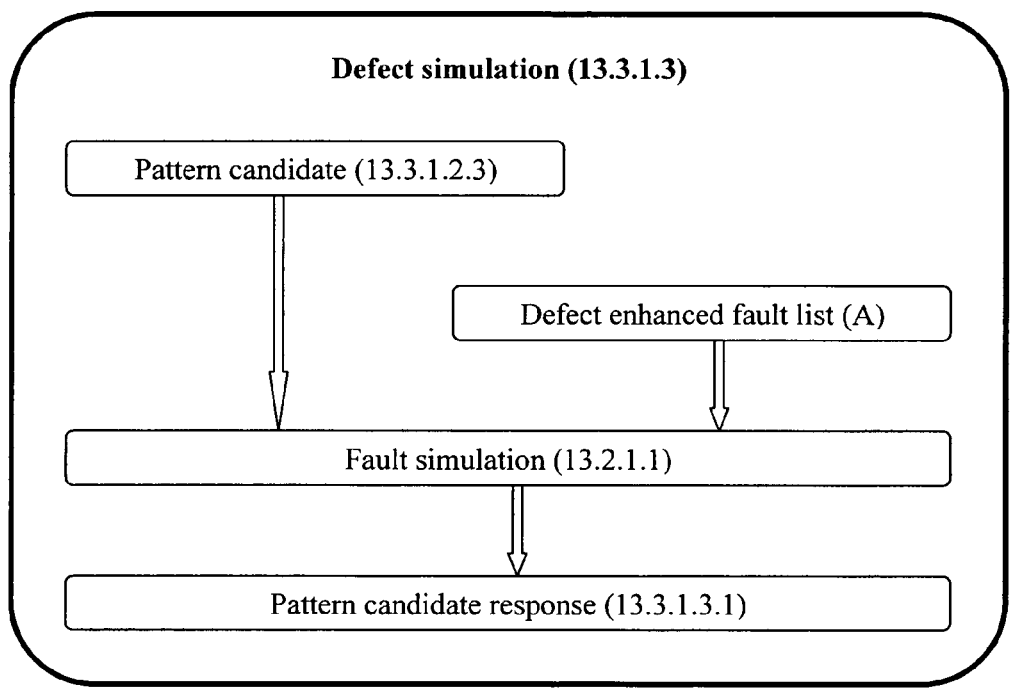
FIG. 23 is a block diagram showing in greater detail an exemplary manner in which component 13.3.1.3 of FIG. 18 can be performed.

For the selected set of target faults, the ATPG (13.3.1.2.2) tries to satisfy the task defined in target defect set and ATPG task (13.3.1.1.4). In case the task requires distinguishing between two or more defects, the ATPG has several options. For example, it can block the fault effect propagation for some of them, allowing only the others to be detected, or it can propagate the fault effect to different observation points. If successful, the ATPG procedure (13.3.1.2.2) computes a test pattern candidate (13.3.1.2. 3), which, as shown in FIG. 23, can be defect simulated (13.3.1.3). Note that this simulation is different from regular fault simulation, since the fault simulator does not need to update the fault list (A) because it does not know yet if the pattern candidate (13.3.1.2.3) will be accepted for addition into the test-pattern set. Therefore, in one implementation, the defect simulation procedure (13.3.1.3) stores the simulated responses (13.3.1.3.1) of the candidate test pattern for later evaluation. This evaluation can be performed, for example, by the response analysis procedure (13.3.1.4) shown in FIG. 24. At this point, it is already known that the pattern generation was at least in part a success.

Figure 24:
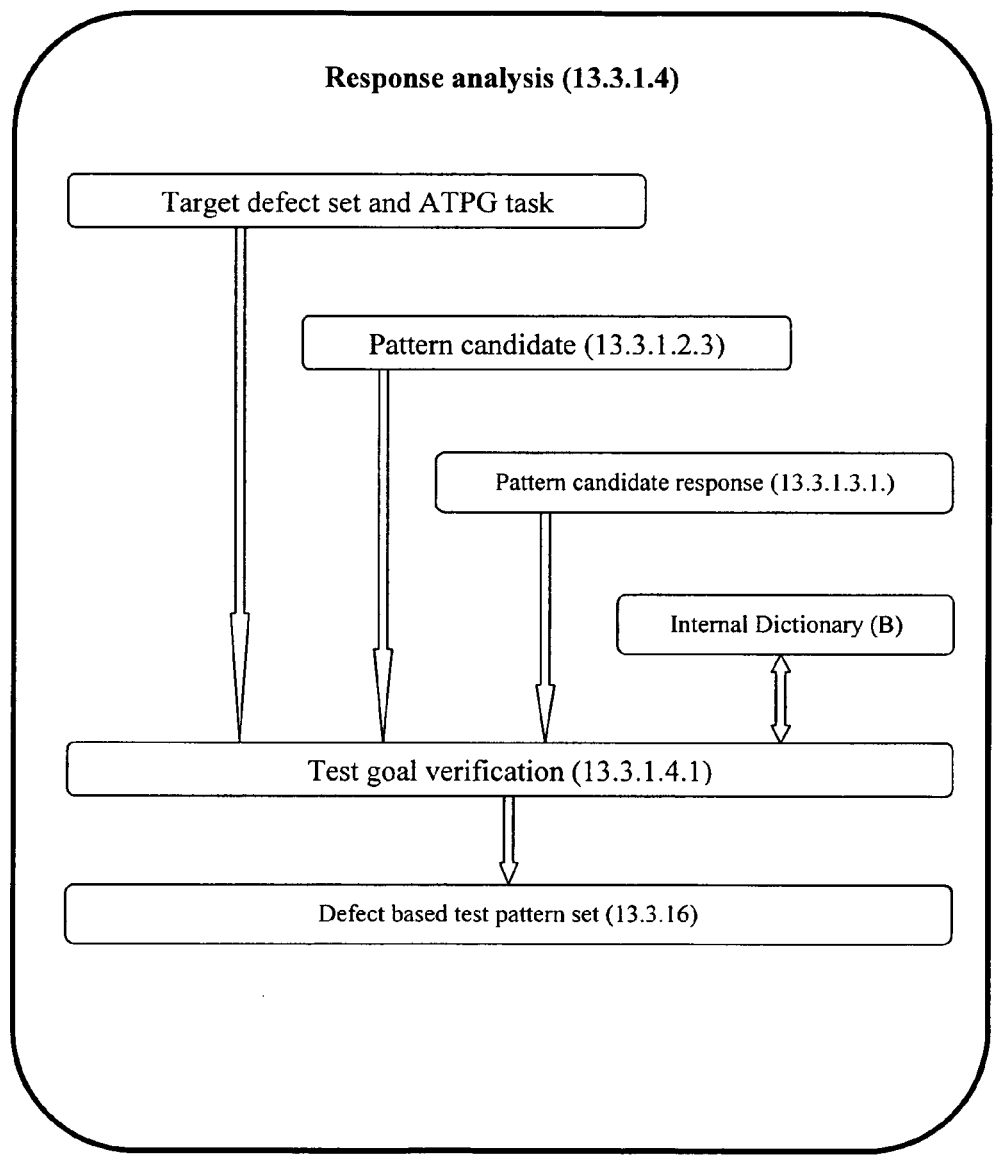
FIG. 24 is a block diagram showing in greater detail an exemplary manner in which component 13.3.1.4 of FIG. 18 can be performed.
Figure 25:
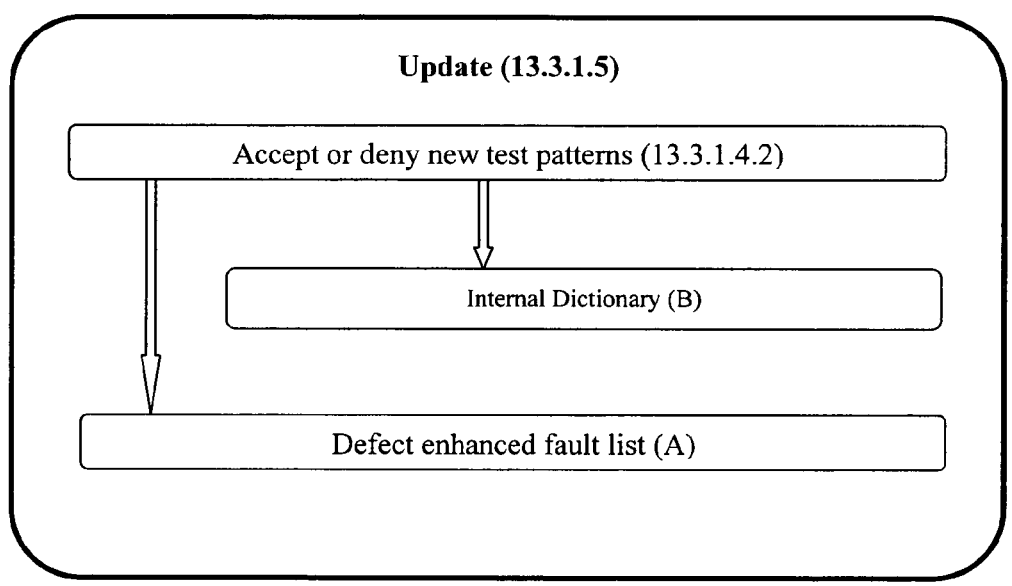
FIG. 25 is a block diagram showing in greater detail an exemplary manner in which component 13.3.1.5 of FIG. 18 can be performed.

Referring now to FIG. 24, the response analysis procedure (13.3.1.4) can investigate the effect the candidate test pattern has on all the other defects. It may determine, for example, that the disadvantages for other defects outweigh the advantages for the target defects, and therefore dismiss the candidate test pattern. The test goal verification procedure (13.3.1.4.1) uses the pattern candidate (13.3.1.2.3), its simulated response (13.3.1.3.1), and the set of target defects and tasks (13.3.1.1.4). The test goal verification procedure (13.3.1.4.1) can further interface with the internal dictionary (B) and the previously computed ranking. Based on this information, the test goal verification procedure (13.3.1.4.1) can determine whether the test pattern candidate can be accepted. If yes, the test pattern candidate can be added to ATPG's defect-based test pattern set (13.3.1.6). However, in either case, the defect-enhanced fault list (A) and the internal dictionary (B) can be updated as shown in FIG. 25 (especially with the information learned in the case the candidate test pattern was invalidated so that the next target defect set selection can be improved).

Figure 26:
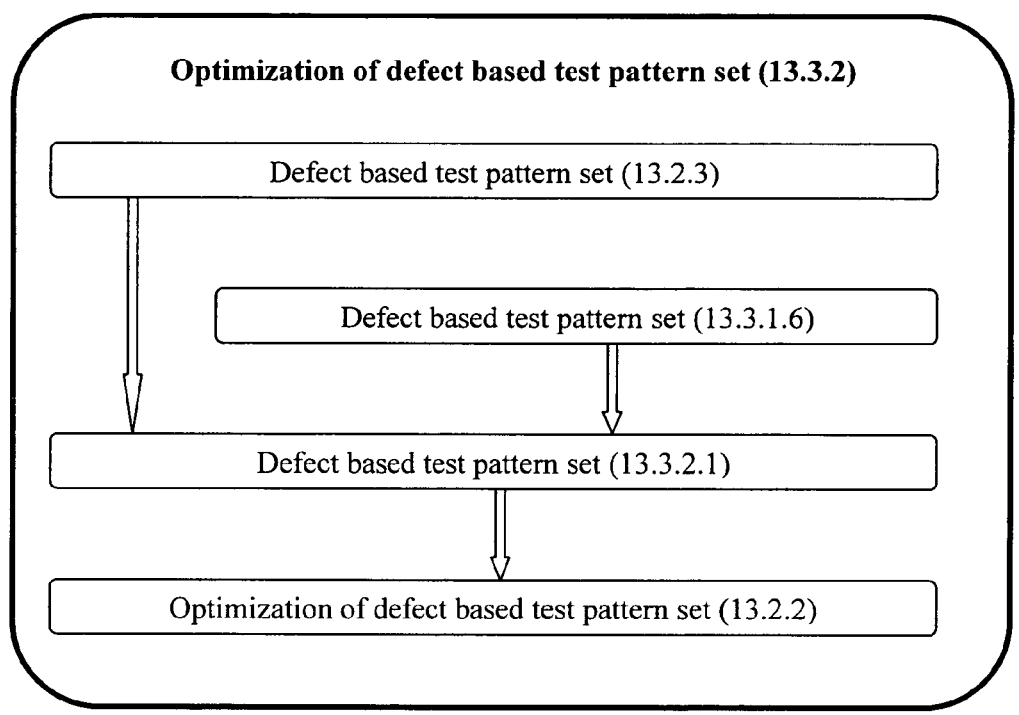
FIG. 26 is a block diagram showing in greater detail an exemplary manner in which component 13.3.2 of FIG. 17 can be performed.
Figure 27:
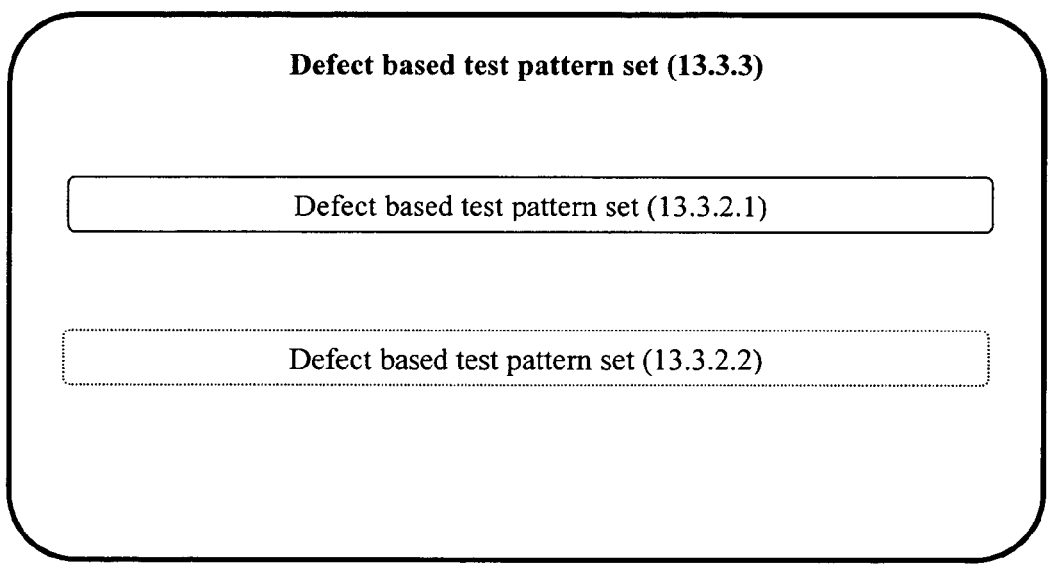
FIG. 27 is a block diagram showing in greater detail an exemplary manner in which component 13.3.3 of FIG. 17 can be performed.

FIG. 26 shows the optional pattern optimization procedure (13.3.2) that can succeed the ATPG. Typically, the optional defect-based test pattern set (13.2.3) and the newly generated defect based test pattern set (13.3.1.6) together form the defect-based test pattern set (13.3.2.1), which can be improved by the optimization of defect-based test patterns procedure (13.2.2) described earlier. Accordingly, in this exemplary embodiment, the final test pattern set (13.3.3) in FIG. 13 is either defect-based test pattern set (13.3.2.1) or the optimized defect-based test pattern set (13.3.2.2).

Test-Result Analysis/Diagnosis

During production testing of the integrated circuit, test patterns are applied to the integrated circuits. After each application, the values at the observation points are compared with the expected values. If there is a mismatch, the circuit fails the test. The test-result data is typically stored in a tester log, which can contain the indices of failing patterns, together with the observation points where the mismatches have occurred (called failing bits). The tester log can be configured to contain a fixed number of failing patterns, or a fixed number of failing bits, or all the failing patterns for each failing device.

FIG. 31 is a block diagram showing an exemplary manner of implementing the test-result analysis component (21), wherein the test results are diagnosed and analyzed to identify one or more defect candidates that potentially caused any observed failures. The exemplary method illustrated in FIG. 31 uses the production test result data (20) and the fault dictionary (16). The method identifies the defects that could possibly cause the failure and, in the exemplary embodiment, generates a ranked list of defect candidates (sometimes referred to as the list of suspect features). Since each defect has an ID indicating which class it belongs to, in the event that all candidates fall into the same class, the defect identification procedure can stop and proceed to analyze the fail data associated with the next integrated circuits. In this way, a corresponding pareto chart can be updated without precision loss. Otherwise, techniques including incremental simulation and diagnosis can be employed to differentiate the matching candidates. If the candidates are still indistinguishable, probabilistic measures can be assigned to the classes to which the defects belong.

Defect Identification (21.1)

To identify defects, embodiments of the defect identification procedure (21.1) can retrieve from the fault dictionary (16) the faults associated with the failing bits of the observed failing patterns. The faults can be matched with one or more defect candidates. Embodiments of the defect identification procedure (21.1) can analyze the defects thus retrieved and generate a ranked list of matching defect candidates. Two nonlimiting exemplary techniques for defect identification using a fault dictionary are presented below.

First Exemplary Technique for Defect Identification

The first exemplary technique operates using two processes: (1) identifying and ranking the defect candidates by analyzing the failing bits of individual failing pattern; and (2) out of the defect candidates identified and ranked, identifying and ranking those defect candidates that match the behaviors demonstrated by the analyzed failing patterns. These two exemplary processes are discussed in detail below.

1. Identify and Rank the Defect Candidates by Analyzing the Failing Bits of Individual Failing Pattern 1.a. Fault/Defect Classification As described previously, the fault dictionary for purposes of this discussion records only a limited number of failing responses for each fault. Let this number be N. Therefore, when analyzing the fail data associated with each failing device, the exemplary method retrieves the entries associated with failing bits of the first N failing patterns.

Assume for these failing patterns $V_i$, $i=(1,2,\ldots,N)$ that the number of failing bits is $M_i$ and that for each of $M_i$ bits, the associated set of faults is $F_{ij}$ ($i=1,2,\ldots,M_i$). Some faults can occur in multiple sets. A measure $f_{occ}$ can be assigned to each fault f to record the number of times f occurs in these $M_i$ sets. Here, $\min\{f_{occ}\}=1$, $\max\{f_{occ}\}=M_i$. In certain embodiments, the number of observation points the fault f propagated to when simulating pattern $V_i$ can be recorded as $f_{osim}$ in the fault dictionary. Based on the values of $f_{occ}$, $f_{osim}$ and $M_i$, the fault set $F_i=F_{i1} \cup F_{i2} \cup \ldots \cup F_{i,Mi}$ can be classified into four types in this exemplary embodiment:

Type I: $F_I=\{f:f_{occ}=f_{osim}=M_i\}$, which implies that the predicted faulty behavior perfectly matches the observed behavior;

Type II: $F_{II}=\{f:f_{occ}=f_{osim}<M_i\}$, which implies that the output errors predicted by the fault is the subset of observed output errors;

Type III: $F_{III}=\{f:f_{occ}=M_i<f_{osim}\}$, which implies that the output errors predicted by the fault is the superset of observed output errors; and Type IV: $F_{IV}=\{f:f_{occ}<M_i \text{ and } f_{occ}<f_{osim}\}$, which implies that the output errors predicted by the fault partly overlap with observed output errors.

Figure 33:
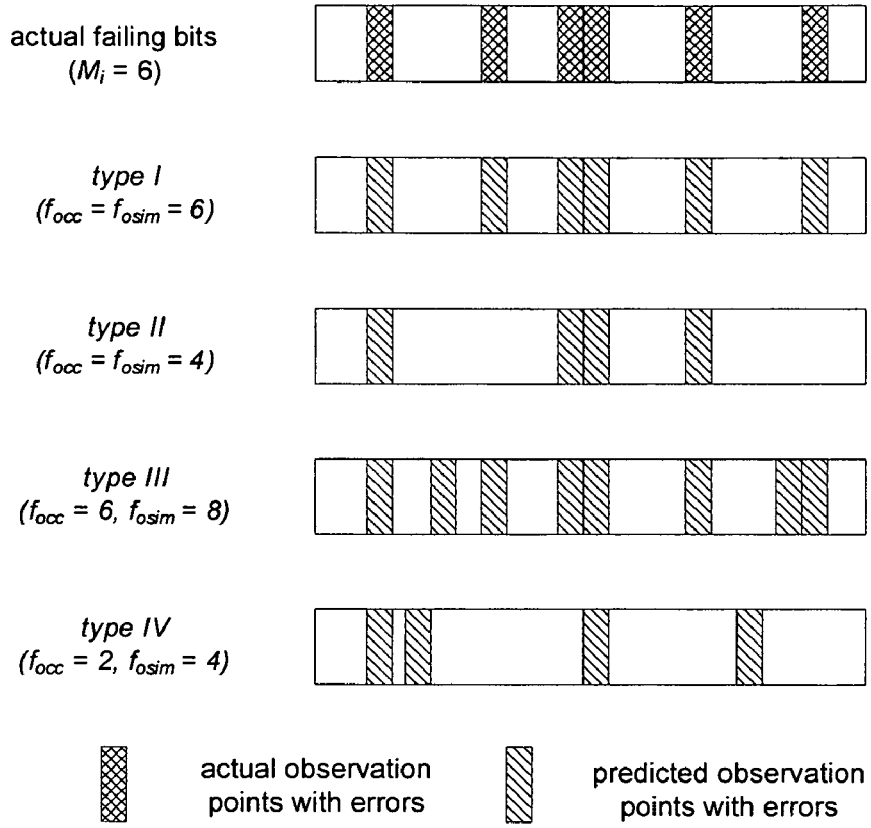
FIG. 33 is a block diagram showing four examples in which the predicted faulty behaviors and the observed behavior have different relations.

FIG. 33 illustrates four cases in which the predicted faulty behaviors and the observed behavior have different relations. It can be shown that $Fi=F_I+F_{II}+F_{III}+F_{IV}$.

The measures and classifications introduced above for faults can be converted to the ones used for defects (e.g., using analogous numbers and sets $d_{occ}$, $d_{osim}$ and $D_l$ ($l=I, II, \ldots, IV$)). In general, there exist direct mapping relations from faults to defects, and each fault in the fault dictionary will typically have an ID indicating which defect it represents. A defect could be modeled as a single fault or multiple faults. In both cases, $d_{occ}$, $d_{osim}$ and $D_l$($l=I, II, \ldots, IV$) can be directly derived from $f_{occ}$, $f_{osim}$ and $F_l$ ($l=I, II, \ldots, IV$).

1.b. Individual Pattern Match

Type I defects should typically rank highest since they match the observed behavior. Let the priority parameter assigned to type I defects be $\lambda_1$ ($0<\lambda_1 \leq 1$). Typically, $\lambda_1$ is set to 1.

Two or more type II defects, however, might explain the observed behavior. If a combined set of type II defects results in the same behavior as observed, they should also rank high in the candidate list. Let the priority parameter assigned to these type II defects be $\lambda_2$. Typically, $\lambda_2=\lambda_1$. The exemplary method identifies the type II defect candidates by way of solving a set cover problem, which can be formulated as follows:

Assuming the type II set consists of S defects, one variable $x_j$ ($x_j \in \{0,1\}$) can be created for each defect. According to one implementation, this variable will be 1 if the corresponding defect is selected as a candidate, and will be 0 otherwise.

$\{x_j\}$ can be found such that $$2 \leq \sum_{j=1}^{S} x_j \leq \eta_1,$$

subject to $$\sum_{j=1}^{S} A_{l,j} x_j \geq 1, (l=1, 2, \cdots, M_i),$$

Figure 34:
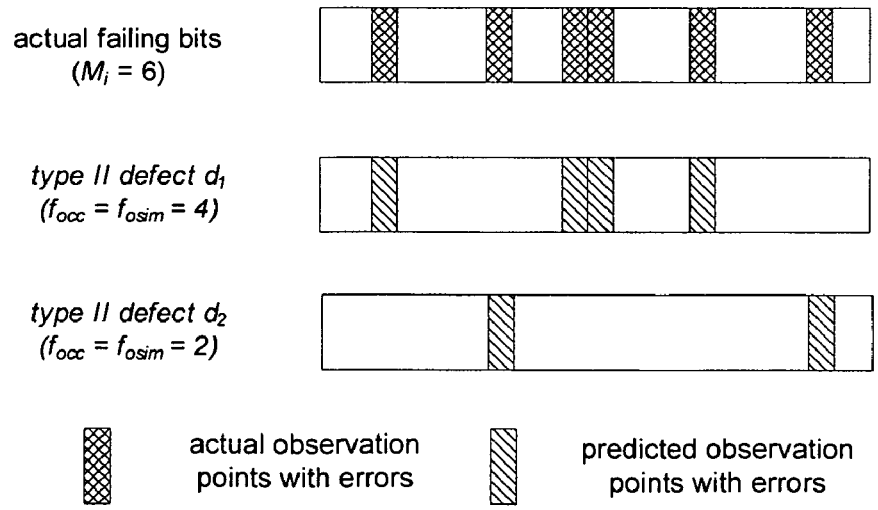
FIG. 34 is a block diagram illustrating an actual-failing-bits positioning caused by two defects.

$A_{lj} \in \{0,1\}$, where A is a $M_i \times S$ matrix. $A_{lj}$ will be 1 if defect j explains the error on the l-th output, and $A_{lj}$ will be 0 otherwise. The threshold $\eta_1$ is set to limit the number of multiple defects candidates. For example, it could be viewed as unlikely that four or more defects exist and manifest themselves on the outputs simultaneously under a particular pattern, so the threshold $\eta_1$ can be set to three in some implementations. FIG. 34 shows an example where the observed failing bits are the combination of the ones resulted by two different type II defects.

Type III defects represent those for which the behaviors are not fully captured by the fault model. For example, the Byzantine Generals Problem for bridging faults can cause errors to occur downstream from subsets of fanouts of a bridged node. However, a typical 4-way bridging fault model used during simulation assumes that all fanouts of a bridged node (victim) take faulty values. Consequently, the errors introduced by the 4-way bridging fault can be propagated to more circuit outputs than would be affected by the actual bridge defect. It should be clear that the unmodeled behavior can also affect diagnosis in other ways. For example, the unmodeled behavior can cause the errors introduced by the fault model to appear on fewer circuit outputs than would be affected by the actual defect, or the error introduced by the fault model can be detected by a test pattern that would never activate the defect. In general, type III defects can only cover a subset of unmodeled defects. Type III defects are possible candidates and the priority parameter assigned to them can be $\lambda_3$ ($0 < \lambda_3 \leq \lambda_2$). Type IV defects are not considered as candidates in this exemplary diagnostic method.

As a result of this first process of the defect identification procedure, a list of defect candidates and their associated quantitative measure of match goodness is generated for the first N failing patterns. The list for the failing pattern $V_i$ ($i = 1, 2, \ldots, N$) can have the following exemplary format:

$$D_{cand}(V_i) = \{\{d_1, \lambda_1\}, \{d_2, \lambda_1\}, \{(d_3, d_4), \lambda_2\}, \{d_5 \lambda_3\}, \ldots\}. \quad (2)$$

2. Out of the Defect Candidates Produced by Process (1), Identify and Rank Those that Match the Behaviors Demonstrated by All Analyzed Failing Patterns.

In the simplest case, simulation results of a single defect match the observed behavior over the first N failing patterns. It is ordinarily trivial to identify those kinds of defects by simply picking up the common elements of $D_{cand}(V_i)$. However, this approach can fail if the circuit-under-test comprises multiple defects and each of the defects manifests itself under different test patterns. It is also possible that the fault model is not accurate enough, and that the errors predicted by the fault model do not match the observed behavior, thus resulting in a few unexplained test patterns.

The defects identification problem in process (2) can be formulated into the following set cover problem:

Given the first N failing patterns $V_i$ and the associated sets $D_{cand}(V_i)$, the set $D_{cand}(N)$ can be defined as $$\bigcup_i D_{cand}(V_i) = \{\{d_1, \lambda_1\}, \{d_2, \lambda_1\}, \{(d_3, d_4), \lambda_2\}, \cdots \}.$$

A variable $y_m$ ($y_m \in \{0, 1\}$) can be created for each element of the set $D_{cand}(N)$. In one implementation, this variable will be 1 if the corresponding defect(s) is selected as a candidate, and will be 0 otherwise. Another variable $k_m$ is created to indicate the size of each element in set $D_{cand}(N)$. For example, the variable $k_m$ associated with the element $\{(d_3, d_4), \lambda_2\}$ is 2.

$\{y_m\}$ can be found, such that $1 \leq$ $$1 \leq \sum_m k_m y_m \leq \eta_2,$$

subject to $$\sum_m B_{i,m} y_m \leq 1$$

for ($i=1,2, \ldots, N$), $B_{i,m} \in \{0, 1\}$, where $B_{i,m}$ will be 1 if the tuple $\{d_j, \lambda_j\}$ corresponding to $y_m$ is contained in $D_{cand}(V_i)$ (i.e., $\{d_j, \lambda_j\} \in D_{cand}(V_i)$); $B_{i,m}$ will be 0 otherwise. The threshold $\eta_2$ can be set to limit the size of candidate space. For example, $\eta_2$ can be set to three in one implementation, considering that the number of defects present in a circuit is unlikely to be more than three.

Figure 35:
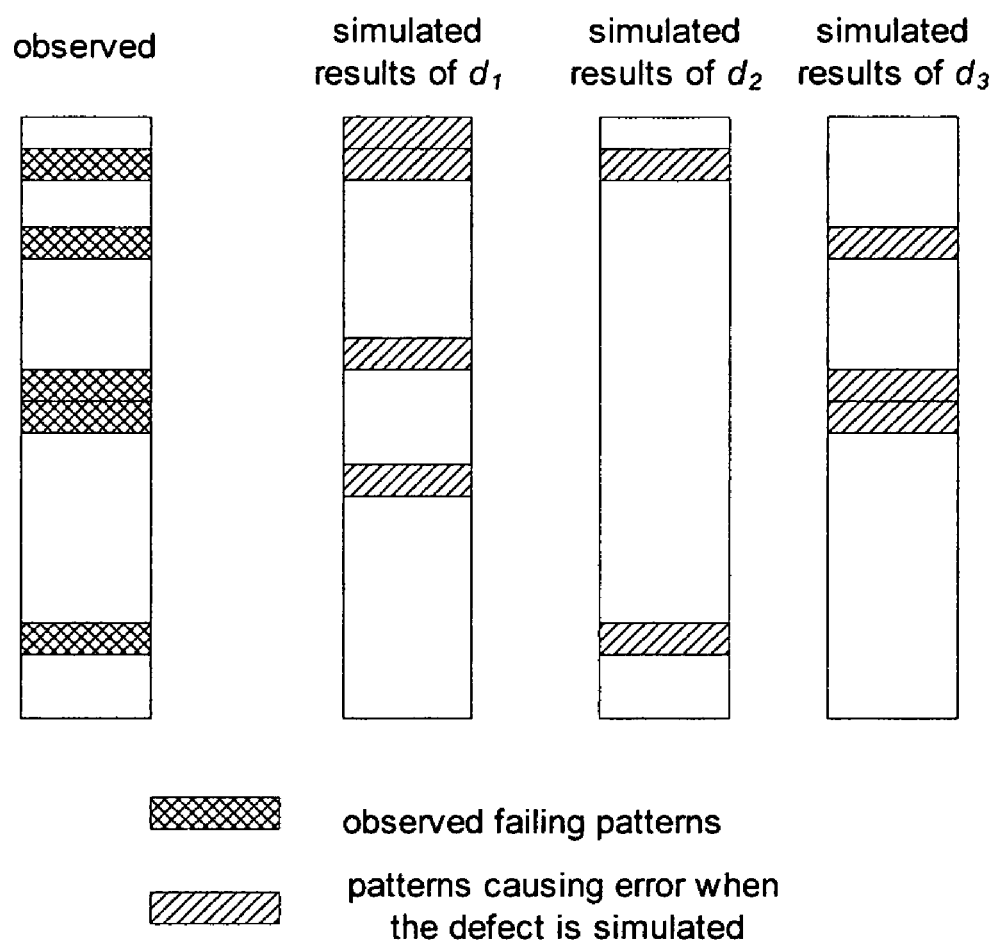
FIG. 35 is a block diagram illustrating the observed failing patterns caused by two defects.

FIG. 35 is an example showing that the observed failing behaviors can be explained by the combined simulation results of multiple defects $d_2$ and $d_3$. The set of solutions to this set cover problem represents those single defect or multiple defects that completely or partially match the observed failing behavior. The defect candidates can be ordered according to their relative match goodness. The criteria for judging the matches can be based on two observations: (1) for an individual match for a particular failing pattern, the best candidates are the ones that match observed output errors, followed by the ones that contain the largest amount of the output errors. This is reflected by the parameters $\lambda_1$, $\lambda_2$, and $\lambda_3$, which were defined in the identification process discussed in the previous section; and (2) correct candidates usually explain more numbers of failing patterns. To account for this, the parameter $\beta_i$ ($0 < \beta_i < 0.5$) can be defined for each $V_i$ ($i=1, 2, \ldots, N$). $\lambda$ and $\beta$ can be combined to compute the quantitative measure of match goodness for each defect candidate. The following pseudo-code shows one exemplary manner in which the match measure $\gamma$ can be computed for defect candidate $d_j$:

| | |
|---|---|
| 1. | $\gamma \leftarrow 1$; |
| 2. | loop i =1,2,..., N |
| 3. | if $\{d_j, \lambda_j\} \in D_{cand}(V_i)$ then $\gamma \leftarrow \gamma \times \lambda_j$, else $\gamma \leftarrow \gamma \times \beta_i$; |
| 4. | end loop |

One can see from the pseudo-code above that the larger $\gamma$ is, the better the candidate matches the observed behaviors.

This exemplary identification procedure analyzes the first N failing patterns because the fault dictionary stores up to N failing responses for each fault. If information is available to help analyze the rest of the failing patterns, higher diagnostic resolution can be achieved. For example, the fail log for a defective circuit contains $N_0$ ($N_0 > N$) failing patterns. Defect a and b share the same fault signature over the first N failing patterns, hence they are indistinguishable and said to be in an equivalent class. However, if it is known that a results in $N_0$ fails when the test set was simulated, and b only causes N fails, defect a can be identified as the more likely candidate.

After the identification procedure, the defect candidate list and the associated match goodness measures can be calibrated by the information mentioned above. A table can be created while simulating the test set to record for each defect the number of times it was detected by the given test set. For example, suppose the fail log contains $N_0$ ($N_0 > N$) failing patterns for a defective circuit. If, as shown in the table, a defect candidate $d_j$ fails $n_{dj}$ times, and $n_{dj} < N_0 - N_{th}$ ($N_{th}$ is a predetermined threshold and $N_{th} > 0$), the associated match quality measure can be adjusted, for instance $\gamma \leftarrow \gamma \times \delta$ ($0 < \delta < 1$). As a result, the exemplary diagnostic method can keep in the final list Q highest ranked candidates for which $\gamma > \gamma_{th}$ and where Q is a predetermined limit. If these Q candidates comprise candidates that are not from the same class, techniques such as incremental simulation and incremental diagnosis can be employed to differentiate the candidates. Alternatively, the exemplary procedure can assign likelihood credits to the involved classes based on the match goodness measure of the defect candidates and other probabilistic measures associated with the defects. Depending on the configuration of the diagnostic system, the incremental simulation and incremental diagnosis can be invoked whenever the two-step procedure fails to identify which defect class explains the observed behavior, or when deemed necessary by the diagnostic system after a certain number of defective integrated circuits occurred without successfully identifying the defect class.

Second Exemplary Technique for Defect Identification

This section discusses the second exemplary technique for defect identification, which proceeds with a discussion of how the fault dictionary can be created, followed by a discussion of how information can be retrieved from the dictionary.

1. Creating the Fault Dictionary

Conventional fault dictionaries (or thesauruses) are typically too large to be loaded in a physical memory for modern multi-million designs, or are too inefficient to access due to the encoding techniques adopted. In this section, embodiments of a compressed dictionary scheme are described that enable the storage of a large amount of fault detecting information and allow for efficient access of the stored fault detecting information during test-result processing. Using embodiments of the disclosed scheme, a large volume of production test results can be quickly processed and the defectivity mechanism information derived.

Figure 46:
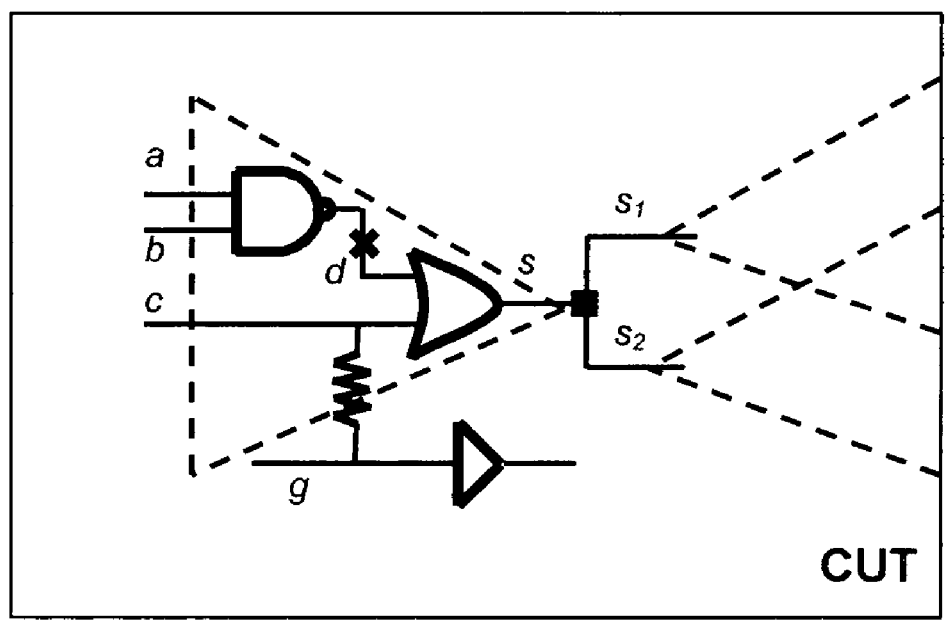
FIG. 46 is a block diagram illustrating an exemplary fanout-free region wherein a stem signal line is located.

For illustrative purposes, this discussion makes reference to FIG. 46, which shows an exemplary fanout-free region embedded in a circuit. The exemplary region comprises one NAND gate and one OR gate. Signal s is termed the "stem" of this fanout-free region, and signal lines a, b, c, and d are internal signals. For illustrative purposes only, assume that only combinational test pattern sets are used to test this circuit. This assumption should not be construed as limiting, however, as the described methodology can be readily adapted by one of skill in the art for use with other types of test patterns.

A single fault can typically be detected by many different test patterns. Further, the observation point combinations for a specific fault produced by different detecting test patterns are often highly similar due to structural constraints of the circuit logic. For example, the number of unique observation point combinations for a given fault is typically small, and the total number of detecting test patterns for a fault could be much higher because many faults are random-testable. Therefore, according to one embodiment, the size of the fault dictionary can be reduced by assigning one unique ID for each unique observation point combination. When the detecting test responses for a fault are stored, instead of listing all observation points for every detecting test pattern, the unique ID for the corresponding observation point combination is used to reduce the memory usage. This technique can be especially effective for frequently used observation point combinations having many observation points because the memory cost for an observation point combination is gradually reduced over many detecting test patterns and many faults.

For example, if fault a stuck-at-1 is detected by a test pattern p at some observation points, then fault s stuck-at-0 is also detected at the same list of observation points. This is also true of internal fault c stuck-at-1 and stem fault s stuck-at-1. Based on this observation, the size of the fault dictionary can be further reduced by only storing the full detecting test responses for stem fault s stuck-at-0 and stem fault s stuck-at-1. For the other one or more faults associated with the internal signals of this fanout-free region, only the detecting test patterns need to be stored, and the observation point information can be recovered from either fault s stuck-at-0 or fault s stuck-at-1. Further, in one exemplary implementation, at least some of the detecting test patterns for stem faults are put into a list, and a bit mask is used for every non-stem fault to store the detecting pattern information.

This technique can also be applied to the extracted defects (for example, opens and bridges). For instance, assume that there is an open defect on signal line d in FIG. 46. For illustrative purposes, assume that this open defect is a complete open. The voltage of the input pin of OR gate connected with d thus becomes floating and can be determined by many factors, such as residual charges, capacitive coupling with physical neighbors, and the voltage of physical neighbors. Typically, the open defect is modeled as a stuck-at-X fault, which means that it can manifest itself as fault d stuck-at-0 under certain test patterns and as fault d stuck-at-1 under others. Because the detecting test responses of fault d stuck-at-0 and fault d stuck-at-1 are subsets of stem fault s stuck-at-0 and stem fault s stuck-at-1, respectively, a bit mask can be used to effectively capture the detecting test responses for this open defect by using the detecting test responses of stem faults as the basis.

Consider further a bridge defect between signal line c and g. Assume that this bridge defect behaves like a dominant-type bridge, where g is the aggressor and c is the victim. Statically this bridge is activated when the signal line c and g have the opposite logic values, the bridge will behave like fault c stuck-at-0 when g is "0" or like fault c stuck-at-1 when g is "1." Similar to the previous open defect discussed, in order to store the detecting test responses for this bridge, only a few bits are needed to indicate which pattern can detect this bridge defect, and the detailed detecting observation points can be recovered by referring to the complete detecting test responses of stem faults s stuck-at-0 and s stuck-at-1.

A fault dictionary typically contains a lot of information redundancy among the various faults and defects in the fault dictionary. According to particular embodiments of the disclosed technology, a fault dictionary can be created that uses one or more bit masks and/or unique IDs to replace the direct description of detecting test responses. The information redundancy and the final size of fault dictionary can therefore be substantially reduced. In order to achieve the desirably fast accessing during test-result processing, the complete fault dictionary can be organized into a dedicated hierarchical architecture. Thus, complicated and time-intensive encoding methods (such as Huffman coding and LZW encoding) can be avoided.

In one specific exemplary implementation, the compressed dictionary is constructed as follows: One or more possible observation point combinations for the targeted faults (for example, all observation point combinations) and defects (for example, all defects) are identified for a selected integrated circuit design and put into a group of observation point combinations (sometimes referred to as the observation point combination pool). Each of the observation point combinations can then be assigned an ID (for example, a unique ID) for future reference. In order to provide for more efficient access, the observation point combinations can be hashed. For example, the IDs of observation points contained in each observation point combination can be used to compute the hash key. The detecting test responses can be collected for a list of so-called "pseudo faults," which refer to those faults used as a basis for other faults and defects. One possible way of collecting test responses for pseudo faults is based on using stem stuck-at-X faults for one or more fanout-free regions in the design (for example, every fanout-free region). For a given fanout-free region, the stem stuck-at-X fault can be simulated and the detecting test responses are stored (for example, as a list of detecting test patterns). In this exemplary implementation, a pair of IDs is used for each detecting test pattern. For instance, the first ID can represent (or indicate) the test pattern, and the second ID can refer to the observation point combination in the pool established above. The list of pseudo faults can additionally be sorted for faster access. For example, all pseudo faults can be sorted based on IDs of the corresponding fanout-free region, which allows us to quickly find the pseudo fault for a given fanout-free region by using binary search. These acts can be performed to create the basis of the compressed dictionary. After the basis is created (or as it is being created), the detecting test responses of one or more other faults or defects can be compressed into a bit mask based on the corresponding pseudo fault. For example, for a given fault f a bit mask with a length corresponding to the number of detecting test patterns of its corresponding pseudo fault pf can be used to compress the detecting test responses. In use, if f is detected by a test pattern in the same way as pf, the corresponding bit in the bit mask is set; otherwise, that bit is reset (or vice versa depending on the implementation).

For most faults and defects, the corresponding detecting test responses can be compressed into bit masks, and accordingly the size of the fault dictionary is reduced. In situations where embodiments of the described compression technique do not work (for example, if internal fault f is detected in a way different from its stem fault by a given test pattern) a separate entry can be created and used to describe this detecting pattern for f based on a pair of pattern IDs and observation point combination IDs. Further, one or more of the faults associated with the same pseudo fault can be arranged as neighbors within the whole fault list in order to enable more efficient access during test-result processing.

The above-described embodiments should not be construed as limiting in any way, as alternative or supplemental techniques can be performed in order to realize other desirable features or improvements of fault dictionary compression. For example, based on the observation that there exist many similarities among the observation point combinations determined, the memory requirement for the observation point combination pool can be further reduced by incrementally describing one or more of the observation point combinations from the group of observation point combinations. For instance, in certain embodiments, only the differences from the base observation point combination are stored for each observation point combination. Another possible embodiment reduces the number of pseudo faults (and thus the memory used to store the detecting test responses for pseudo faults). For example, instead of creating a pseudo fault for each fanout-free region, two or more fanout-free regions (for example, closely related fanout-free regions) can be combined and a single pseudo fault created for faults within the combined region.

Further, in architectures where an output response compactor is used, embodiments of the exemplary dictionary compression schemes described above can also be used. For example, the compacted detecting test responses can be stored into a fault dictionary using the proposed techniques and directly used for test-result processing without having to recover the original test responses before compaction. Further, it should be understood that the exemplary embodiments of the compression technique are described as applying to static faults and defects for illustrative purposes only. The techniques can also be applied to timing-related, dynamic faults and defects. For example, when an-speed test pattern set is applied, the detecting test responses can be computed for transition faults and timing-related defects. Observation point combinations can be computed for all transition faults and put into the group of observation point combinations (for example, the observation point combinations pool). The detecting test responses of pseudo faults can be computed, for example, for each fanout-free region based on a stem's slow-to-rise fault and slow-to-fall fault. Other transition faults and timing-related faults and defects can be compressed into a bit mask, whenever possible, using the corresponding pseudo fault as the template. For a test pattern set with both static and at-speed test patterns, two fault dictionaries can be created separately for static and timing-related faults and defects. In one embodiment, these two fault dictionaries are sequentially accessed during test-result analysis.

2. Retrieval of Information from Dictionary

During test-result processing, the compressed dictionary allows efficient retrieval of the stored detecting test responses for faults and extracted defects and fast diagnosis for failing integrated circuits, providing the high throughput required for analyzing volume production test. During diagnosis, every failing test pattern of a failing integrated circuit is individually analyzed. For a given failing test pattern, all suspects which can explain this failing test pattern are identified by the following procedure: the ID for the observation point combination of the current failing test pattern is first determined by searching the observation point combination pool; then all pseudo faults which can explain this test pattern are identified by comparing the ID of the failing test pattern and the ID of the observation point combination of the failing test pattern. The suspect list for this failing test pattern can be identified by checking the bit mask of all faults and defects associated with the pseudo faults determined above. This procedure can be repeated for all failing test patterns. In the end, a list of suspects is determined, each explaining at least one failing test pattern. This list can be further processed to generate a list of potential defects (or defect candidates), which could explain all or at least a majority of the failing test patterns and also, optionally, the passing test patterns. Further, the list of potential defects can include additional information related to the potential defects identified. For example, one or more of the following properties can be further associated with the potential defects in the list of potential defects: (a) a defect identifier that distinguishes the respective potential defect from other potential defects, (b) a derived rule identifier that identifies the defect extraction rule used to extract the respective potential defect; (c) a design manufacturing rule identifier that identifies the design manufacturing rule from which the defect extraction rule used to extract the respective potential defect was derived; (d) a physical location of the respective potential defect in the physical layout of the integrated circuit design; (e) physical properties of the respective potential defect in the physical layout of the integrated circuit design; and (f) a ranking of the respective potential defect relative to other potential defects.

Incremental Simulation (21.2)

The fail log for a defective circuit can contain failing patterns not analyzed by the defect identification procedure (21.1). An incremental simulation procedure (21.2) can be used to simulate one or more of these failing patterns. According to one exemplary embodiment, the defects to be simulated are selected from the ranked candidate list. Further, the same fault models as used in the fault dictionary computation process can be applied to defects under consideration. If none of faults representing a defect match the observed failing behavior (the criterion for judging match goodness can be similar as what were defined for type I, II and III defects in the defect identification process (21.1)), the defect can be dropped out of the candidate list. The incremental simulation can stop once the defects remaining in the candidate list fall into one class, since the failing mechanism can be uniquely identified.

Incremental Diagnostics (21.3)

It is possible that none of the defects in the fault dictionary are able to explain the observed failing behavior. The reasons could be, for example: (1) the faults modeling the defects are not accurate enough, and are thus unable to fully capture the behavior of the defect under some test patterns; or (2) the defect(s) being diagnosed were not considered as potential candidates during the defect-extraction stage. Therefore, the fault signatures of the defects may not be stored in the fault dictionary.

According to one exemplary embodiment, incremental diagnostics (21.3) can be used to analyze the observed failing behaviors if the defect identification procedure (21.1) and the incremental simulation (21.2) generate an empty candidate list. Incremental diagnostics (21.3) can be performed, for example, by the advanced diagnostics component (4726) shown in FIG. 47. For example, an effect-cause-based diagnostic procedure can be used to analyze the actual responses and determine which defect(s) potentially caused the observed behavior. The incremental diagnostic procedure (21.3) typically produces a list of candidates as well as the associated fault types. If the candidates fall into the same class, yield loss pareto charts can be updated without resolution loss. Otherwise, probabilistic measures can be assigned to the classes these candidates belong to.

The defect candidates can be stored in a separate file, which can be used later for the purpose of learning of new defect rules. Also, the defect dictionary can be updated by incorporating data about these defect candidates.

Graphical Representation Computation (21) (22)

One or more graphical representations of the diagnostic results (21.4) can be computed using a graphical representation computation procedure (22) as shown in FIG. 31. The graphical representation computation procedure (22) corresponds to the diagnostic results analysis component (4718) shown in FIG. 47. One exemplary representation that can be computed using the diagnostic data is a pareto chart. Accordingly, the remainder of this section will discuss the generation of a pareto chart, though it should be understood that other graphical representations indicating the likelihood of potential defects in the integrated circuit can alternatively be computed.

Pareto chart computation involves the computation of fail probabilities of the various yield limiting features in the design. For purposes of this discussion, the term "features" refers to those characteristics in a design that are prone to failure during manufacturing, and therefore at least partially contribute to yield loss. The physical instantiation of a feature can range from very specific elements (for example, two metal lines that run parallel to each other at minimum spacing for a long distance and thus are prone to bridging) to more general elements (for example, all nets, or library cells in the design). In this section, features are denoted as $f_1, f_2, \ldots f_K$. For a given design, each feature can have multiple instances (for example, a single via is a feature that is prone to being malformed leading to opens, and, in a design, there can be millions of single via instances). The instances of a feature $f_1$ are denoted as $f_i^1, f_i^2, \ldots f_i^{n_i}$, where $n_i$ is the number of instances of $f_i$ in the design. During manufacturing, each feature can potentially be malformed. As used herein, the probability of this happening is denoted by $p_{fail}(f_i)$. In certain embodiments of the disclosed technology, the object of the pareto chart computation is to estimate these probabilities of failure for different features from the high volume of the diagnostic results gathered during production.

Figure 40:
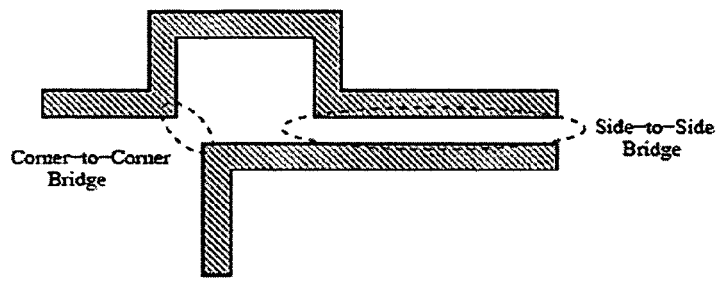
FIG. 40 is a block diagram showing two exemplary features that could potentially have a corner-to-corner bridging defect or a side-to-side bridging defect.
Figure 41:
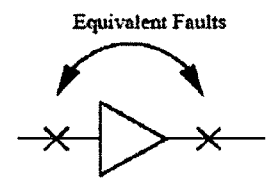
FIG. 41 is a block diagram showing a buffer having two equivalent faults.

If diagnosis were ideal (for example, for each failing die, diagnosis was able to pin-point the exact cause of failure), estimating the fail probabilities would be simplified: the fail probability would be the ratio of the number of times a feature failed to the number of times a feature was manufactured. However, in reality, diagnosis is not always 100% accurate. Usually, diagnosis (such as the test-result analysis (4716) shown in FIG. 47) produces a list of suspect features that are likely to be the cause of the failure in a defective die instead of the actual failing feature(s). This is usually because, more often than not, failures in other features can equally explain the behavior of the defective die observed on the tester. Accordingly, using only boolean value fail information, it can be difficult or impossible to distinguish among certain features as the real cause of defect. As an example, consider the situation illustrated in FIG. 40 where there are multiple features associated with the same net pair, such as a corner-to-corner and a side-to-side bridge. In this case, it is typically not possible to determine which is the real cause of a bridge on the net pair using only logic level diagnosis. Other causes of ambiguity in diagnosis are so-called "equivalent faults," which are indistinguishable at the logic level. As an example, consider the exemplary buffer illustrated in FIG. 41. The faults on the input and output of a buffer are equivalent. This makes the task of estimating the fail probabilities of features a non-trivial one. To summarize, diagnosis of a multiplicity of failed die produces a list of suspect features that can potentially be the cause of failure for each die is provided. As an example:

| Failed Die Number | Suspect Features |
| --- | --- |
| 1 | $f_3^{100}, f_{10}^{141}, f_{11}^{115}, f_3^{101}$ |
| 2 | $f_2^{13211}, f_2^{13213}, f_6^{111}, f_6^{112}, f_6^{114}$ |
| 3 | $f_7^{123}, f_7^{1653}$ |
| . | . |
| . | . |
| . | . |

According to one embodiment, pareto chart computation involves analyzing the list of suspect features (such as the example above) to compute reliable estimates of the individual feature fail probabilities: $P_{fail}(f_i)$.

In the following section, two exemplary methods for computing individual feature fail probabilities are described. These exemplary methods should not be construed as limiting, however, as multiple additional or alternative methods can be used in any embodiment of the disclosed technology. In the first exemplary method, an iterative procedure is used to compute feature fail rates. In the second exemplary method, a linear-regression-based method that is based on partitioning the design into smaller blocks and relating the fail rate of each block to the features contained within the block is used. After the two exemplary methods are described, the possible problem of bias introduced by wafer-level systematic defect causes is addressed. Such defect causes can affect die in certain areas on the wafer and possibly in specific regions within the die. Due to the non-random nature of such defects, such defect causes can introduce erroneous biases toward certain features. An exemplary technique for addressing these effects is also described below.

1. An Exemplary Iterative Learning Procedure

In certain exemplary embodiments, an iterative learning procedure is used. In some implementations, the iterative learning procedure comprises determining what the probability is that a particular feature in the list of suspect features is the actual cause of failure for a given list of diagnosed suspect feature instances. This probability can be described in terms of the unknown variables: $p_{fail}(f_i)$. The procedure further comprises using this probability to estimate $p_{fail}(f_i)$ itself. This creates a system of equations which can be solved in an iterative fashion to estimate the fail rate of each feature.

Consider a defective die for which diagnosis produces the following suspect feature instances: $f_2^{123}, f_3^{22}, f_3^{23}, f_1^{1001}$. It is first assumed that the actual failing feature instance(s) in the die is in this list of suspect feature instances. The probability that, given the above diagnosis results, the actual cause of defect in the die is $f_2^{123}$ can be determined using probability theory by defining two events A and B as:

A=$f_2^{123}$ is the only cause of defect in a faulty die; and
B At least one of the feature instances $f_2^{123}, f_3^{22}, f_3^{23}, f_1^{1001}$ is the cause of defect faulty die The conditional probability of A given B is then:

$$P(A/B) = \frac{P(A)}{P(A \cap B)} = \frac{P(A)}{P(B)} \quad (3)$$

since $A \subset B$. Now, assuming that all features fail independently, the probability of events A and B can be given by:

$$P(A) = \frac{p_{fail}(f_2)}{(1 - p_{fail}(f_2))} \prod_{i=1}^{K} (1 - p_{fail}(f_i))^{n_i} \quad (4)$$

and $$P(B) = \frac{1 - (1 - p_{fail}(f_2))(1 - p_{fail}(f_3))^2(1 - p_{fail}(f_1))}{(1 - p_{fail}(f_2))(1 - p_{fail}(f_3))^2(1 - p_{fail}(f_1))} \quad (5)$$

$$\prod_{i=1}^{K} (1 - p_{fail}(f_i))^{n_i}$$

By substituting equations (4) and (5) into equation (3), the conditional probability becomes:

$$P(A/B) = \frac{p_{fail}(f_2)(1 - p_{fail}(f_3))^2(1 - p_{fail}(f_1))}{1 - (1 - p_{fail}(f_2))(1 - p_{fail}(f_3))^2(1 - p_{fail}(f_1))} \quad (6)$$

Now, the individual feature fail probabilities can be expected to be of the order of $10^{-8}$, otherwise almost every manufactured die will have multiple failures and the yield will be almost be zero. Under this assumption, the higher order terms in Equation (6) like $p_{fail}(f_i)^2$, $p_{fail}(f_i)^3$, $p_{fail}(f_i) p_{fail}(f_j)$ and so on will be much smaller than the first order terms, and hence can be ignored. With this simplification Equation (6) becomes:

$$P(A/B) \approx \frac{p_{fail}(f_2)}{p_{fail}(f_2) + 2p_{fail}(f_3) + p_{fail}(f_1)}. \quad (7)$$

In general, for a failed die with the following feature suspect list determined by diagnosis:

$x_1$ instances of $f_1$,
$x_2$ instances of $f_2$,
.
.
.
$x_K$ instances of $f_K$, the probability that the actual cause of defect in the failing die is an instance of $f_i$ can be given by:

$$P(\text{An instance of } f_i \text{ is the actual cause of defects/Diagnosis Results}) \approx \frac{x_i p_{fail}(f_i)}{\sum_{j=1}^{K} x_j p_{fail}(f_j)} \quad (8)$$

Next, Equation (8) can be used to develop an estimator for $p_{fail}(f_i)$ Consider again the earlier example where the list of diagnosed suspects in a failed die is $f_2^{123}, f_3^{22}, f_3^{23}, f_1^{1001}$. So, in this case, there is one suspect instance each of features $f_1$ and $f_7$, and, two suspect instances of feature $f_3$. Now, assume for illustrative purposes that there are $N_{similar}$ other failing die that have a similar diagnosis suspect list. That is, the suspect list contains one instance each of $f_1$ and $f_2$ and two instances of $f_3$. So, on an average out of the $N_{similar}$ failing die, the number of die for which the real cause of failure is an instance of feature f is given by:

$$N_{similar} P(\text{An instance of } f_2 \text{ is the actual cause of defect/Diagnosis Results}) \approx \quad (9)$$

$$\frac{N_{similar} p_{fail}(f_2)}{p_{fail}(f_2) + 2p_{fail}(f_3) + p_{fail}(f_1)}.$$

From this example it can be seen that the failed die in the above example contributes:

P (An instance of $f_2$ is the actual cause of defect/Diagnosis Results) to the fail count of feature $f_2$ in the overall set of failed die. In other words, given a set of failed die, a die with a diagnosis suspect list that has $x_i$ instances of $f_i$ will contribute (from Equation (8)):

$$\frac{x_i p_{fail}(f_i)}{\sum_{j=1}^{K} x_j p_{fail}(f_j)} \quad (10)$$

to the feature fail count for $f_i$. The contribution of each failed die to the fail count of $f_i$, as given by the above expression, can be added and the sum divided by $n_i N_{manuf}$ to get an estimate of $p_{fail}(f_i)$.

To summarize the exemplary technique, assume that there are $N_{manuf}$ fabricated die. Assume further that out of these, $N_{fail}$ are found to be defective and are diagnosed. Let $x_i^l$ denote the number of instances of feature $f_i$ in the suspect list for failed die $l(1 \leq l \leq N_{fail})$ The fail rate for feature $f_i$ can then be estimated according to this exemplary embodiment as:

$$p_{fail}(f_i) = \frac{1}{n_i N_{manuf}} \sum_{l=1}^{N_{fail}} \left( \frac{x_i^l p_{fail}(f_i)}{\sum_{j=1}^{K} x_j^l p_{fail}(f_j)} \right) \text{ for } 1 \leq i \leq K \quad (11)$$

Hence, there exists a system of non-linear equations in the unknown variables, $p_{fail}(f_i)$, and the known diagnosis results. These equations can be solved in an iterative fashion, starting from some initial guesses of the $p_{fail}(f_i)$ values and iteratively converging towards a solution. This exemplary technique can thus be characterized as an iterative feature fail rate learning procedure and can be used in connection with any of the disclosed embodiments.

2. An Exemplary Procedure for Using Linear Regression on Design Blocks

In this section, another exemplary method of estimating feature fail rates from the diagnostic results is described. The exemplary method builds on top of the iterative procedure described in the previous section.

In this exemplary method, the entire circuit design is partitioned into B similar sized blocks. Each block can be characterized as a "smaller die," which contains a subset of the feature instances in the design. Due to natural variations in the design, the distribution of feature instances is likely to vary from block to block. For example consider two features: $f_1$=a single via between metal layer 3 and 4, and, $f_2$=a single via between metal layer 1 and 2. One section of the design can contain more instances of $f_1$ than $f_2$, while a different section can have more $f_2$ instances as compared to those of $f_1$. Different design blocks can therefore have distinct characteristics. Thus, by relating the fail rate of the design blocks to the feature instances in the block, a regression model with $p_{fail}(f_i)$ as predictor variables and block fail rates as observed variables can be constructed. The fail rate of features can then be estimated using standard regression techniques. See, e.g., N. Draper and H. Smith, *Applied Regression Analysis* (Wiley-Interscience 1998). The fail rate of each design block can also be determined from the diagnostic results using an embodiment of the iterative procedure described in the previous section. There are at least two possible advantages of determining the feature fail probabilities in this fashion. First, half of the blocks in the design can be used to train the regression model to estimate $p_{fail}(f_i)$ These estimates can be validated by using them to predict the fail rates of the remaining half blocks and by comparing them to the measured fail rates from diagnostic results. Thus, this method can be characterized as having a built-in mechanism for validating results. Second, the use of regression allows diagnosis errors to be tolerated (for example, diagnosis errors in which the feature instance that is the actual cause of failure in a defective die is not included in the diagnosis suspect list). Assuming, for instance, that diagnosis errors are distributed uniformly over the design blocks, the errors will typically be substantially averaged out during regression.

2.1 Partitioning the Design into Blocks Based on Nets

A design can be partitioned into blocks in many possible ways. Because most features can be associated with nets in the design, one exemplary technique partitions the design based on the nets. For instance, let NET be the set of all nets in the design. If this set is divided into B subsets, $NET_s$, $1 \leq s \leq B$, the subsets will generally define different design blocks. According to one exemplary embodiment of the technique, the manner in which NET can be divided into subsets can be arbitrarily chosen. The resulting subsets, however, should desirably meet the criteria mentioned above that the features in the subsets be diverse. In addition, the subsets are desirably not too small. Otherwise, the estimates of $p_{fail}(f_i)$ can become statistically unreliable.

Figure 42:
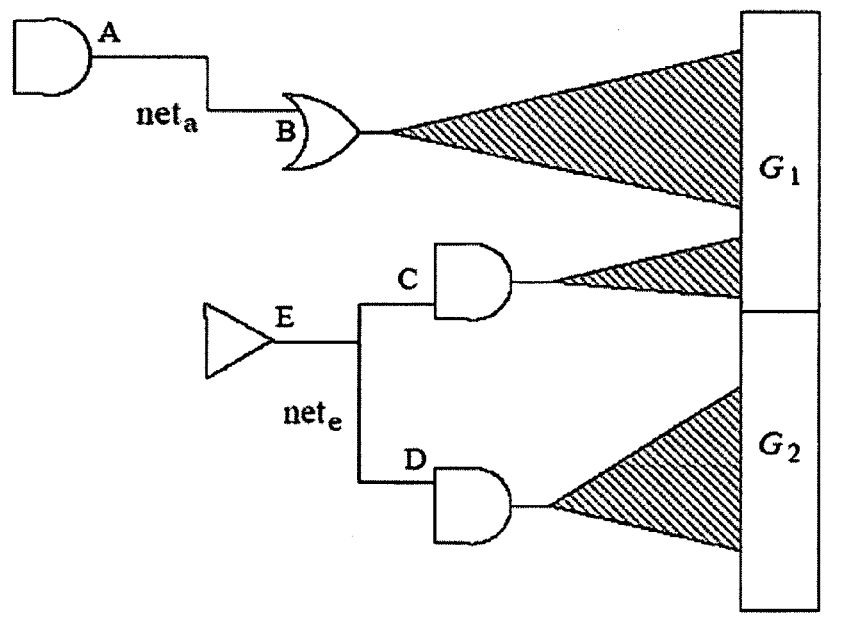
FIG. 42 is a block diagram of a net having faults that can be observed in two groups of scan cells, the groups being determined, for example, by an embodiment of a pareto chart computation procedure.

One exemplary manner for choosing the subsets is based on the scan cells at which the stuck-at faults associated with a net are observed for a given test pattern set. More specifically, the scan cells in the design are first grouped into B groups. This grouping of scan cells can be based on the scan chains in the design (for example, scan cells adjacent to each other in a scan chain can be put in the same group). For each stuck-at fault in the design, the observation scan cells can be determined using fault simulation. A net can then be placed into a subset based on what scan cell groups the stuck-at faults associated with the net are observed at. As an example, consider the exemplary design shown in FIG. 42. For exemplary purposes only, the exemplary design has only one scan chain. Assume that the design is desirably portioned into two blocks. To achieve this, the set of nets NET can be divided into two subsets: $NET_1$ and $NET_2$. The scan cells can then be grouped into two groups, $G_1$ and $G_2$, as shown in FIG. 42. Considering first the example net $net_a$, it can be observed that the four faults associated with it (A stuck-at-1, A stuck-at-0, B stuck-at-1, and B stuck-at-0) are observed at scan cells in group $G_1$. Consequently, this net can be included in $NET_1$. Note that for some nets, the faults associated with it may be observed in multiple scan cell groups. For example $net_e$ is such a net since the faults C stuck-at-0 and C stuck-at-1 are observed in scan cell group $G_1$ while the faults D stuck-at-0 and D stuck-at-1 are observed in $G_2$. According to one exemplary implementation, such nets can be arbitrarily placed into any one of the subsets.

2.2 Determining Block Fail Rates and Relating Them to Features

Once the design has been partitioned into blocks, the fail rate for each block can be determined from the diagnostic results. One exemplary technique for determining the fail rate is as follows. A list of suspect design blocks (or subsets $NET_s$) is determined from the list of diagnosed suspect nets. The fail probabilities for these blocks are estimated using an iterative procedure (for example, the iterative procedure described above in subsection (1)). For purposes of this discussion, let these fail rates be denoted as $\hat{p}_{fail}(NET_s)$. The estimated block fail rates can then be related to the feature fail rates. For example, because a feature instance can be associated with one or more nets (a single net in the case of features like single vias, or two nets in the case of features like bridges), the feature instances associated with a subset $NET_s$ can be determined. For example, let $y_{is}$ be the number of instances of feature $f_i$ associated with subset $NET_s$. The probability that there will be a defect in the subset of nets $NET_s$ can then be given by:

P(At least one feature associated with $NET_s$, fails)
=1-P(None of the features associated with $NET_s$, fails) or, equivalently:

$$\hat{p}_{fail}(NET_s) = 1 - \prod_{i=0}^{K}(1 - p_{fail}(f_i))y_{is} \qquad (12)$$

$$\approx \sum_{i=0}^{K} y_{is} p_{fail}(f_i) \text{ for } 1 \le s \le B$$

Again, the above approximation can be justified by the observation that the values of $p_{fail}(f_i)$ are expected to be much less than 1. The system of equations in Equation (12) above define a linear regression model with $p_{fail}(f_i)$ as the predictor variables and $\hat{p}_{fail}(NET_s)$ as the observed variables. This model can be used to generate estimates of $p_{fail}(f_i)$ using well known regression techniques (for example, a least squares estimation technique). See, e.g., N. Draper and H. Smith, *Applied Regression Analysis* (Wiley-Interscience 1998).

3. Hierarchical Yield Learning

Figure 43:
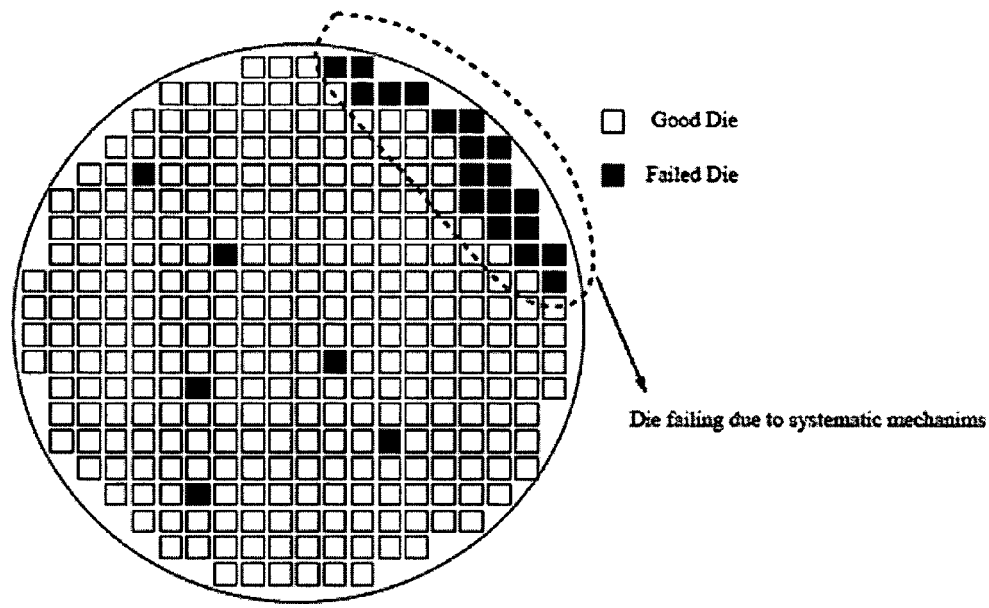
FIG. 43 is a block diagram illustrating the possibility of dies on a wafer failing due to systematic mechanisms.

There are certain defect mechanisms that affect die in only a certain area of the wafer. For example, depth-of-focus-related problems may only cause defects in die on the outer edges of the wafer. An example of such problems is shown in FIG. 43. Further, stepper-related issues may only show up in every fourth die on the wafer. Such systematic defect mechanisms have the potential to wrongly bias the fail rates of features since they do not affect all die uniformly. As an example, consider a situation where the die on the periphery of some wafer have an out-of-focus issue that causes a particular net in the design to bridge with another net. Further, assume that there is a corner-to-corner bridge feature associated with this net pair. Since a large number of die on the wafer periphery may exhibit this systematic defect mechanism, it could be perceived that the fail rate of corner-to-corner bridges is high. However, this perception would be incorrect because die in the interior of the wafer will not be affected by the out-of-focus problem, and hence the corresponding die will not exhibit a high corner-to-corner bridge fail rate. In order to alleviate this problem, and according to one exemplary embodiment, a hierarchical yield learning procedure can be used. In one example implementation of the procedure, failing die that fail due to a location-on-wafer-specific defect mechanism are identified. These die are then excluded from fail rate computation, thus avoiding the error introduced by systematic issues that do not affect all the dies uniformly.

Figure 44:
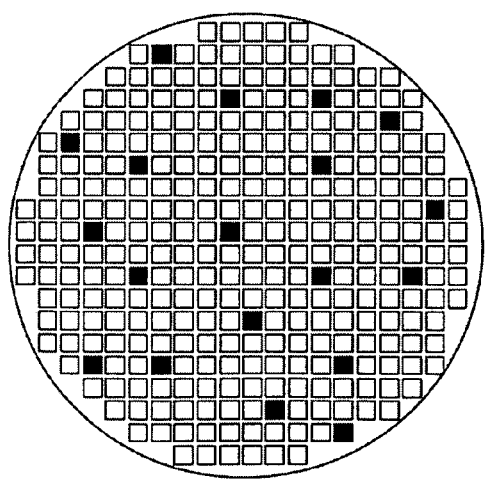
FIG. 44 is a block diagram illustrating an exemplary wafer defect map.
Figure 45:
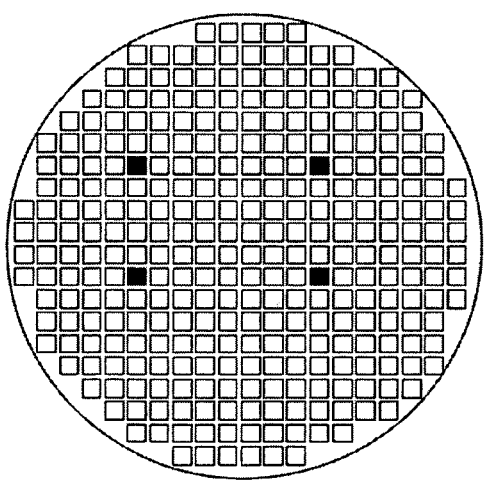
FIG. 45 is a block diagram illustrating the exemplary wafer defect map of FIG. 44 after so-called "hot nets" are identified.

In some cases, the wafer-location-specific defect mechanisms are very prominent. Such cases could be identified, for example, from a wafer defect map, which shows the location of defective die on the wafer. An example of a wafer defect map is shown in FIG. 44. However, in other cases, the systematic issue can become disguised by the regularly failing die. The use of diagnostic results in uncovering such issues that are hard to identify from simple wafer defect maps can be beneficial. As an example, consider a case where a wafer-level systematic mechanism causes a defect in a specific net (for example, $net_a$) in only those die that are located at four specific locations on the wafer (for example, as shown in FIG. 45). This subtle mechanism will not be easy to identify from the wafer defect map (FIG. 44). However, the mechanism can be uncovered by determining so-called "hot nets" using the diagnostic results. Generally speaking, hot nets can be characterized as those nets that fail at a rate disproportionately higher than other similar nets. In the illustrated example, $net_a$ will be designated as the hot net. Hot nets in failing die can be identified by letting the features be individual nets and then using the iterative learning procedure to determine net fail rates. Those nets whose fail rates are higher than some threshold can accordingly be categorized as hot nets. One exemplary threshold value can be the expected fail rate of a net. This can be estimated from the fail rates of features associated with the net. Thus, if a net fails more often than expected, it can be characterized as a hot net. Once hot nets are identified, for instance, the wafer defect map can be updated to show only those failing die that contain the hot net. The resulting map will consequently be indicative of the systematic issue (as shown, for example, in FIG. 45). A so-called "wafer map visualization rule" can be used to denote the criteria for choosing failed die to depict on the wafer map. Other examples of types or categories of wafer map visualization rules (besides hot nets) include, but are not limited to: die that have failures in certain cells, die that have failures in certain metal layers, or other rules that the user of this technique wishes to define. The described visualization schemes are made possible by the use of high volume in-production diagnosis.

4. Estimation of Test Escape Rate

Some defective manufactured integrated circuits may not be identified during testing because the test set may not detect the failing feature instances in the defective die. Such die are referred to as test escapes, and it, is often desirable to estimate the test escape rate for a particular test set. This can be done in some embodiments of the disclosed technology using the feature fail probabilities determined from volume diagnosis results as described in the previous sub-sections using the following exemplary procedure. In general, the test escape rate is the probability that at least one untested feature instance fails while all the feature instances detected by the test set do not fail. Let $u_i$ be number of instances of feature $f_i$ that are not covered by test. This number can be determined using fault simulation of the test set. Then the probability of test escape is given by:

$$p_{escape} = \left(\prod_{i=1}^{K}(1 - p_{fail}(f_i))^{(n_i - u_i)}\right)\left(1 - \prod_{i=1}^{K}(1 - p_{fail}(f_i))^{u_i}\right) \qquad (13)$$

$$= \prod_{i=1}^{K}(1 - p_{fail}(f_i))^{n_i}\left(\frac{1 - \prod_{i=1}^{K}(1 - p_{fail}(f_i))^{u_i}}{\prod_{i=1}^{K}(1 - p_{fail}(f_i))^{u_i}}\right)$$

As before, the higher order terms in the above equation can be ignored since the feature probabilities are expected to be much smaller than one. With this approximation the escape probability becomes:

$$p_{escape} = \left(1 - \sum_{i=1}^{K} n_i p_{fail}(f_i)\right)\left(\frac{\sum_{i=1}^{K} u_i p_{fail}(f_i)}{1 - \sum_{i=1}^{K} u_i p_{fail}(f_i)}\right) \qquad (14)$$

Note that the above calculations can be performed on a per feature basis (for example, the escape probability for each individual feature can be calculated in a similar fashion).

Typically, test escape rates are expressed as defects per million (DPM) numbers, which is the number defective die in one million die that pass testing. The escape probability determined by the above equation can be easily converted to this number by multiplying by $10^6$. Hence, estimation of the DPM number constitutes another use of feature fail probabilities estimated from volume diagnosis results that can be captured and reported by embodiments of the disclosed technology.

5. Alternative Procedures for Pareto Chart Calculation

In this section, alternative procedures for pareto chart calculation are discussed. As discussed above, one major source of ambiguities in diagnosis comes from equivalent faults, whose corresponding defects can form a so-called "equivalent class." A set of defects form an equivalent class if their corresponding faults share the same signature and cannot be distinguished without additional information. If the equivalent class consists of defects from different classes, the diagnostic procedure may be unable to identify the real failing mechanism. To simplify discussion, the equivalent classes will be used hereafter to refer to defects that have elements from different classes.

5.1 Error Estimation

Let $C_t = \{C_{t1}, C_{t2}, \ldots, C_{tk}\}$ denote an equivalent class where $C_{tl}$ represents the number of defects in the l-th class. If such an equivalent class $C_t$ is encountered in the defect identification procedure (21.1) and if it remains unresolved after incremental simulation (21.2) and diagnosis (21.3), without knowing which defect class is the real cause, the diagnosis procedure will typically have to assign probabilistic credits to each class involved in $C_t$. Assuming each defect in $C_t$ is equally likely to occur, the credits assigned can be related to the number of defects in the class. For example:

$$\left\{ \frac{C_{t1}}{\sum_l C_{tl}}, \frac{C_{t2}}{\sum_l C_{tl}}, \ldots, \frac{C_{tk}}{\sum_l C_{tl}} \right\}.$$

Let $\mathscr{E}_i$ denote the set of the equivalent classes that contain defects of class i. Let N be the total number of defective circuits being diagnosed. Let $N_{i-u}$ be the number of defective circuits that can be precisely diagnosed as having class i defects. Therefore, the number of circuits with defect class i is in the range $[N_{i-u}, N_{i-u}+|\mathscr{E}_i|]$. In the worst case, the error of diagnosed result for class i is $|\mathscr{E}_i|$. Therefore, the ambiguity of the predicted pareto chart for k classes can be measured with the average $$\sum_i |\mathscr{E}_i|/k.$$

5.2 Data Calibration

Figure 32:
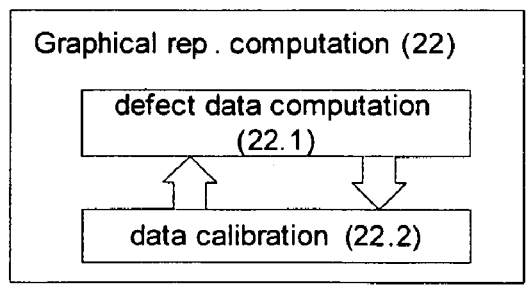
FIG. 32 is a block diagram illustrating an exemplary graphical representation computation computation.

The predicted distribution of yield loss mechanisms are desirably calibrated such that, in the statistical sense, the estimation error caused by equivalent classes can be reduced. As shown in FIG. 32, data calibration (22.2) can be performed in an iterative fashion with diagnostic results computation (22.1).

In one exemplary embodiment, data calibration is based on the concept of set probability. For example, let P(D=i) (i=1, 2, ...) be the probability that defect class i occurs; let P(O=i) (i=1, 2, ...) be the probability that the defect is predicted by diagnosis as class i; let P(O=i|D=j) (i,j=1, 2, ...) be the conditional probability that the defect is predicted as class i under the condition that defect class j occurs. Based on the probabilistic theory, the equation holds that:

$$P(O_i) = \sum_j P(O_i | D_j) P(D_j) \tag{15}$$

Let P(O) be the vector $\{P(O_1), P(O_2), \ldots, P(O_k)\}$, let P(D) be the vector $\{P(D_1), P(D_2), \ldots, P(D_k)\}$. The formula relating P(O) and P(D) is then:

$$P^T(O) = \Gamma \times P^T(D) \tag{16}$$

where $\Gamma$ is a matrix with $P(O_i|D_j)$ being an element on i-th row and j-th column.

As can be observed, P(O) is the pareto chart obtained through diagnosis. In the ideal case, there is no ambiguity between different classes, and $P(O_i|D_j)=0(i\neq j)$. The conditional probability matrix $\sigma$ will be unit matrix, and P(O) will match P(D). If there is ambiguity, P(O) can be calibrated by:

$$\hat{P}^T(O) = \sigma^{-1} \times P^T(O). \tag{17}$$

The conditional probability can be estimated based on the information collected during the defect identification procedure (21.1). During an exemplar two-step procedure, the equivalent classes that have been encountered can be recorded. The record for the equivalent class $C_t$ can be a tuple $\{L_t, C_t\}$ where $L_t$ represents the number of occurrences of $C_t$ during identification stages.

Suppose the pareto chart P(O) is $\{P(O_1)=n_1, P(O_2)=n_2, \ldots, P(O_k)=n_k\}$ after N defective parts were diagnosed. The conditional probability $P(O_i|D_j)$ can be estimated using equation:

$$P(O_i | D_j) = \frac{P(O_i, D_j)}{P(D_j)} = \frac{N(O_i, D_j)}{N(D_j)} \approx \frac{N(O_i, D_j)}{N \cdot n_j}, \tag{18}$$

where $N(O_i, D_j)$ are those defects of class j that are diagnosed as of class i. It can be estimated from the set of the equivalent classes $\mathscr{E}_i \cap \mathscr{E}_j$. Consider an equivalent class $C_t \in \mathscr{E}_i \cap \mathscr{E}_j$. The equivalent class $C_t$ contains indistinguishable defects of class i and j. Let $C_t$ be $\{\ldots, C_{ti}, \ldots, C_{tj}, \ldots\}$. As described above, the probability that a defect in $C_t$ is diagnosed as of class i is $$C_{ti} \bigg/ \sum_l C_{tl}.$$

Assume P(O) $(P(O)=\{n_1, n_2, \ldots, n_k\})$ matches P(D) closely, and assume that the same distribution P(D) also applies to the set of defects that are considered by the diagnosis to be in the equivalent class $C_t$. Therefore, out of T occurrences of $C_t$, the number of circuits with defects of class j can be calculated as, $$T n_j \bigg/ \sum_l n_l,$$

and the number of times that defects of class j are predicted as of class i can calculated as $$T \frac{C_{ti}}{\sum_l C_{tl}} \frac{n_j}{\sum_l n_l}.$$

In other words, for each occurrence of $C_t$, the probability that defects of class j are predicted as of class i is $$\frac{C_{ti}}{\sum_l C_{tl}} \frac{n_j}{\sum_l n_l}.$$

Consider all the equivalent classes in $\mathscr{C}_i \cap \mathscr{C}_j$, and suppose $|\mathscr{C}_i \cap \mathscr{C}_j|=m$, then $N(O_i, D_j)$ can be computed as:

$$N(O_i, D_j) = \sum_{t=1}^{m}\left(\frac{C_{ti}}{\sum_l C_{tl}} \frac{n_j}{\sum_l n_l}\right). \quad (19)$$

$\tilde{P}(O)$ can now be computed by combining equations (17), (18), and (19).

The calibration iterates by recomputing the conditional probability matrix $\Gamma$ with the calibrated $\tilde{P}(O)$. The iteration stops after a certain number of cycles, or the error between $\tilde{P}(O)$ of consecutive runs is less than the predetermined threshold.

Analysis of Miscellaneous Defects and Learning of New Defect Rules

Miscellaneous defects are those that cannot be identified as belonging to any classes that have been defined previously. The data produced by the incremental simulation (21.2) and incremental diagnostic (21.3) procedures can indicate the existence of defects that are not properly modeled and/or defects that are not considered during the fault simulation and fault dictionary computation stage. When requested, an analysis procedure can be activated to process the data and extract the statistical information. An advanced diagnoses component (such as advanced diagnosis component (4726) in FIG. 47) can use the statistical information to simulate the defects and to update the fault dictionary. If certain criteria are met, new defect rules can be generated and applied during the next iteration of the defect extraction process.

The diagnosis component can be made self-adaptive, for example, in any one or more of the following ways.

1. Some newly identified defects are highly likely to occur. Their failing responses are desirably recorded in the fault dictionary. Their corresponding faults can be simulated with the same test set as was used previously during the fault dictionary computation stage. The fault dictionary can be updated with the simulated failing responses. To determine the likelihood of occurrence of a defect, the number of times the defect is encountered can be counted.

2. From the incremental diagnostic results (21.3), it can be observed that a new fault type is more effective in describing the observed failing behaviors than the ones used previously. If this is true for a significant percentage of defects, the newly identified defects, as well as the defects previously stored in the fault dictionary if necessary, can be simulated under the new fault type. The fault dictionary can be updated with the simulated failing responses.

3. If miscellaneous defects with certain characteristics that were not considered previously are found to be highly likely to occur, the newly identified defect-inducing characteristics are desirably incorporated into the defect rule set and a new defect class defined in a defect extraction rule update procedure (26). The defect extraction (7) can be performed on the layout using the new rules. For the newly extracted defects, the corresponding faults can be simulated with the same test set as was used previously during the fault dictionary computation stage. The fault dictionary can be updated with the simulated failing responses.

These self-learning, adaptive procedures can be initiated on a regular basis, or at the user's request.

Update of Defect Ranking (24)

As discussed above, defect rankings are initially determined by the probabilistic measures related to layout features and manufacturing process parameters. According to one exemplary embodiment of the general method, the number of occurrences for each defect class is counted during the test-result data post-processing procedure so that defect rankings can be dynamically updated with the relative frequency of occurrence.

Special Considerations for On-Chip Compression Logic

Figure 28:
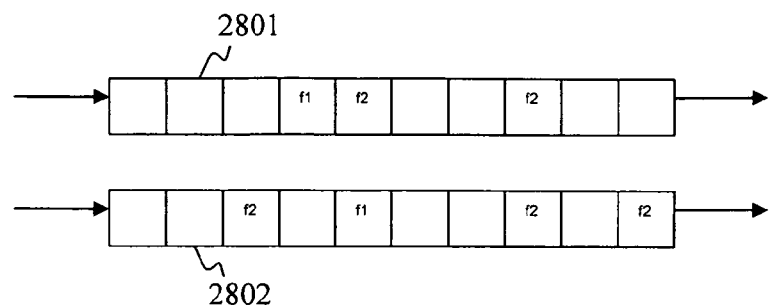
FIG. 28 is a block diagram illustrating an example of fault effect differences.
Figure 29:
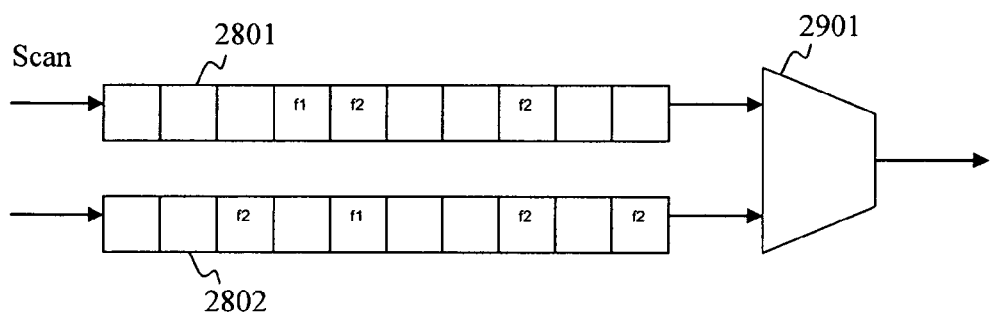
FIG. 29 is a block diagram illustrating a possible output response compaction problem in connection with the fault-effect differences of FIG. 28.
Figure 30:
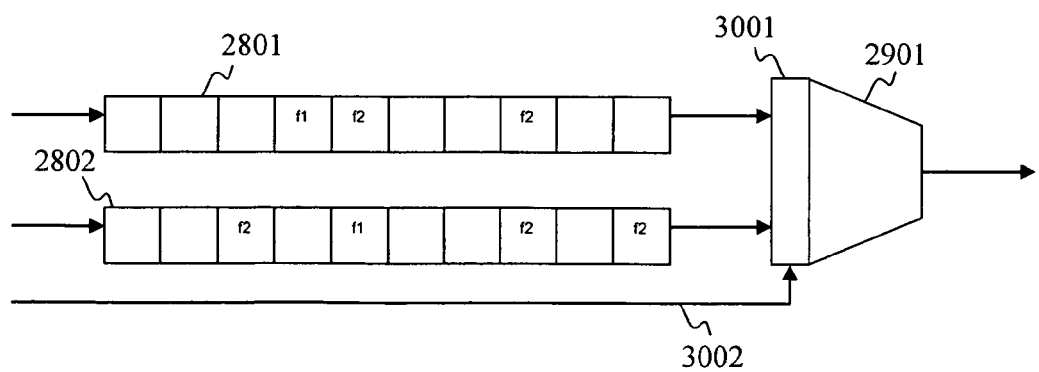
FIG. 30 is a block diagram illustrating an output response compaction selection circuit.

For integrated circuits that use on-chip compression logic such as output response compactors, some special considerations arise. For example, one consideration is the limited possibility for diagnosis. Different compactors have different capabilities, but some implementations offer diagnosis quality that is comparable to integrated circuit without compactors, e.g., G. Mrugalski, J. Rajski, C. Wang, A. Pogiel, J. Tyszer, "Fault Diagnosis in Designs with Convolutional Compactors," ITC 2004, pp. 498-507. Another consideration is that the compactor can invalidate the differentiation of candidate defects by the compression method of the compactor. As an example, consider FIGS. 28 through 30. FIG. 28 shows the case without an output response compactor. Fault effects can be observed at a number of scan cells in a first scan chain (2801) and a second chain (2802), thus the defects are distinguishable. However, as shown in FIG. 29, with an output response compactor (2901), the effects of the defects may no longer be distinguishable because, for example, the output responses for both defects cancel each other out (in the case of a two-defect assumption). Another possibility, for example, is that the observable output response for both defects is made identical by the compactor. For both cases, the architecture shown in FIG. 30 offers one possible solution that adds a component to the output response compactor (2901). This component, termed the "defect resolution output response selector" (3001) enables the ATPG to manipulate by a control signal on control line (3002) the normal operation of the output response compactor (2901) in order to retain the distinguishing capability of the computed candidate test pattern. There are a number of possible ways to implement and use the selector circuit (3001) exemplified in FIG. 30. For example, disabling certain scan chains from compaction during testing, or rerouting certain scan chain outputs to different inputs of the compactor during testing. In particular exemplary embodiments, the defect resolution output response selector (3001) adds a stage to the output response compactor (2901) and is configured to manipulate the output response compactor (2901) to make the output response compactor (2901) compute different signatures for the otherwise indistinguishable faults.

Other Usage Scenarios

The exemplary methods, apparatus, and system described in this embodiment assume that the design and test generation, production and production test are performed by the same entity or that the information exchange between different entities is unrestricted. In the following, however, a usage scenario for an exemplary embodiment of the disclosed technology is described wherein the information exchange is restricted.

For example, each step is owned by a different entity, which wants to exchange only the absolute minimum of information. The design entity owns the layout data, the netlist, and is the only one who can generate test patterns and is not willing to share the netlist. The second entity is the producer, who receives only the layout data, and whose goal is high yield. It may not share rules, which might increase its yield, or give up secrets of the production. Only the necessary DFM rules are disclosed to the design entity. Finally, there is the production-test entity, which knows nothing about the integrated circuit. It receives only the test patterns and the produced die. With a few modifications to the exemplary procedure described above, substantially the same DFM and yield improvements are possible in this environment. For example, one solution uses symbolic extraction rules provided by the producer through special (encoded) DFM rules for the design entity, which are meant to be used in the ATPG, for example, to increase the defect resolution. A corresponding symbolic dictionary (or thesaurus) can be generated by the design entity. Symbolic in this context means that the actual defect, defect extraction rule, and DFM rule do not reveal any knowledge concerning the design or the production line. For sake of this example, assume that the defects are simply enumerated. Both the design entity and the production entity may compute the same defect list based on the layout data and the DFM rules. The design entity may use the defect list to generate test patterns, and the production entity may receive diagnosis analysis results based on the symbolic dictionary. The production entity in turn can analyze the problem completely and can take corrective steps. If required, the production entity sends improved (encoded) DFM rules for the ATPG to the design entity and requests additional test patterns.

Exemplary Computing Environments

Figure 48:
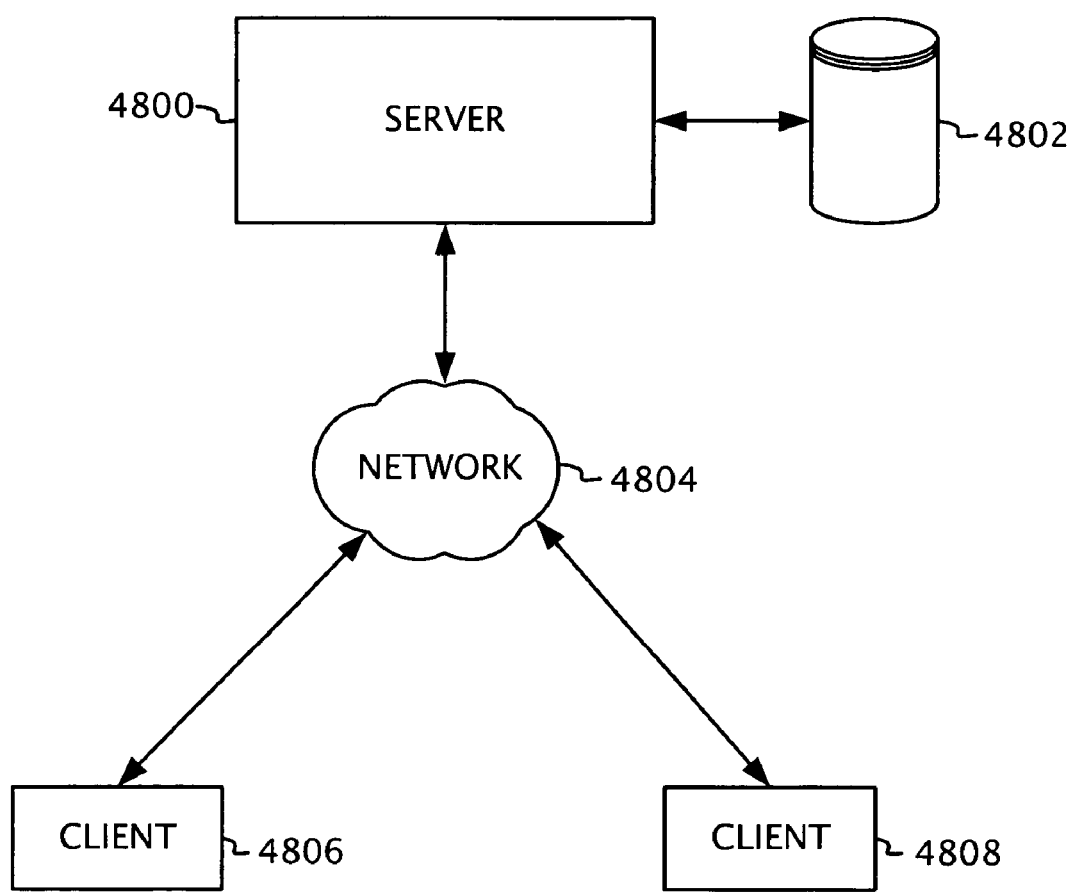
FIG. 48 is a block diagram showing an exemplary computer network as can be used to perform any of the disclosed methods.

Any of the aspects of the technology described above may be performed using a distributed computer network. FIG. 48 shows one such exemplary network. A server computer (4800) can have an associated storage device (4802) (internal or external to the server computer). For example, the server computer (4800) can be configured to generate or update DFM rules or defect extraction rules, to generate test patterns, test responses, or fault dictionaries, to diagnose faults or defects from test results, or compute yield analysis statistics and graphical representations thereof according to any of the embodiments described above (for example, as part of an EDA software tool). The server computer (4800) may be coupled to a network, shown generally at (4804), which can comprise, for example, a wide-area network, a local-area network, a client-server network, the Internet, or other such network. One or more client computers, such as those shown at (4806), (4808) may be coupled to the network (4804) using a network protocol. The work may also be performed on a single, dedicated workstation, which has its own memory and one or more CPUs.

Figure 49:
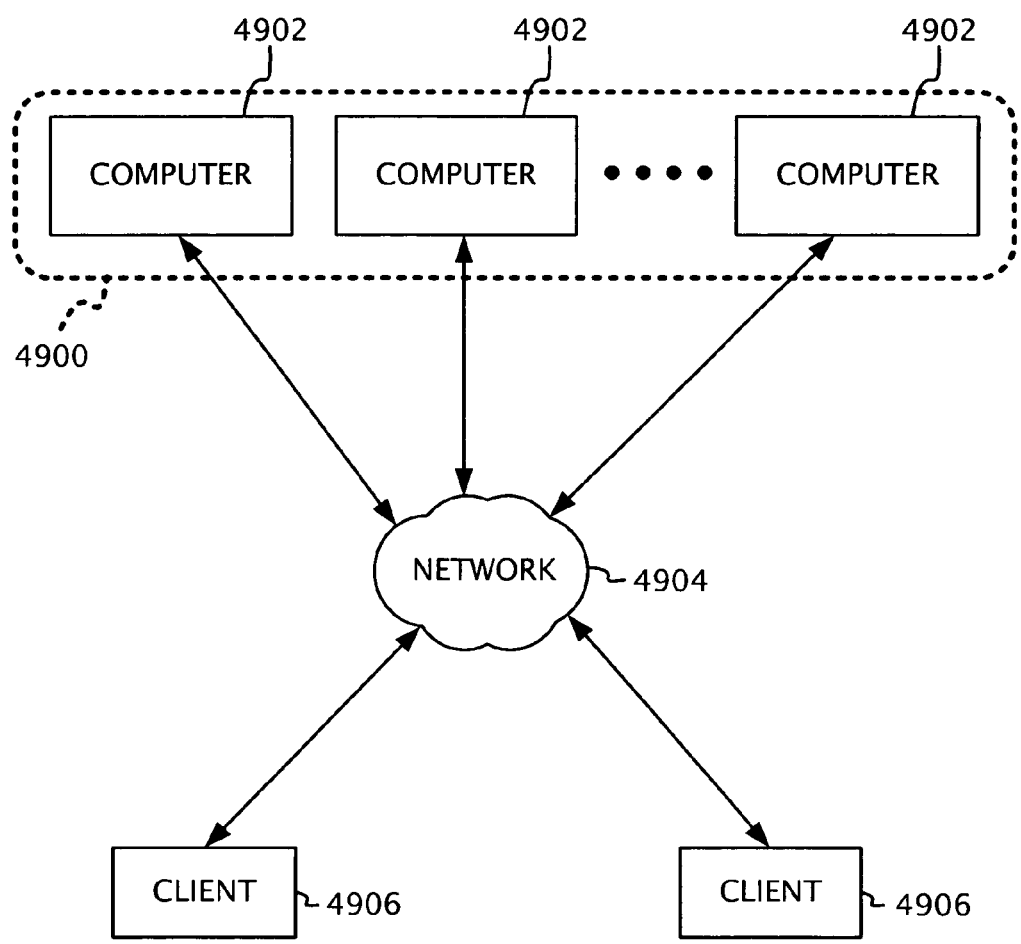
FIG. 49 is a block diagram showing an exemplary distributed computing environment as can be used to perform any of the disclosed methods.

FIG. 49 shows another exemplary network. One or more computers (4902) communicate via a network (4904) and form a computing environment (4900) (for example, a distributed computing environment). Each of the computers (4902) in the computing environment (4900) can be used to perform at least a portion of a test response generation process according to, for example, any of the embodiments described above (for example, as part of an EDA software tool, such as an ATPG tool). For instance, each of the computers may perform test pattern and test response generation for different portions of the circuit design, for different types of patterns, or according to various other criteria. The network (4904) in the illustrated embodiment is also coupled to one or more client computers.

Figure 50:
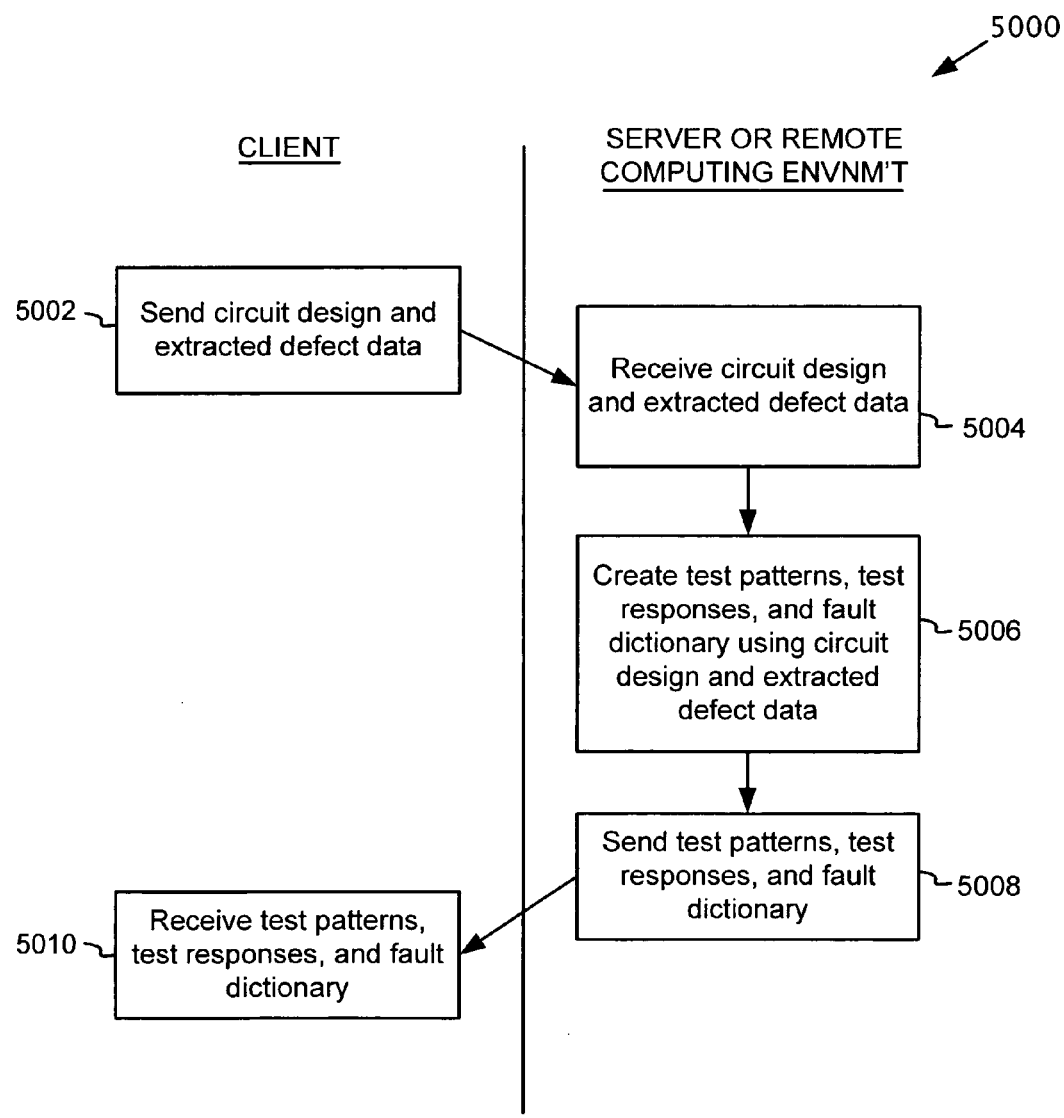
FIG. 50 is a flowchart for performing an exemplary component of the disclosed technology (test pattern generation) utilizing the network of FIG. 48 or the computing environment of FIG. 49.

FIG. 50 shows one nonlimiting example of using the computing environments illustrated in FIGS. 48 and 49. In particular, FIG. 50 shows that a database or data structure containing design information (for example, a netlist) and a database or data structure containing extracted defect data (for example, from fault/defect extraction component (4710)) can be analyzed using a remote server computer (such as the server computer (4800) shown in FIG. 48) or remote computing environment (such as the computing environment (4900) shown in FIG. 49) in order to generate test data for the design, including test patterns and test responses, using embodiments of the disclosed technology. At (5002), for example, the client computer sends design and extracted defect data to the remote server or computing environment. At (5002), the design and extracted defect data are received and loaded by the remote server or by respective components of the computing environment. At (5006), test data is created, including test patterns, test responses, and a fault dictionary using any of the disclosed embodiments. At (5008), the remote server or computing environment sends the test data (including the test patterns, test responses, and fault dictionary) to the client computer, which receives the test data at (5010). It should be apparent to those skilled in the art that the example shown in FIG. 50 is not the only way to generate test data using multiple computers. For instance, the design and extracted defect data can be stored on tangible computer-readable media that are not on a network and that are sent separately to the server or computing environment (for example, one or more CD-ROMs, DVDs, or portable hard drives). Or, the server or remote computing environment may perform only a portion of the test pattern generation procedures.

Having illustrated and described the principles of the illustrated embodiments, it will be apparent to those skilled in the art that the embodiments can be modified in arrangement and detail without departing from such principles. In view of the many possible embodiments, it will be recognized that the illustrated embodiments include only examples and should not be taken as a limitation on the scope of the invention.

What is claimed is:

1. A method, comprising:
using a computer, generating one or more fault dictionaries for identifying one or more defect candidates from corresponding observation point combinations, the observation point combinations indicating observation points of a circuit-under-test that capture faulty test values upon application of a respective test pattern, the act of generating the one or more fault dictionaries comprising,
for a first defect candidate, storing one or more first indicators indicative of test patterns detecting the first defect candidate, and
for a second defect candidate, storing at least a second indicator, the second indicator comprising a bit mask that indicates one or more of the test patterns detecting the first defect candidate that also detect the second defect candidate, each of the one or more of the test patterns detecting both the first defect candidate and the second defect candidate for one particular observation point combination.

2. The method of claim 1, wherein the one or more first indicators comprise unique IDs associated with the test patterns detecting the first defect candidate.

3. The method of claim 1, wherein the one or more first indicators comprise unique IDs associated with the observation point combinations for the test patterns detecting the first defect candidate.

4. The method of claim 1, wherein the first defect candidate is at a stem of a fan-out free region and the second defect candidate is in the fan-out free region of the circuit-under-test.

5. The method of claim 1, further comprising identifying one or more defect candidates during production testing of the circuits-under-test using the generated one or more fault dictionaries.

6. The method of claim 5, further comprising incrementally diagnosing one or more possible defects not identified by the generated one or more fault dictionaries, incrementally simulating one or more possible defects not identified by the generated one or more fault dictionaries, or both.

7. The method of claim 6, further comprising updating the generated one or more fault dictionaries with results from the performance of one or more of the incrementally diagnosing and the incrementally simulating.

8. The method of claim 6, further comprising updating one or more defect extraction rules or updating one or more of the design manufacturing rules based at least in part on results from the incrementally diagnosing or the incrementally simulating or both.

9. The method of claim 1, wherein the circuits-under-test comprise integrated circuits designed for functional use in electronic devices.

10. The method of claim 1, wherein the number of test patterns detecting the first defect candidate is limited to at least one of the following: (a) a predetermined value; or (b) a user-selected value.

11. The method of claim 1, wherein the test patterns detecting the first defect candidate comprise test patterns using static fault models and test patterns using dynamic fault models.

12. The method of claim 11, wherein the one or more fault dictionaries comprise at least a first fault dictionary and a second fault dictionary, and wherein fault dictionary information concerning the test patterns using static fault model is stored in the first fault dictionary and fault dictionary information concerning the test patterns using dynamic fault models is stored in the second fault dictionary.

13. The method of claim 1, wherein at least some of the test patterns detecting the second defect candidate use a different type of fault model than used to detect the first defect candidate.

14. The method of claim 1, wherein the observation point combinations correspond to compacted test responses output from a compactor in the circuit-under-test.

15. The method of claim 1, further comprising storing one or more of the following properties for at least the first defect candidate:
- a defect identifier that distinguishes the first defect candidate from other potential defects;
- a derived rule identifier that identifies the defect extraction rule used to extract the first defect candidate;
- a design manufacturing rule identifier that identifies the design manufacturing rule from which the defect extraction rule used to extract the first defect candidate was derived;
- one or more physical properties of the first defect candidate in the physical layout of the integrated circuit design;
- a physical location of the first defect candidate in the physical layout of the integrated circuit design; and
- a ranking of the first defect candidate relative to other potential defects.

16. One or more tangible computer-readable media storing computer-executable instructions for causing a computer to perform a method, the method comprising:
- generating one or more fault dictionaries for identifying one or more defect candidates from corresponding observation point combinations, the observation point combinations indicating observation points of a circuit-under-test that captured faulty test values upon application of a respective test pattern, the act of generating the one or more fault dictionaries comprising,
  - for a first defect candidate, storing one or more first indicators indicative of test patterns detecting the first defect candidate, and
  - for a second defect candidate, storing at least a second indicator, the second indicator comprising a bit mask that indicates one or more of the test patterns detecting the first defect candidate that also detect the second defect candidate, each of the one or more of the test patterns detecting both the first defect candidate and the second defect candidate for one particular observation point combination.

17. The one or more tangible computer-readable media of claim 16, wherein the one or more first indicators comprise unique IDs associated with the test patterns detecting the first defect candidate.

18. The one or more tangible computer-readable media of claim 16, wherein the one or more first indicators comprise unique IDs associated with the observation point combinations for the test patterns detecting the first defect candidate.

19. The one or more tangible computer-readable media of claim 16, wherein the first defect candidate is at a stem of a fan-out free region and the second defect candidate is in the fan-out free region of the circuit-under-test.

20. The one or more tangible computer-readable media of claim 16, wherein the method further comprises identifying one or more defect candidates during production testing of the circuits-under-test using the generated one or more fault dictionaries.

21. The one or more tangible computer-readable media of claim 20, wherein the method further comprises incrementally diagnosing or incrementally simulating one or more possible defects not identified by the generated one or more fault dictionaries or both.

22. The one or more tangible computer-readable media of claim 21, wherein the method further comprises updating the generated one or more fault dictionaries with results from the performance of one or more of the incrementally diagnosing and the incrementally simulating.

23. The one or more tangible computer-readable media of claim 21, further comprising updating one or more defect extraction rules or updating one or more of the design manufacturing rules based at least in part on results from the acts of incrementally diagnosing or incrementally simulating, or both.

24. The one or more tangible computer-readable media of claim 16, wherein the circuits-under-test comprise integrated circuits designed for functional use in electronic devices.

25. The one or more tangible computer-readable media of claim 16, wherein the number of test patterns detecting the first defect candidate is limited to at least one of the following: (a) a predetermined value; or (b) a user-selected value.

26. The one or more tangible computer-readable media of claim 16, wherein the test patterns detecting the first defect candidate comprise test patterns using static fault models and test patterns using dynamic fault models.

27. The one or more tangible computer-readable media of claim 26, wherein the one or more fault dictionaries comprise at least a first fault dictionary and a second fault dictionary, and wherein fault dictionary information concerning the test patterns using static fault model is stored in the first fault dictionary and fault dictionary information concerning the test patterns using dynamic fault models is stored in the second fault dictionary.

28. The one or more tangible computer-readable media of claim 16, wherein at least some of the test patterns detecting the second defect candidate use a different type of fault model than used to detect the first defect candidate.

29. The one or more tangible computer-readable media of claim 16, wherein the observation point combinations correspond to compacted test responses output from a compactor in the circuit-under-test.

30. The one or more tangible computer-readable media of claim 16, wherein the method further comprises storing one or more of the following properties for at least the first defect candidate:
- a defect identifier that distinguishes the first defect candidate from other potential defects;
- a derived rule identifier that identifies the defect extraction rule used to extract the first defect candidate;
- a design manufacturing rule identifier that identifies the design manufacturing rule from which the defect extraction rule used to extract the first defect candidate was derived;
- one or more physical properties of the first defect candidate in the physical layout of the integrated circuit design;
- a physical location of the first defect candidate in the physical layout of the integrated circuit design; and
- a ranking of the first defect candidate relative to other potential defects.

31. At least one computer storing computer-executable instructions, which when executed cause the computer to perform a method comprising:
generating one or more fault dictionaries for identifying one or more defect candidates from corresponding observation point combinations, the observation point combinations indicating observation points of a circuit-under-test that captured faulty test values upon application of a respective test pattern, the act of generating the one or more fault dictionaries comprising,
for a first defect candidate, storing one or more first indicators indicative of test patterns detecting the first defect candidate, and
for a second defect candidate, storing at least a second, the second indicator comprising a bit mask that indicates one or more of the test patterns detecting the first defect candidate that also detect the second defect candidate, each of the one or more of the test patterns detecting both the first defect candidate and the second defect candidate for one particular observation point combination.

32. The at least one computer of claim 31, wherein the one or more first indicators comprise unique IDs associated with the test patterns detecting the first defect candidate.

33. The at least one computer of claim 31, wherein the one or more first indicators comprise unique IDs associated with the observation point combinations for the test patterns detecting the first defect candidate.

34. The at least one computer of claim 31, wherein the method further comprises identifying one or more defect candidates during production testing of the circuits-under-test using the generated one or more fault dictionaries.

35. The at least one computer of claim 34, wherein the method further comprises incrementally diagnosing or incrementally simulating one or more possible defects not identified by the generated one or more fault dictionaries or both.

36. The at least one computer of claim 35, wherein the method further comprises updating the generated one or more fault dictionaries with results from the performance of one or more of the incrementally diagnosing and the incrementally simulating.

37. The at least one computer of claim 35, further comprising updating one or more defect extraction rules or updating one or more of the design manufacturing rules based at least in part on results from the acts of incrementally diagnosing or incrementally simulating or both.

38. The at least one computer of claim 31, wherein the circuits-under-test comprise integrated circuits designed for functional use in electronic devices.

39. The at least one computer of claim 31, wherein at least some of the test patterns detecting the second defect candidate use a different type of fault model than used to detect the first defect candidate.

40. The at least one computer of claim 31, wherein the observation point combinations correspond to compacted test responses output from a compactor in the circuit-under-test.

41. The at least one computer of claim 31, wherein the method further comprises storing one or more of the following properties for at least the first defect candidate:
- a defect identifier that distinguishes the first defect candidate from other potential defects;
- a derived rule identifier that identifies the defect extraction rule used to extract the first defect candidate;
- a design manufacturing rule identifier that identifies the design manufacturing rule from which the defect extraction rule used to extract the first defect candidate was derived;
- one or more physical properties of the first defect candidate in the physical layout of the integrated circuit design;
- a physical location of the first defect candidate in the physical layout of the integrated circuit design; and
- a ranking of the first defect candidate relative to other potential defects.

42. A system, comprising:
means for generating one or more fault dictionaries for identifying one or more defect candidates from corresponding observation point combinations, the observation point combinations indicating observation points of a circuit-under-test that captured faulty test values upon application of a respective test pattern, the act of generating the one or more fault dictionaries comprising,
for a first defect candidate, means for storing one or more first indicators indicative of test patterns detecting the first defect candidate, and
for a second defect candidate, means for storing at least a second indicator, the second indicator comprising a bit mask that indicates one or more of the test patterns detecting the first defect candidate that also detect the second defect candidate, each of the one or more of the test patterns detecting both the first defect candidate and the second defect candidate for one particular observation point combination.

* * * * *